(12) United States Patent
Sato et al.

(10) Patent No.: US 7,615,324 B2
(45) Date of Patent: *Nov. 10, 2009

(54) PHOTOSENSITIVE COMPOSITION, AND CURED RELIEF PATTERN PRODUCTION METHOD AND SEMICONDUCTOR DEVICE USING THE SAME

(75) Inventors: Kenichiro Sato, Shizuoka (JP); Naoya Sugimoto, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/048,530

(22) Filed: Mar. 14, 2008

(65) Prior Publication Data

US 2008/0227024 A1 Sep. 18, 2008

(30) Foreign Application Priority Data

Mar. 14, 2007 (JP) ............................ P2007-065325
Jul. 6, 2007 (JP) ............................ P2007-178473

(51) Int. Cl.
*G03F 7/004* (2006.01)
*G03F 7/30* (2006.01)

(52) U.S. Cl. .................. 430/18; 430/191; 430/192; 430/193; 430/270.1; 430/326; 430/330

(58) Field of Classification Search ................. 430/191, 430/192, 193, 270.1, 326, 330, 18
See application file for complete search history.

(56) References Cited

U.S. PATENT DOCUMENTS

| | | | |
|---|---|---|---|
| 6,929,891 B2 * | 8/2005 | Rushkin et al. | 430/18 |
| 7,056,641 B2 * | 6/2006 | Naiini et al. | 430/190 |
| 7,129,011 B2 * | 10/2006 | Rushkin et al. | 430/18 |
| 7,132,205 B2 * | 11/2006 | Rushkin et al. | 430/18 |
| 2002/0093077 A1 | 7/2002 | Jung et al. | |
| 2003/0194631 A1 | 10/2003 | Suwa et al. | |
| 2008/0220222 A1 * | 9/2008 | Masayuki et al. | 428/195.1 |

FOREIGN PATENT DOCUMENTS

| | | |
|---|---|---|
| EP | 1662319 A2 | 5/2006 |
| EP | 1744213 A1 | 1/2007 |
| JP | 56-027140 A | 3/1981 |
| JP | 2001-312063 A | 11/2001 |
| JP | 2001312063 A * | 11/2001 |
| JP | 2002-169283 A | 6/2002 |
| JP | 2002-526793 A | 8/2002 |
| JP | 2005-043883 A | 2/2005 |
| JP | 2006-010781 A | 1/2006 |
| JP | 2006-178437 A | 7/2006 |

OTHER PUBLICATIONS

Extended European Search Report dated Jul. 23, 2008.

* cited by examiner

*Primary Examiner*—John S Chu
(74) *Attorney, Agent, or Firm*—Sughrue Mion, PLLC

(57) ABSTRACT

A photosensitive resin composition includes (a) a resin comprising a repeating unit represented by a following formula (1); (b) a photosensitive agent; (c) a thermo-acid generator; and (d) a compound having at least one of an alkoxymethyl group and an acyloxymethyl group,

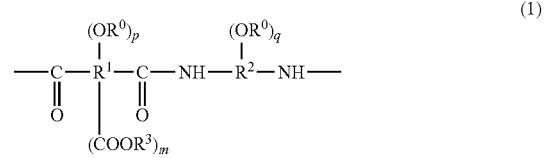

wherein $R^1$ represents a divalent to octavalent organic group containing 2 or more carbon atoms, $R^2$ represents a divalent to hexavalent organic group containing 2 or more carbon atoms, each of $R^0$ and $R^3$ independently represents a hydrogen atom or an organic group containing 1 to 20 carbon atoms, m represents an integer of 0 to 2, and each of p and q represents an integer of 0 to 4, provided that $p+q>0$.

5 Claims, No Drawings

PHOTOSENSITIVE COMPOSITION, AND CURED RELIEF PATTERN PRODUCTION METHOD AND SEMICONDUCTOR DEVICE USING THE SAME

BACKGROUND OF THE INVENTION

1. Field of the Invention

The present invention relates to a positive-working highly-heatproof photosensitive resin composition usable for surface protective film and interlayer insulation film of semiconductor devices, or interlayer insulation film of display devices, and to a method of producing cured relief patterns having high resistance to heat by use of such a positive-working highly-heatproof photosensitive resin composition, and further to a semiconductor device including such relief patterns.

2. Description of the Related Art

As surface protective film and interlayer insulation film for use in semiconductor devices, films formed from negative-working polyimide resins are currently in use because they have both high heat resistance and excellent electric and mechanical characteristics. At present, negative-working polyimide resins are generally made available for use in the form of photosensitive polyimide precursor compositions, and these precursor compositions can easily form surface protective films or interlayer insulation films in semiconductor devices by being subjected successively to coating, patterning with actinic rays, development with organic solvent, thermal imidization treatment at high temperatures, and so on. Therefore, they have a feature that they can significantly curtail the film formation process, compared with traditional non-photosensitive polyimide precursor compositions.

However, the photosensitive negative-working polyimide precursor compositions require large volumes of organic solvents as developer, such as N-methyl-2-pyrrolidone, in their respective development processes, so some way out of organic solvent use has been required from recently growing concerns about environmental problems. In response to this requirement, as is the case with photoresists, various heat-resistant photosensitive resin materials developable with alkaline aqueous solutions have been put forth just of late.

Of such proposals, latest attention has been given to the method of using as the positive-working photosensitive composition a polybenzoxazole (hereafter referred to as PBO also) precursor composition obtained by mixing a hydroxypolyamide soluble in alkaline aqueous solutions, such as a PBO precursor, with a photoactivatable ingredient such as a photosensitive diazoquinone compound.

The development mechanism of the positive-working photosensitive resin utilizes such a characteristic of the photosensitive diazoquinone compound that, while the photosensitive diazoquinone compound in unexposed portions is insoluble in alkaline aqueous solutions, the photosensitive diazoquinone compound causes a chemical change by undergoing exposure to be converted into an indenecarboxylic acid compound and be rendered soluble in alkaline aqueous solutions. In other words, a difference between exposed and unexposed portions with respect to the rate of dissolution in a developer is utilized and formation of relief patterns made up of unexposed portions alone becomes possible (See, e.g., JP-A-56-27140).

On the other hand, in the field of semiconductor photoresists, a multiplicity of chemical amplification photosensitive compositions producing catalytic amounts of acids upon exposure and, in a subsequent heating process, converting their alkali-insoluble groups into alkali-soluble groups through chemical reaction utilizing as catalyst the acids generated by the exposure have been used suitably as techniques to separate photosensitivity from insolubility of unexposed portions. In the present technical field also, chemical amplification photosensitive compositions are disclosed (See, e.g., JP-A-2002-526793).

However, with recent evolution of semiconductor technology, there has been more need for formation of finer patterns and decrease in curing temperature (curing temperature) after pattern formation.

When the curing temperature in particular is lowered, it is known that thermal benzoxazole-ring formation becomes difficult to advance. On this problem, a report of improvements by addition of sulfonic acid or a sulfonate compound has already been made (See JP-A-2006-010781). However, cases have been found where the film obtained was lacking in strength and chemical resistance or suffered damage to its fine-image formability.

On the other hand, there are proposals of the arts of adding various methylol compounds and thereby preventing film melt or heat-shrinkage from occurring at the time of curing by heat without impairment of lithography performance (JP-A-2001-312063, JP-A-2006-178437, JP-A-2002-169283 and JP-A2005-043883). However, in the cases of carrying out the curing under low-temperature conditions, it has been found that the film cured was great in thermal weight reduction and inferior in heat resistance.

In other words, materials capable of delivering excellent performance (film remaining rate and resolution) in lithography, being cured at low temperatures of 300° C. or below, preferably 250° C. or below, and showing satisfactorily high heat resistance have not been discovered yet.

SUMMARY OF THE INVENTION

The invention provides a photosensitive resin composition capable of delivering excellent performance in lithography and forming cured relief patterns superior in mechanical characteristics and heat resistance under low-temperature curing conditions, a method of producing cured relief patterns by use of such a photosensitive resin composition, and a semiconductor device including cured relief patterns produced by such a method.

The present Inventors have found that the problems can be solved with a photosensitive resin composition containing a particular resin and a thermo-acid generator, and further a compound having at least one group chosen from alkoxymethyl groups or acyloxymethyl groups, thereby achieving the present invention. More specifically, the aspects of the invention are as follows.

<1> A photosensitive resin composition comprising:

(a) a resin comprising a repeating unit represented by a following formula (1);

(b) a photosensitive agent;

(c) a thermo-acid generator; and (d) a compound having at least one of an alkoxymethyl group and an acyloxymethyl group,

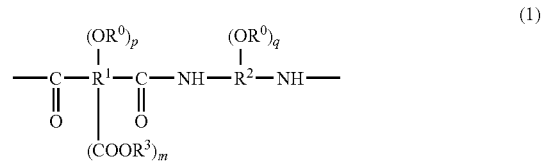

wherein $R^1$ represents a divalent to octavalent organic group containing 2 or more carbon atoms, $R^2$ represents a divalent to hexavalent organic group containing 2 or more carbon atoms, each of $R^0$ and $R^3$ independently represents a hydrogen atom or an organic group containing 1 to 20 carbon atoms, m represents an integer of 0 to 2, and each of p and q represents an integer of 0 to 4, provided that p+q>0.

<2> The photosensitive resin composition as described in <1>, wherein at least one of $R^0$ and $R^3$ in the formula (1) is a group capable of decomposing under action of acid and generating an alkali-soluble group.

<3> The photosensitive resin composition as described in <1>, further comprising:

(e) an adhesion promoter.

<4> A method of producing a cured relief pattern, comprising:

forming, on a semiconductor substrate, a layer comprising the photosensitive resin composition as described in <1>;

exposing the layer, through a mask, to a light ray, an electron bean or an ion beam;

removing the exposed portion of the layer with an aqueous alkaline developer to create a relief pattern, and subjecting the relief pattern to heat treatment.

<5> A semiconductor device comprising a cured relief pattern produced by the method as described in <4>

DETAILED DESCRIPTION OF THE INVENTION

The invention is described below in detail, (a) Resin Having Repeating Units of Formula (1)

$$\begin{array}{c} (OR^0)_p \quad\quad (OR^0)_q \\ \mathrm{-C-R^1-C-NH-R^2-NH-} \\ \| \quad\quad \| \\ O \quad\quad O \\ (COOR^3)_m \end{array} \quad (1)$$

In formula (1), $R^1$ represents a divalent to octavalent organic group containing two or more carbon atoms.

$R^2$ represents a divalent to hexavalent organic group containing two or more carbon atoms.

$R^0$ and $R^3$ independently represent a hydrogen atom or an organic group containing 1 to 20 carbon atoms.

m represents an integer of 0 to 2.

p and q independently represent an integer of 0 to 4, provided that p+q>0.

When two or more $R^0$s, or two or more $R^3$s are present, they may be the same or different.

$R^0$ preferably represents a hydrogen atom, an alkyl group which may have a substituent, —CORc (wherein Rc represents an alkyl, aryl or alicyclic alkyl group which may have a substituent), —$SO_2$Rd (wherein Rd represents an alkyl, aryl or alicyclic alkyl group which may have a substituent, or an o-quinoneazide group), or a group capable of decomposing by the action of an acid and producing an alkali-soluble group.

The expression "a group capable of decomposing by the action of an acid and producing an alkali-soluble group" refers to the group capable of decomposing by the action of an acid and producing an alkali-soluble group, such as hydroxyl group or a carboxyl group, on the resin side, specifically a group capable of leaving the resin under action of an acid, or a group of formula —$C(R^4)_2$—$COOR^5$ (wherein $R^4$ represents a hydrogen atom or an alkyl group containing 1 to 4 carbon atoms, and $R^5$ represents a group capable of leaving under action of an acid).

Of the groups capable of producing alkali-soluble groups under action of acids, when $R^0$ is a group capable of leaving under action of an acid, $R^0$ itself leaves under action of an acid and thereby —OH is produced. When $R^0$ is —$C(R^4)_2COOR^5$, on the other hand, $R^5$ leaves under action of an acid and thereby —COOH is produced.

It is preferable that at least one organic group represented by $R^0$ is a group capable of producing an alkali-soluble group by the action of an acid.

The alkyl group represented by $R^0$, Rc in —CORc or Rd in —$SO_2$Rd is preferably a straight-chain or branched alkyl group containing 1 to 20 carbon atoms, such as methyl, ethyl, propyl, isopropyl, butyl, isobutyl or octyl, the aryl group is preferably an aryl group containing 6 to 14 carbon atoms, such as phenyl, toluoyl or mesityl, and the alicyclic alkyl group is preferably a cycloalkyl group containing 3 to 15 carbon atoms, such as cyclopentyl, cyclohexyl, norbornyl or adamantyl. Examples of substituents the foregoing groups may have include halogen atoms, a cyano group, an amido group and a sulfonylamido group.

Examples of a group capable of leaving under action of an acid include alkoxycarbonyl groups (preferably containing 2 to 5 carbon atoms), alkoxyalkyl groups preferably containing 2 to 5 carbon atoms), alkylsilyl groups (preferably containing 1 to 20 carbon atoms), and groups forming acetals or ketals.

Examples of groups forming acetals or ketals include groups having the following structures.

$$\begin{array}{cccc} \mathrm{H} & R''' & \mathrm{H} & R' \\ | & | & | & | \\ -\mathrm{C}-\mathrm{OR'} & -\mathrm{C}-\mathrm{OR'} & -\mathrm{C}-\mathrm{X} & -\mathrm{C}-\mathrm{X} \\ | & | & \diagdown\diagup & \diagdown\diagup \\ R'' & R'' & \mathrm{O} & \mathrm{O} \end{array}$$

In the above formulae, R', R" and R'" independently represent an alkyl group containing at most 5 carbon atoms, and X represents a divalent alkylene group containing at least 3 carbon atoms (preferably at most 20 carbon atoms), which may have a side chain.

Typical examples of a group capable of leaving under action of an acid include alkoxycarbonyl groups, such as a t-butoxycarbonyl group; alkoxyalkyl groups, such as a methoxymethyl group and an ethoxyethyl group; alkylsilyl groups, such as a methylsilyl group and an ethylsilyl group; a tetrahydropyranyl group, a tetrahydrofuranyl group, tetrahydropyranyl groups substituted with alkoxy groups, and tetrahydrofuranyl groups substituted with alkoxy groups, but the leaving groups should not be construed as being limiting to those examples. The most suitable of the groups capable of leaving under action of an acid are an ethoxyethyl group and a tetrahydropyranyl group.

Examples of $R^4$ in the group represented by —$C(R^4)_2$—$COOR^5$ include methyl, ethyl, n-propyl and n-butyl. Examples of $R^5$ capable of leaving under action of an acid include a t-butyl group, a t-amyl group, a 1-methylcyclopentyl group, a 1-ethylcyclopentyl group and a 1-ethylcyclohexyl group.

Examples of an introduction method of a group represented by $R^0$ include etherification by reaction of a hydroxyl group-containing polymer with an alkyl or acyl halide under basic conditions (which corresponds to the case of $R^0$=an alkyl group), esterification (which corresponds to the case of $R^0$=—CORc), sulfonatization (which corresponds to the case of $R^0$=—SO$_2$Rd), acetalation by reaction of a hydroxyl group-containing polymer with a vinyl ether under acidic conditions, alkoxycarbonylation by reaction of a hydroxyl group-containing polymer with an alkyl carbonate, silyletherification by reaction of a hydroxyl group-containing polymer with a silyl chloride compound and an acetoacetate under basic conditions, and acetoacetatization.

In the introduction of a group represented by $R^0$ into a hydroxyl group-containing polymer, or the so-called capping, the capping rate is preferably 40 mole % or below, far preferably from 0.5 to 30 mole %, of the total hydroxyl groups in the polymer. The capping rates of 40 mole % or below are preferable in point of no reduction in rupture elongation.

$R^1$ in formula (1) expresses a divalent to octavalent organic group containing 2 or more carbon atoms and represents a structural component of an acid.

Examples of a divalent organic group include groups remaining after removal of two carboxyl groups from each of aromatic dicarboxylic acids, such as terephthalic acid, isophthalic acid, diphenyl ether dicarboxylic acid, naphthalenedicarboxylic acid or bis(carboxyphenyl)propane, and aliphatic dicarboxylic acids, such as cyclohexanedicarboxylic acid and adipic acid.

Examples of a trivalent organic group include groups remaining after removal of three carboxyl groups from each of tricarboxylic acids, such as trimellitic acid and trimesic acid, and examples of a tetravalent organic group include groups remaining after removal of four carboxyl groups from each of tetracarboxylic acids, such as pyromellitic acid, benzophenonetetracarboxylic acid, biphenyltetracarboxylic acid and diphenyl ether tetracarboxylic acid.

Additionally, the components of these acids may be alone or in a state of mixture of two or more thereof but it is preferable that the groups remaining after removal of four carboxyl groups from tetracarboxylic acids constitute 1 to 40 mole % of the total $R^1$.

It is preferable that the acid component forming a structural unit represented by formula (1) contains a trivalent to octavalent organic group containing 2 or more carbon atoms and 1 to 4 hydroxyl groups, and it is preferable by far that such an organic group is a trivalent or tetravalent organic group containing 6 to 30 carbon atoms. Specifically, $R^1(COOR^3)_m(OR^0)_p$ in formula (1) is preferably a group having such a structure as to be represented by the following formula (6).

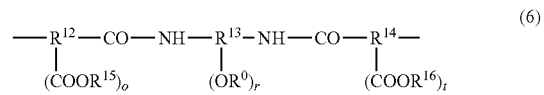

In formula (6), $R^{12}$ and $R^{14}$ may be the same or different and each of them represents a divalent to tetravalent organic group containing 2 to 20 carbon atoms; $R^{13}$ represents a trivalent to hexavalent organic group containing 3 to 20 carbon atoms; and $R^{15}$ and $R^{16}$ may be the same or different, and each of them represents a hydrogen atom or an organic group containing 1 to 20 carbon atoms. $R^0$ is the same as $R^0$ in formula (1). o and t independently represent an integer of 0 to 2, and r represent an integer of 1 to 4.

In point of heat resistance of the polymer obtained, it is further preferable that aromatic rings are contained in $R^{12}$ and $R^{14}$, respectively. Of such structures, especially preferred ones include the groups remaining after removal of three carboxyl groups from each of trimellitic acid, trimesic acid and naphthalenetricarboxylic acid, And $R^{13}$ represents a trivalent to hexavalent organic group containing 3 to 20 carbon atoms. The r $OR^0$ groups bound to $R^{13}$ are preferably situated in positions adjacent to the amide linkage. The $OR^0$ group can be converted from an OH group before or after polymerization.

Examples of $R^{13}(OH)_r$, the structure that $R^{13}(OR^0)_r$ has before undergoing conversion, include groups remaining after removal of two amino groups from each of fluorine-containing compounds, such as bis(3-amino-4-hydroxyphenyl)hexafluoropropane and bis(3-hydroxy-4-aminophenyl) hexafluoropropane, and fluorine-free compounds, such as bis (3-amino-4-hydroxyphenyl)propane, bis(3-hydroxy-4-aminophenyl)propane, 3,3'-diamino-4,4'-dihydroxybiphenyl, 3,3'-dihydroy-4,4'-diaminobiphenyl, 2,4-diaminophenol, 2,5-diaminophenol and 1,4-diamino-2, 5-dihydroxybenzene.

$R^{15}$ and $R^{16}$ in formula (6) may be the same or different, and each of them represents a hydrogen atom or an organic group containing 1 to 20 carbon atoms. By adjusting the number of carbon atoms in each organic group to 20 or below, the composition can have an advantage of satisfactory alkali developability and high sensitivity. o and t independently represent an integer of 0 to 2, preferably 1 or 2. And r represents an integer of 1 to 4. By adjusting r to 4 or below, the composition can have an advantage of excellent mechanical characteristics. Of the structures represented by formula (6), the structures illustrated below are included in preferred ones, but they should not be construed as limiting the preferred ones.

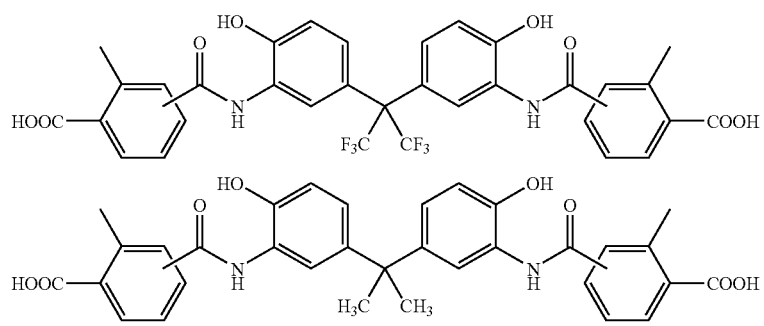

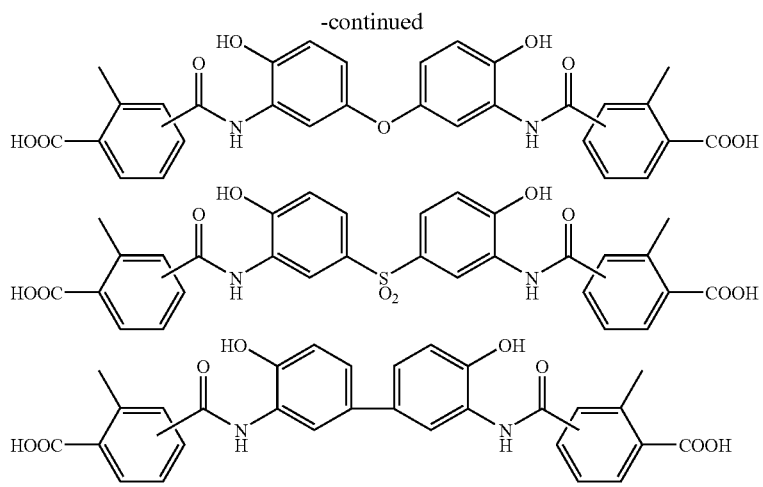

In addition, $R^1$ can also have a moiety derived from copolymerization with a hydroxyl-free tetracarboxylic or dicarboxylic acid within the confines of no damage to alkali solubility, photosensitivity and heat resistance. Examples of such a moiety include the groups remaining after removal of four carboxyl groups from each of aromatic tetracarboxylic acids, such as pyromellitic acid, benzophenonetetracarboxylic acid, biphenyltetracarboxylic acid, diphenyl ether tetracarboxylic acid and diphenylsulfonetetracarboxylic acid, the groups remaining after removal of two carboxyl groups and two alkyl ester groups from each of diester compounds obtained by esterifying two carboxyl groups of each of the tetracarboxylic acids as recited above with methyl or/and ethyl groups, the groups remaining after removal of four carboxyl groups from each of aliphatic tetracarboxylic acids, such as butanetetracarboxylic acid and cyclopentanetetracarboxylic acid, the groups remaining after removal of two carboxyl groups and two alkyl ester groups from each of the diester compounds obtained by esterifying two carboxyl groups in each of the tetracarboxylic acids as recited above with methyl or/and ethyl groups, and groups remaining after removal of two carboxyl groups from each of aromatic dicarboxylic acids, such as terephthalic acid, isophthalic acid, diphenyl ether dicarboxylic acid and naphthalenedicarboxylic acid, and aliphatic dicarboxylic acids, such as adipic acid. The proportion of these groups introduced by copolymerization is preferably 50 mole % or below, far preferably 30 mole % or below, of the acid component. The copolymerization ratio of 50 mole % or below offers an advantage of satisfactory alkali developability.

In formula (1), $R^2$ expresses a divalent to hexavalent organic group containing two or more carbon atoms, and represents a structural component of a diamine. Herein, the $OR^0$ group of $R^2(OR^0)_q$ is converted from a hydroxyl group in the same manner as described above. In terms of heat resistance of the polymer obtained, it is preferable that $R^2(OH)_q$ has an aromatic group and a hydroxyl group or a carboxyl group, with examples including groups remaining after removal of two amino groups from each of fluorine-containing compounds, such as bis(aminohydroxyphenyl)hexafluoropropane, and fluorine-free compounds, such as diaminodihydroxypyrimidine, diaminodihydroxypyridine, hydroxydiaminopyrimidine, diaminophenol, dihydroxybenzidine, diaminobenzoic acid and diaminoterephthalic acid, and the structures represented by the following formulae (7), (8) and (9).

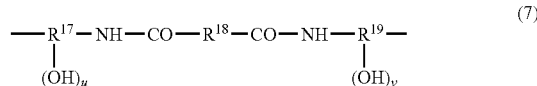
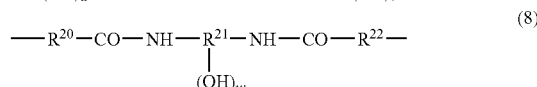
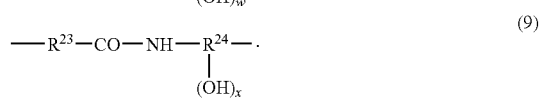

$R^{17}$ and $R^{19}$ in formula (7) may be the same or different, and each of them represents a trivalent or tetravalent organic group containing 2 to 20 carbon atoms, and $R^{18}$ represents a divalent organic group containing 2 to 30 carbon atoms, u and v independently represent 1 or 2.

$R^{20}$ and $R^{22}$ in formula (8) may be the same or different, and each of them represents a divalent organic group containing 2 to 20 carbon atoms, and $R^{21}$ represents a trivalent to hexavalent organic group containing 3 to 20 carbon atoms. w represents an integer of 1 to 4.

$R^{23}$ in formula (9) represents a divalent organic group containing 2 to 20 carbon atoms, and $R^{24}$ represents a trivalent to hexavalent organic group containing 3 to 20 carbon atoms. x represents an integer of 1 to 4.

In formula (7), $R^{17}(OH)_u$ and $R^{19}(OH)_v$ independently represent a divalent hydroxyl-containing organic group having 2 to 20 carbon atoms, and the presence of aromatic rings therein is advantageous in point of heat resistance of the polymer obtained. Examples of such organic groups include a hydroxyphenylene group, a dihydroxyphenylene group, a hydroxynaphthylene group, a dihydroxynaphthylene group, a hydroxybiphenylene group, a dihydroxybiphenylene group, a bis(hydroxyphenyl)hexafluoropropane group, a bis(hydroxyphenyl)propane group, a bis(hydroxyphenyl)sulfone group, a hydroxydiphenyl ether group and a dihydroxydiphenyl ether group. In addition, alicyclic groups, such as hydroxycyclohexylene group and a dihydroxycyclohexylene group, can be used.

$R^{18}$ represents a divalent organic group containing 2 to 30 carbon atoms. In point of heat resistance of the polymer obtained, it is preferable that $R^{18}$ is a divalent group having an aromatic ring, with examples including a phenylene group, a biphenylene group, a diphenyl ether group, a diphenylhexafluoropropane group, a diphenylpropane group and a diphenyl sulfone group. In addition, aliphatic groups such as a cyclohexylene group are also usable.

In formula (8), $R^{20}$ and $R^{22}$ independently represent a divalent organic group containing 2 to 20 carbon atoms. In point of heat resistance of the polymer obtained, a divalent group having an aromatic ring, with examples including a phenylene group, a biphenylene group, a diphenyl ether group, a diphenylhexafluoropropane group, a diphenylpropane group and a diphenyl sulfone group. In addition, aliphatic groups such as a cyclohexylene group are also usable.

$R^{21}(OH)_W$ represents a divalent hydroxyl-containing organic group having 3 to 20 carbon atoms, and it is preferable that the group has an aromatic ring in point of heat resistance of the polymer obtained. Examples of such organic groups include a hydroxyphenylene group, a dihydroxyphenylene group, a hydroxynaphthylene group, a dihydroxynaphthylene group, a hydroxybiphenylene group, a dihydroxybiphenylene group, a bis(hydroxyphenyl)hexafluoropropane group, a bis(hydroxyphenyl)propane group, a bis(hydroxyphenyl)sulfone group, a hydroxydiphenyl ether group and a dihydroxydiphenyl ether group. In addition, alicyclic groups, such as hydroxycyclohexylene group and a dihydroxycyclohexylene group, can be used.

In formula (9), $R^{23}$ represents a divalent organic group containing 2 to 20 carbon atoms. In point of heat resistance of the polymer obtained, a divalent group having an aromatic ring is preferable, with examples including a phenylene group, a biphenylene group, a diphenyl ether group, a diphenylhexaluoropropane group, a diphenylpropane group and a diphenyl sulfone group. In addition, aliphatic groups such as a cyclohexylene group are also usable.

$R^{24}(OH)^x$ represents a divalent hydroxyl-containing organic group having 3 to 20 carbon atoms, and it is preferable that the group has an aromatic ring in point of heat resistance of the polymer obtained. Examples of such organic groups include a hydroxyphenylene group, a dihydroxyphenylene group, a hydroxynaphthylene group, a dihydroxynaphthylene group, a hydroxybiphenylene group, a dihydroxybiphenylene group, a bis(hydroxyphenyl)hexafluoropropane group, a bis(hydroxyphenyl)propane group, a bis(hydroxyphenyl)sulfone group, a hydroxydiphenyl ether group and a dihydroxydiphenyl ether group. In addition, alicyclic groups, such as hydroxycyclohexylene group and a dihydroxycyclohexylene group, can be used.

Of the structures represented by formula (7), preferred ones include the structures as illustrated below, but should not be construed as being limited to them.

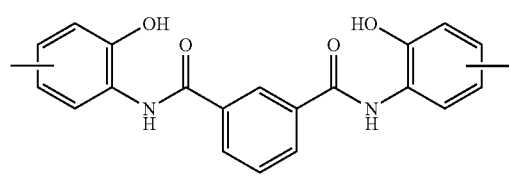

-continued

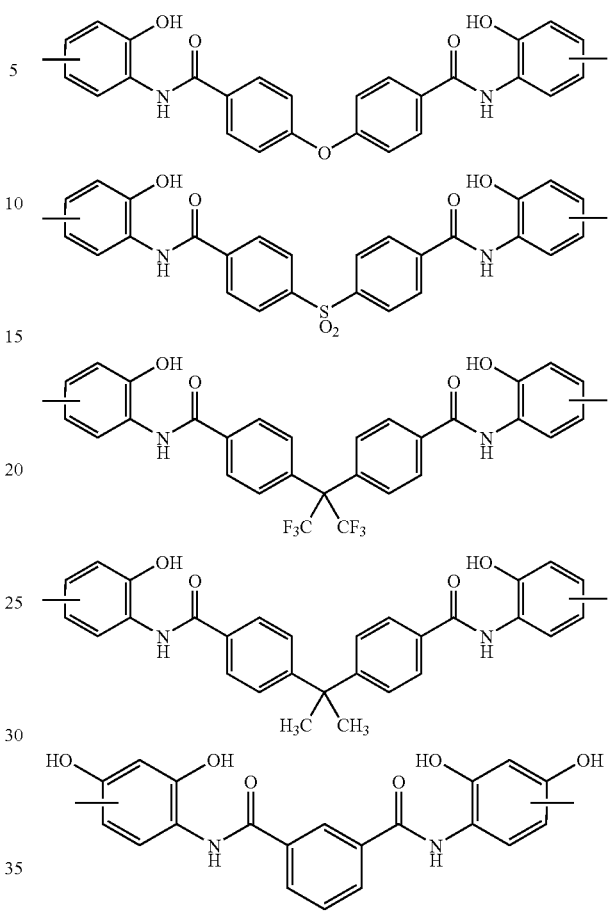

Of the structures represented by formula (8), preferred ones include the structures as illustrated below, but should not be construed as being limited to them.

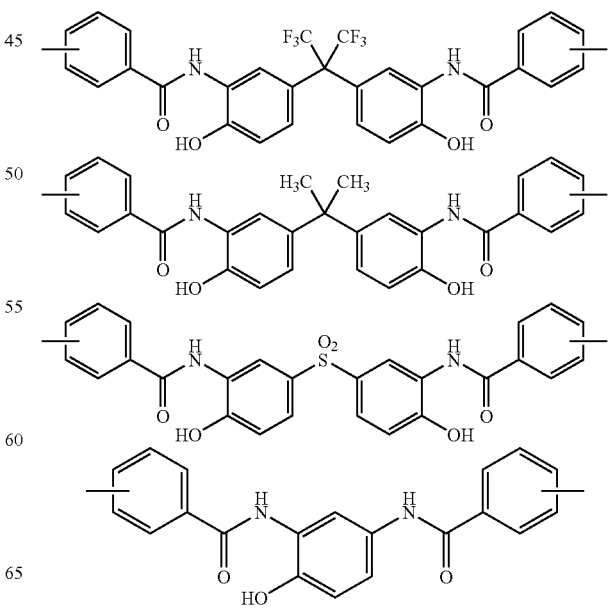

-continued

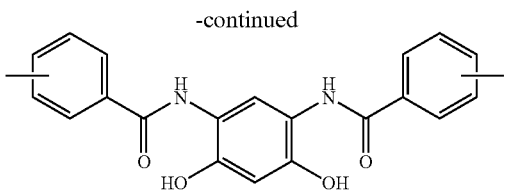

Of the structures represented by formula (9), preferred ones include the structures as illustrated below, but should not be construed as being limited to them.

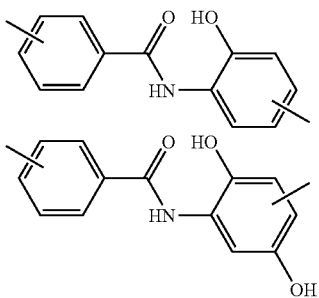

Each structural moiety represented by formula (7), (8) or (9), which is a component of the diamine, can also be copolymerized with a component of another diamine so long as the proportion of the component of another diamine is in a range of 1 to 40 mole %. Examples of a component of another diamine include groups remaining after removal of two amino groups from each of aromatic diamine compounds, such as phenylenediamine, diaminodiphenyl ether, diaminophenoxybenzene, diaminodiphenylmethane, diaminodiphenyl sulfone, bis(trifluoromethyl)benzidine, bis(aminophenoxyphenyl)propane and bis(aminophenoxyphenyl)sulfone, or compounds formed by substituting alkyl groups or halogen atoms for hydrogen atoms on the aromatic rings of those diamine compounds, and groups remaining after removal of two amino groups from each of aliphatic diamines, such as cyclohexyldiamine, methylenebiscyclohexylamine and hexamethylenediamine.

For the purpose of enhancing adhesion to a substrate, $R^1$ or $R^2$ may further include a moiety derived from copolymerization with a compound having a siloxane structure within the confines to no drop in heat resistance. Examples of such a compound for the diamine component include bis(3-aminopropyl)tetramethyldisiloxane and bis(p-aminophenyl)octamethylpentasiloxane, and the proportion of such a copolymerized moiety is from 1 to 10 mole %.

$R^3$ in formula (1) represents a hydrogen atom or an organic group containing 1 to 20 carbon atoms. While $R^3$ is preferably an organic group in point of solution stability of the photosensitive resin precursor composition obtained, it is advantageous for $R^3$ to be a hydrogen atom in terms of solubility in alkaline aqueous solutions.

In the invention, both hydrogen atom and organic group can be present together. By controlling the proportion of the hydrogen atom to the organic group in $R^3$, the speed of dissolution in an alkaline aqueous solution can be changed. So, this control allows the photosensitive resin precursor composition to have an appropriate dissolution speed.

It is preferable that hydrogen constitutes 10% to 90% of each $R^3$. And cases where the number of carbon atoms in $R^3$ is 20 or below have an advantage in good solubility in alkalis.

Accordingly, it is advantageous that $R^3$s include at least one hydrocarbon group containing 1 to 16 carbon atoms and the remainder thereof are hydrogen atoms. Suitable examples of a hydrocarbon group of $R^3$ include a methyl group, an ethyl group, a propyl group and a butyl group.

At least one of organic groups represented by $R^3$s is preferably a group capable of producing an alkali-soluble group by the action of an acid, e.g., the group having a group capable of leaving under action of an acid as described hereinbefore, or the group of formula —$C(R^4)_2COOR^5$ (wherein $R^5$ represents the group capable of leaving under action of an acid).

m in formula (1) represents the number of carboxyl groups, and indicates an integer of 0 to 2, preferably an integer of 1 or 2. Each of p and q in formula (1) represents an integer of 0 to 4, provided that p+q>0.

The resin for use in the invention preferably has a number-average molecular weight of 1,000 to 100,000. Resins lower in the molecular weight cause deterioration in film's mechanical characteristics, while resins higher in the molecular weight cause problems that their performance in lithography is degraded and low-temperature curing of them becomes difficult.

The resin used as Component (a) in the present photosensitive resin composition is preferably a resin having structural units represented by formula (1) as its main component. The term "main component" as used herein means that the structural units represented by formula (1) constitute 70 mole % or more of the resin. The proportion of these structural units in the resin is preferably 80 mole % or more, particularly preferably 90 mole % or more.

The resin used in the invention may be a copolymer of a monomer having a structural unit represented by formula (1) and monomers having other structural units, or a mixture of two or more resins which each contain structural units represented by formula (1).

In addition, the resin used in the invention may be a mixture of a resin having structural units represented by formula (1) and a resin not having structural units represented by formula (1) (e.g., a resin having such structural units that p and q in formula (1) are 1 and m in formula (1) is 2). In this case, the proportion of a resin having the structural units represented by formula (1) is preferably 50 mass % or more, far preferably 75 mass % or more.

It is preferable that the kinds and amounts of structural units used in copolymerization or mixture are chosen within a range that no loss of heat resistance is caused in the polymer obtained after undergoing final heating treatment.

Moreover, it is possible in the invention to react a terminal sealing agent with the terminals of a polymer having structural units represented by formula (1) as its main component. Examples of a terminal sealing agent usable herein include monoamines, acid anhydrides, monocarboxylic acids, monoacid-chloride compounds and active monoester compounds. The reaction with a terminal sealing agent is advantageous in adjusting the repetition number of structural units, or the molecular weight, to a preferred range. In addition, various organic groups can be introduced as terminal groups by allowing the polymer terminals to react with a terminal sealing agent. As examples of reaction between a polymer having structural units represented by formula (1) and a terminal sealing agent, resins having the structures represented by formulae (10) to (13), respectively, are suitable.

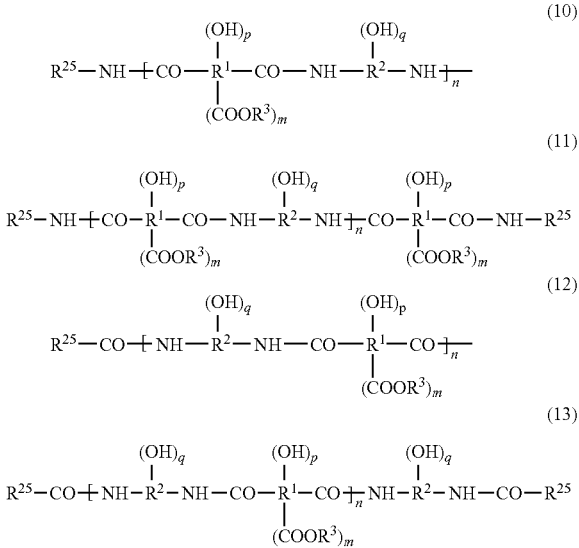

—NH—$R^{25}$ in each of formulae (10) and (11) is a moiety derived from a primary monoamine $NH_2$—$R^{25}$ used as a terminal sealing agent, and —CO—$R^{25}$ in each of formulae (12) and (13) is a moiety derived from a terminal sealing agent such as the ring-opening adduct of an acid anhydride, a mono carboxylic acid HOOC—$R^5$ or a compound obtained by converting the carboxyl group of a monocarboxylic acid into acid chloride or active ester. $R^{25}$ represents an organic group containing 1 to 20 carbon atoms, preferably an organic group having at least one group chosen from an ethynyl group, a vinyl group, a phenolic hydroxyl group, a thiophenol group, a carboxyl group, a sulfone group, a mercapto group or a hydroxyl group.

Examples of an monoamine used as terminal sealing agent include 5-amino-8-hydroxyquinoline, 4-amino-8-hydroxyquinoline, 1-hydroxy-8-aminonaphthalene, 1-hydroxy-7-aminonaphthalene, 1-hydroxy-6-aminonaphthalene, 1-hydroxy-5-aminonaphthalene, 1-hydroxy-4-aminonaphthalene, 1-hydroxy-3-aminonaphthalene, 1-hydroxy-2-aminonaphthalene, 1-amino-7-hydroxynaphthalene, 2-hydroxy-7-aminonaphthalene, 2-hydroxy-6-aminonaphthalene, 2-hydroxy-5-aminonaphthalene, 2-hydroxy-4-aminonaphthalene, 2-hydroxy-3-aminonaphthalene, 1-amino-2-hydroxynaphthalene, 1-carboxy-8-aminonaphthalene, 1-carboxy-7-aminonaphthalene, 1-carboxy-6-aminonaphthalene, 1-carboxy-5-aminonaphthalene, 1-carboxy-4-aminonaphthalene, 1-carboxy-3-aminonaphthalene, 1-carboxy-2-aminonaphthalene, 1-amino-7-carboxynaphthalene, 2-carboxy-7-aminonaphthalene, 2-carboxy-6-aminonaphthalene, 2-carboxy-5-aminonaphthalene, 2-carboxy-4-aminonaphthalene, 2-carboxy-3-aminonaphthalene, 1-amino-2-carboxynaphthalene, 2-amino-nicotinic acid, 4-aminonicotinic acid, 5-aminonicotinic acid, 6-aminonicotinic acid, 4-aminosalycilic acid, 5-aminosalicylic acid, 6-aminosalicylic acid, 3-amino-ortho-toluic acid, ammeride, 2-aminobenzoic acid, 3-aminobenzoic acid, 4-aminobenzoic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 5-amino-8-mercaptoquinoline, 4-amino-8-mercaptoquinoline, 1-mercapto-8-aminonaphthalene, 1-mercapto-7-aminonaphthalene, 1-mercapto-6-aminonaphthalene, 1-mercapto-5-aminonaphthalene, 1-mercapto-4-aminonaphthalene, 1-mercapto-3-aminonaphthalene, 1-mercapto-2-aminonaphthalene, 1-amino-7-mercaptonaphthalene, 2-mercapto-7-aminonaphthalene, 2-mercapto-6-aminonaphthalene, 2-mercapto-5-aminonaphthalene, 2-mercapto-4-aminonaphthalene, 2-mercapto-3-aminonaphthalene, 1-amino-2-mercaptonaphthalene, 3-amino-4,6-dimercaptopyrimidine, 2-aminothiophenol, 3-aminothiophenol, 4-aminothiophenol, 2-ethynylaniline, 3-ethynylaniline, 4-ethynylaniline, 2,4-diethynylaniline, 2,5-diethynylaniline, 2,6-diethynylaniline, 3,4-diethynylaniline, 3,5-diethynylaniline, 1-ethynyl-2-aminonaphthalene, 1-ethynyl-3-aminonaphthalene, 1-ethynyl-4-aminonaphthalene, 1-ethynyl-5-aminonaphthalene, 1-ethynyl-6-aminonaphthalene, 1-ethynyl-7-aminonaphthalene, 1-ethynyl-8-aminonaphthalene, 2-ethynyl-1-aminonaphthalene, 2-ethynyl-3-aminonaphthalene, 2-ethynyl-4-aminonaphthalene, 2-ethynyl-5-aminonaphthalene, 2-ethynyl-6-aminonaphthalene, 2-ethynyl-7-aminonaphthalene, 2-ethynyl-8-aminonaphthalene, 3,5-diethynyl-1-aminonaphthalene, 3,5-diethynyl-2-aminonaphthalene, 3,6-diethynyl-1-aminonaphthalene, 3,6-diethynyl-2-aminonaphthalene, 3,7-diethynyl-1-aminonaphthalene, 3,7-diethynyl-2-aminonaphthalene, 4,8-diethynyl-1-aminonaphthalene and 4,8-diethynyl-2-aminonaphthalen, but should not be construed as being limited to the above-recited ones.

Of the monoamines recited above, 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 2-aminothiophenol, 3-aminothiophenol, 4-aminothiophenol, 3-ethynylaniline, 4-ethynylaniline, 3,4-diethynylaniline and 3,5-diethynylaniline are preferred over the others.

Examples of an acid anhydride, a monocarboxylic acid, a monoacid-chloride compound and an active ester compound which are usable as terminal sealing agents include acid anhydrides, such as phthalic anhydride, maleic anhydride, nadic anhydride, cyclohexanedicarboxylic acid anhydride and 3-hydroxyphthalic anhydride; monocarboxylic acids, such as 2-carboxyphenol, 3-carboxyphenol, 4-carboxyphenol, 2-carboxythiophenol, 3-carboxythiophenol, 4-carboxythiophenol, 1-hydroxy-8-carboxynaphthalene, 1-hydroxy-7-carboxynaphthalene, 1-hydroxy-6-carboxynaphthalene, 1-hydroxy-5-carboxynaphthalene, 1-hydroxy-4-carboxynaphthalene, 1-hydroxy-3-carboxynaphthalene, 1-hydroxy-2-carboxynaphthalene, 1-mercapto-8-carboxynaphthalene, 1-mercapto-7-carboxynaphthalene, 1-mercapto-6-carboxynaphthalene, 1-mercapto-5-carboxynaphthalene, 1-mercapto-4-carboxynaphthalene, 1-mercapto-3-carboxynaphthalene, 1-mercapto-2-carboxynaphthalene, 2-carboxybenzenesulfonic acid, 3-carboxybenzenesulfonic acid, 4-carboxybenzenesulfonic acid, 2-ethynylbenzoic acid, 3-ethynylbenzoic acid, 4-ethynylbenzoic acid, 2,4-diethynylbenzoic acid, 2,5-diethynylbenzoic acid, 2,6-diethynylbenzoic acid, 3,4-diethynylbenzoic acid, 3,5-diethynylbenzoic acid, 2-ethynyl-1-naphthoic acid, 3-ethynyl-1-naphthoic acid, 4-ethynyl-1-naphthoic acid, 5-ethynyl-1-naphthoic acid, 6-ethynyl-1-naphthoic acid, 7-ethynyl-1-naphthoic acid, 8-ethynyl-1-naphthoic acid, 2-ethynyl-2-naphthoic acid, 3-ethynyl-2-naphthoic acid, 4-ethynyl-2-naphthoic acid, 5-ethynyl-2-naphthoic acid, 6-ethynyl-2-naphthoic acid, 7-ethynyl-2-naphthoic acid and 8-ethynyl-2-naphthoic acid; monoacid-chloride compounds obtained by converting the carboxyl groups of the acids recited above into acid-chloride groups, and monoacid-chloride compounds whose monoacid-chloride moieties are those converted from only one carboxyl group each of dicarboxylic acids, such as terephthalic acid, phthalic acid, maleic acid, cyclohexanedicarboxylic acid, 3-hydroxyphthalic acid, 5-norbornene-2,3-dicarboxylic acid, 1,2-dicarboxynaphthalene, 1,3-dicarboxynaphthalene, 1,4-dicarboxynaphthalene, 1,5-dicarboxynaphthalene, 1,6-dicarboxynaphthalene, 1,7-dicarboxynaphthalene, 1,8-dicarboxynaphthalene, 2,3-dicarboxynaphthalene, 2,6-dicarboxynaphthalene and 2,7-dicarboxynaphthalene; and active ester compounds obtained by reaction of monoacid-chloride compounds with N-hydroxybenzotriazole or N-hydroxy-5-norbornene-2,3-dicarboxyimide.

Of the terminal sealing agents recited above, the acid anhydrides including phthalic anhydride, maleic anhydride, nadic anhydride, cyclohexanedicarboxylic acid anhydride and 3-hydroxyphthalic anhydride, monocarboxylic acids including 3-carboxyphenol, 4-carboxyphenol, 3-carboxythiophenol, 4-carboxythiophenol, 1-hydroxy-7-carboxynaphthalene, 1-hydroxy-6-carboxynaphthalene, 1-hydroxy-5-carboxynaphthalene, 1-mercapto-7-carboxynaphthalene, 1-mercapto-6-carboxynaphthalene, 1-mercapto-5-carboxynaphthalene, 3-carboxybenzenesulfonic acid, 4-carboxybenzenesulfonic acid, 3-ethynylbenzoic acid, 4-ethynylbenzoic acid, 3,4-diethynylbenzoic acid and 3,5-diethynylbenzoic acid, the monoacid-chloride compounds whose monoacid-chloride moieties are those converted from carboxyl groups of the monocarboxylic acids recited above, the monoacid-chloride compounds whose monoacid-chloride moieties are those converted from only one carboxyl group each of dicarboxylic acids including terephthalic acid, phthalic acid, maleic acid, cyclohexanedicarboxylic acid, 1,5-dicarboxynaphthalene, 1,6-dicarboxynaphthalene, 1,7-dicarboxynaphthalene and 2,6-dicarboxynaphthalene, and the active ester compounds obtained by reaction of the monoacid-chloride compounds with N-hydroxybenzotriazole or N-hydroxy-5-norbornene-2,3-dicarboxyimide are preferred over the others.

The introduction rate of a monoamine used as terminal sealing agent is preferably from 0.1 to 60 mole %, particularly preferably from 5 to 50 mole %, based on the total amine component. And the introduction rate of a compound chosen from acid anhydrides, monocarboxylic acids, monoacid-chloride compounds or active ester compounds, which are used as terminal seating agent, is preferably from 0.1 to 100 mole %, particularly preferably from 5 to 90 mole %, based on the total diamine component. Two or more different kinds of terminal groups may be introduced by reaction with two or more kinds of terminal sealing agents.

The terminal sealing agent introduced into a polymer can be detected easily by the following method. Specifically, the terminal sealing agent-introduced polymer decomposes into amine components and acid anhydride components, which are structural units of the polymer, when dissolved in an acidic solution. On the polymer thus decomposed, gas chromatography (GC) and NMR measurements are made, and thereby the terminal sealing agent can be detected with ease. Alternatively, pyrolysis gas chromatograph (PGC), infrared spectrum and $^{13}$C NMR spectrum measurements are made directly on the terminal sealing agent-introduced polymer, and thereby the terminal sealing agent can be detected with ease.

The polymer used in the invention, which has structural units represented by formula (1) as its main component, can be synthesized by the following method. Examples of a synthesis method applicable in the case of polyamic acid or polyamic ester include a method of reacting a tetracarboxylic acid dianhydride with a diamine compound at a low temperature, a method of preparing a diester from a tetracarboxylic acid dianhydride and alcohol, and then reacting the diester with an amine in the presence of a condensing agent, a method of preparing a diester from a tetracarboxylic acid dianhydride and alcohol, converting the residual dicarboxylic acid into acid chloride, and then reacting the acid chloride with an amine, and a method of selectively combining a tetracarboxylic acid dianhydride and a diamine, causing reaction between them in a polar solvent mainly containing N-methyl-2-pyrrolidone, N,N-dimethylacetamide, N,N-dimethylformamide, dimethyl sulfoxide or hexamethylphosphorotriamide, or a solvent mainly containing γ-butyrolactone, and then imidizing part of carboxyl groups in side chains by heat treatment or alkylesterifying part of carboxyl groups in side chains by use of an esterification reagent.

Polyhydroxyamide can be obtained by a production method of subjecting a bisaminophenol compound and a dicarboxylic acid to condensation reaction. Specifically, there are a method of reacting the acid with a dehydration condensing agent, such as dicyclohexylcarbodiimide (DCC), and adding thereto a bisaminophenol compound, and a method of dropping a dicarboxylic acid dichloride solution into a bisaminophenol compound solution to which a tertiary amine, such as pyridine, is added.

(b) Photosensitive Agent

The photosensitive agent for use in the invention refers to a compound which imparts a function of forming images by exposure to a photosensitive material and/or acts as a trigger for imparting such a function. Examples of such a compound include compounds generating acids by exposure (photo-acid generators), photosensitive quinonediazide compounds and photosensitive dihydropyridine compounds. These photosensitive agents can also be used as combinations of two or more thereof. For sensitivity adjustment, they can be used in combination with sensitizers. Of those photosensitive agents, photo-acid generators and photosensitive naphthoquinonediazides are preferred over the others.

(b1) Quinonediazide Photosensitive Agent

Ortho-quinonediazide photosensitive agents can be obtained, e.g., by causing condensing reaction between o-quinonediazidesulfonyl chlorides and hydroxy compounds and/or amino compounds in the presence of a dehydrochlorination agent.

Compounds usable as the o-quinonediazidesulfonyl chlorides are, e.g., benzoquinone-1,2-diazide-4-sulfonyl chloride, naphthoquinone-1,2-diazide-5-sulfonyl chloride and naphthoquinone-1,2-diazide-4-sulfonyl chloride. In point of sensitivity, naphthoquinone-1,2-diazide-4-sulfonyl chloride is used to advantage.

Compounds usable as the hydroxy compounds are, e.g., hydroquinone, resorcinol, pyrogallol, bisphenol A, bis(4-hydroxyphenyl)methane, 2,2-bis(4-hydroxyphenyl)hexafluoropropane, 2,3,4-trihydroxybenzophenone, 2,3,4,4'-tetrahydroxybenzophenone, 2,2',4,4'-tetrahydroxybenzophenone, 2,3,4,2',3'-pentahydroxybenzophenone, 2,3,4,3',4',5'-hexahydroxybenzophenone, bis(2,3,4-trihydroxyphenyl)

methane, bis(2,3,4-trihydroxyphenyl)propane, 4b,5,9b,10-tetrahydro-1,3,6,8-tetrahydroxy-5,10-dimethylindeno[2,1-a]indene, tris(4-hydroxyphenyl)methane and tris(4-hydroxyphenyl)ethane.

Compounds usable as the amino compounds are, e.g., p-phenylenediamine, m-phenylenediamine, 4,4'-diaminodiphenyl ether, 4,4'-diaminodiphenylmethane, 4,4'-diaminodiphenyl sulfone, 4,4'-diaminodiphenyl sulfide, o-aminophenol, m-aminophenol, p-aminophenol, 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, bis(3-amino-4-hydroxyphenyl)hexafluoropropane and bis(4-amino-3-hydroxyphenyl)hexafluoropropane, In the condensing reaction between o-quinonediazidesulfonyl chloride and a hydroxy compound and/or an amino compound, it is preferable that the hydroxy compound and/or the amine compound is mixed so that the total quantity of hydroxyl and amino groups falls within the range of 0.5 to 1 equivalent per mole of o-quinonediazidesulfonyl chloride. The suitable ratio between a dehydrochlorination agent and o-quinonediazidesulfonyl chloride is from 1/1 to 1/0.9. The suitable reaction temperature is from 0° C. to 40° C., and the suitable reaction time is from 1 to 24 hours.

Examples of a reaction solvent usable in the condensing reaction include dioxane, 1,3-dioxolane, acetone, methyl ethyl ketone, tetrahydrofuran, chloroform and N-methylpyrrolidone. Examples of a dehydrochlorination agent usable in the condensing reaction include sodium carbonate, sodium hydroxide, sodium hydrogen carbonate, potassium carbonate, potassium hydroxide, trimethylamine, triethylamine, pyridine and 4-dimethylaminopyridine.

In terms of the dissolution speed difference between exposed and unexposed portions and the sensitivity latitude, the amount of quinonediazide photosensitive agent mixed in the present photosensitive resin composition is preferably from 5 to 50 parts by mass, far preferably from 8 to 20 parts by mass, per 100 parts by mass of the total resin.

The mixing amount of photosensitive agents other than quinonediazide photosensitive agents is preferably from 0.1 to 15 parts by mass, far preferably from 0.5 to 10 parts by mass, per 100 parts by mass of the total resin.

Examples of a quinonediazide photosensitive agent can include the compounds having the following structural formulae.

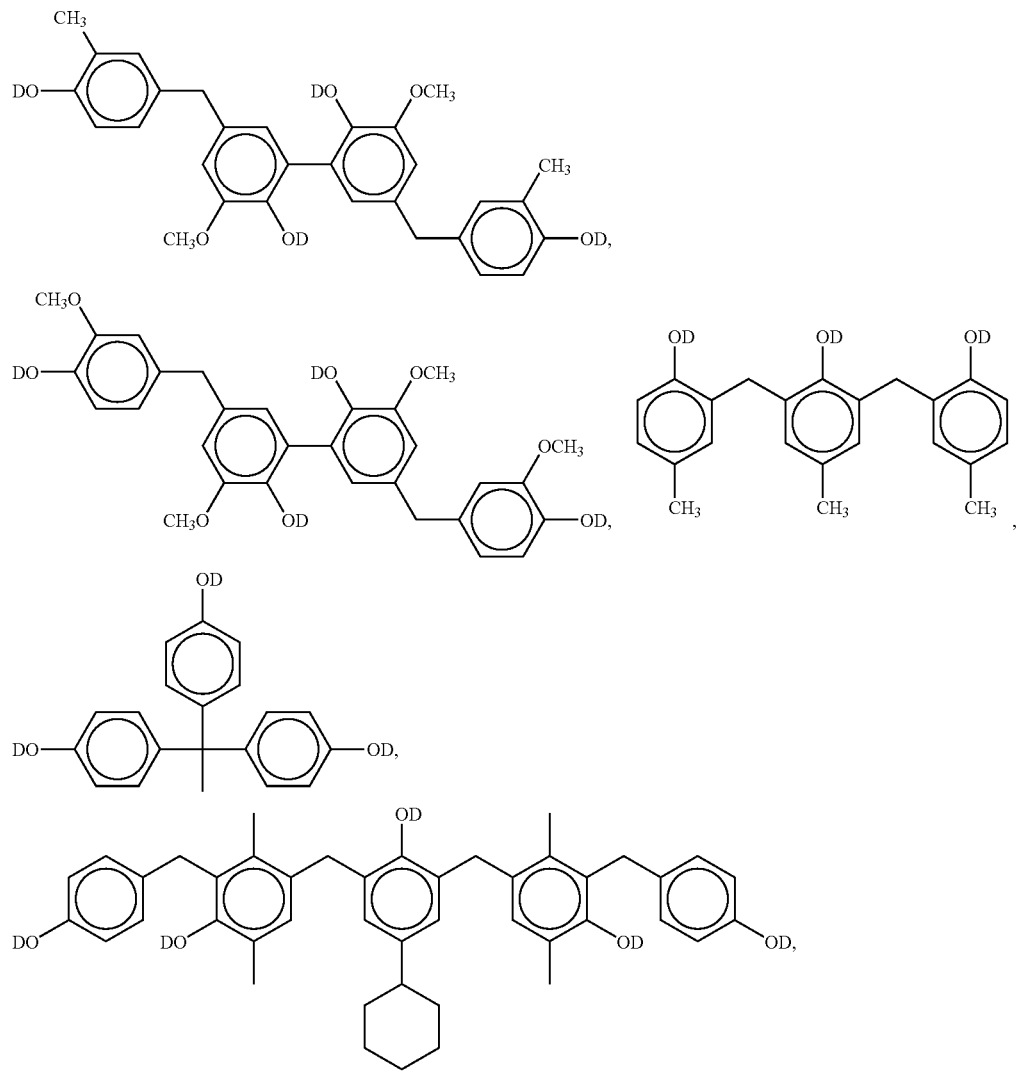

-continued
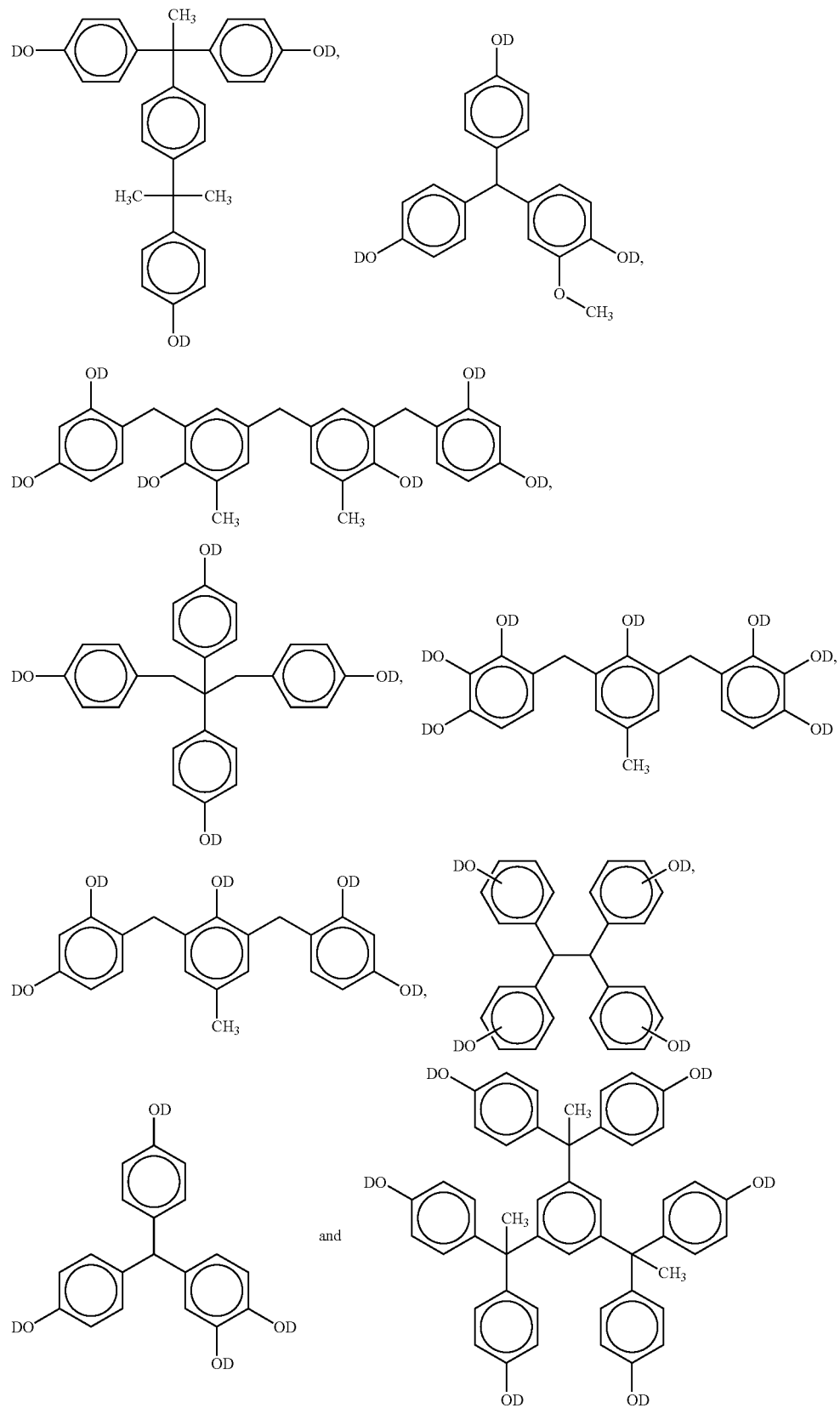
and

-continued

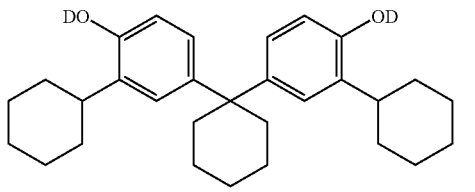

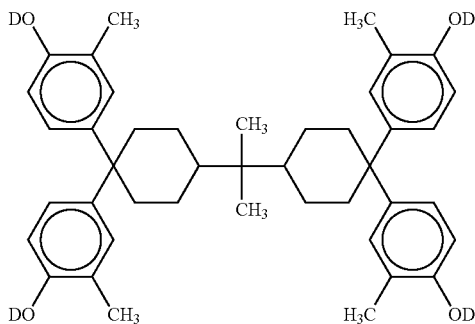

In the above structural formulae, each of Ds stands for H or any of the groups illustrated below:

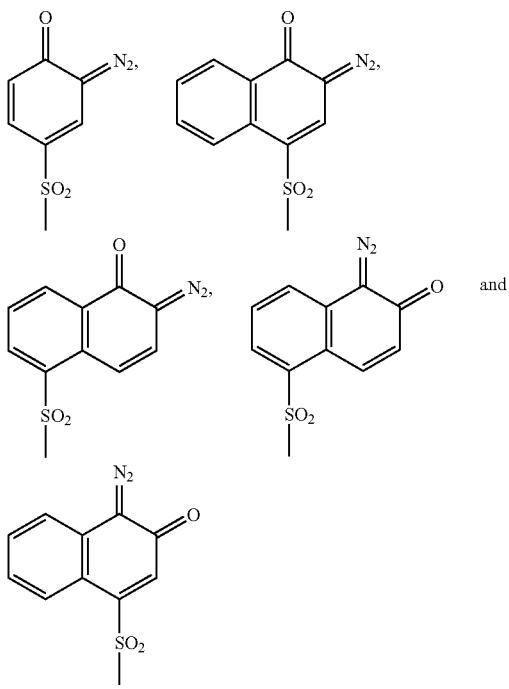

Additionally, it is essential only that at least one D in each of the compounds be one of the quinonediazide groups illustrated above.

The quinonediazide photosensitive agent used in the present composition may be a commercially available product, or may be synthesized according to known methods.

(b2) Photo-Acid Generator

As the photo-acid generator, a compound selected from photo-initiators for cationic photopolymerization, photo-initiators for radical photopolymerization, photodecoloring agents for dyes, photodiscoloring agents, compounds known to generate acids upon irradiation with actinic rays or radiation, which are used in microresist and the like, or a mixture of any two or more of the above-recited ones can be used as appropriate.

Examples of such a photo-acid generator include diazonium salt, phosphonium salt, sulfonium salt, iodonium salt, imide sulfonate, oxime sulfonate, diazodisulfone, disulfone and o-nitrobenzenesulfonate.

Further, it is also possible to use polymeric compounds having main or side chains into which groups or compounds capable of generating acids upon irradiation with actinic rays or radiation are introduced, with examples including the compounds as disclosed in U.S. Pat. No. 3,849,137, German Patent No. 3914407, JP-A-63-26653, JP-A-55-164824, JP-A-62-69263, JP-A-63-146038, JP-A-63-163452, JP-A-62-153853 and JP-A-63-146029.

Furthermore, the compounds capable of generating acids by exposure to light as disclosed in U.S. Pat. No. 3,779,778 and European Patent No. 126,712 can also be used.

The preferred among compounds capable of generating acids upon irradiation with actinic rays or radiation can be compounds represented by the following formulae (ZI), (ZII) and (ZIII).

In formula (ZI), $R_{201}$, $R_{202}$ and $R_{203}$ independently represent an organic group.

X⁻ represents a non-nucleophilic anion, with suitable examples including a sulfonic acid anion, a carboxylic acid anion, a bis(alkylsulfonyl)amide anion, a tris(alkylsulfonyl)methide anion, $BF_4^-$, $PF_6^-$ and $SbF_6^-$.

The preferred among those organic anions are organic anions represented by the following formulae.

$$Rc_1-SO_3^\ominus \quad Rc_1-CO_2^\ominus \quad \underset{Rc_4SO_2}{\overset{Rc_3SO_2}{\diagdown}}N^\ominus \quad Rc_4SO_2-\underset{Rc_5SO_2}{\overset{Rc_3SO_2}{\diagdown}}C^\ominus$$

In the above formulae, $Rc_1$ represents an organic group.

Examples of the organic group of $Rc_1$ include groups containing 1 to 30 carbon atoms, preferably alkyl groups, cycloalkyl groups and aryl groups, which each may have a substituent, and groups formed by combining two or more of those groups via linkage, such as a single bond, —O—, —CO$_2$—, —S—, —SO$_3$— or —SO$_2$N(Rd$_1$)—.

$Rd_1$ represents a hydrogen atom or an alkyl group.

$Rc_3$, $Rc_4$ and $Rc_5$ independently represent an organic group.

Examples of the organic group of $Rc_3$, $Rc_4$ and $Rc_5$ each include the same ones as the organic groups suitable as $Rc_1$, preferably perfluoroalkyl groups containing 1 to 4 carbon atoms.

$Rc_3$ and $Rc_4$ may combine with each other to form a ring.

Examples of a group formed by combining $Rc_3$ with $Rc_4$ include alkylene groups, cycloalkylene groups and arylene groups, preferably perfluoroalkylene groups containing 2 to 4 carbon atoms.

The organic groups of $Rc_1$ and $Rc_3$ to $Rc_5$ are preferably alkyl groups substituted by fluorine atoms or fluoroalkyl groups at their respective 1-positions, or phenyl groups substituted by fluorine atoms or fluoroalkyl groups. By having fluorine atoms or fluoroalkyl groups, the acids generated by irradiation with light rise in acidity, and the sensitivity is increased. On the other hand, formation of a ring by combining $Rc_3$ with $Rc_4$ is also advantageous because it can raise the acidity of acids generated by irradiation with light and enhance the sensitivity.

In formula (ZI), the number of carbon atoms in the organic group of $R_{201}$, $R_{202}$ and $R_{203}$ each is generally from 1 to 30, preferably from 1 to 20.

Any two of $R_{201}$ to $R_{203}$ may combine with each other to form a ring, and the ring formed may contain an oxygen atom, a sulfur atom, an ester link, an amide link or a carbonyl group. Examples of a group formed by combining any two or $R_{201}$ to $R_{203}$ include alkylene groups (such as a butylene group and a pentylene group).

Examples of the preferred among the compounds capable of generating acids upon irradiation with actinic rays or radiation can further include compounds represented by the following formulae (ZIV), (ZV) and (ZVI).

$$Ar_3-SO_2-SO_2-Ar_4 \quad \text{ZIV}$$

ZV $$R_{206}-SO_2-O-N\diagup\diagdown A$$

ZVI $$R_{208}\diagdown\diagup_{R_{207a}}N-O-SO_2-R_{206}$$

In formulae (ZIV) to (ZVI), $Ar_3$ and $Ar_4$ independently represent an aryl group, $R_{206}$ represents an alkyl group, a cycloalkyl group or an aryl group, and $R_{207a}$ and $R_{208}$ independently represent an alkyl group, a cycloalkyl group, an aryl group or an electron-attracting group. $R_{207a}$ is preferably an aryl group, and $R_{208}$ is preferably an electron-attracting group, far preferably a cyano group or a fluoroalkyl group.

A represents an alkylene group, an alkenylene group or an arylene group.

The amount of a photo-acid generator mixed in the present photosensitive resin composition is preferably from 2 to 30 parts by mass, far preferably from 5 to 20 parts by mass, based on 100 parts by mass of the total resin.

<Triarylsulfonium Salt>

Triarylsulfonium salts in particular are preferred, and it is especially advantageous to use them in combination with sensitizers.

The amount of triarylsulfonium salt added is preferably from 0.01 to 50 parts by weight, far preferably from 5 to 15 parts by weight, based on 100 parts by weight of the total resin.

These compounds can be used as combinations of two or more thereof on an as needed basis.

As to the triarylsulfonium salt, it is preferable that at least one of the aryl groups therein has an electron-attracting group as its substituent, and besides, the sum total of Hammett values of substituents attached to the aryl skeletons is greater than 0.18.

The term "electron-attracting group" as used herein refers to a substituent having a Hammett value (Hammett's substituent constant σ) greater than 0. From the viewpoint of increasing the sensitivity in the invention, the sum total of Hammett values of substituents attached to the aryl skeletons is preferably at least 0.18, far preferably greater than 0.46, further preferably greater than 0.60.

Such a Hammett value indicates the degree of electron attraction of the cation having a triarylsulfonium salt structure. In the invention, the Hammett value has no particular upper limit from the viewpoint of increasing the sensitivity, but it is preferably greater than 0.46 and smaller than 4.0, far preferably greater than 0.50 and smaller than 3.5, particularly preferably greater than 0.60 and smaller than 3.0, in terms of reactivity and stability.

Additionally, the Hammett values used in the invention are numerical values described in *Kagaku Seminar* 10, *Hammett's Rule—Kozo to Hannosei—*, edited by Naoki Inamoto, published by Maruzen Co., Ltd. in 1983.

Examples of electron-attracting groups introduced onto the aryl skeletons include a trifluoromethyl group, a halogen atom, an ester group, a sulfoxide group, a cyano group, an amido group, a carboxyl group and a carbonyl group. The Hammett values of these substituents are shown below:

Trifluoromethyl group [—CF$_3$ (m: 0.43, p: 0.54)]

Halogen atom [—F (m: 0.34, p: 0.06), —Cl (m: 0.37, p: 0.23), —Br (m: 0.39, p: 0.23), —I (m: 0.35, p: 0.18)]

Ester group [e.g., —COCH$_3$ (o: 0.37, p: 0.45)]
Sulfoxide group [e.g., —SOCH$_3$ (m: 0.52, p: 0.45)]
Cyano group [—CN (m: 0.56, p: 0.66)]
Amido group [e.g., —NHCOCH$_3$ (m: 0.21, p: 0.00)]
Carboxyl group [—COOH (m: 0.37, p; 0.45)]
Carbonyl group [—CHO (m: 0.36, p: 0.43)]

The letters and numerical values inside the parenthesis indicate introduction sites of each substituent on an aryl skeleton and Hammett values corresponding to the sites, and (m: 0.50), for example, indicates that, when the substituent concerned is introduced at the m-position, it shows a Hammett value of 0.50.

Of these substituents, nonionic substituents, such as halogen atoms and halogenated alkyl group, are preferred in point of hydrophobicity. Of the nonionic substituents, —Cl in particular is preferred in point of reactivity, while —F, —CF$_3$, —Cl and —Br are preferred from the viewpoint of imparting hydrophobicity.

These substituents may be introduced onto any one of the three aryl skeletons of triarylsulfonium salt structure, or may be introduced onto more than one of the aryl skeletons. The number of substituents introduced onto each aryl skeleton may be only one or more than one. In the invention, it is appropriate that the sum total of the Hammett values of substituents introduced onto those aryl skeletons be greater than 0.18, preferably greater than 0.46. An arbitrary number of substituents may be introduced. For example, only one substituent having a great Hammett value (e.g., a Hammett value greater than 0.46 by itself) may be introduced onto one site of an aryl skeleton in the triarylsulfonium salt structure, or two or more substituents whose Hammett values exceed 0.46 in total may be introduced.

As mentioned above, the Hammett value of a substituent varies according to the position in which the substituent is introduced, so the sum total of the Hammett values in a specific photo-acid generator relating to the invention is determined by the kinds, positions and number of substituents introduced.

Additionally, although Hammett's rule generally holds for the m-position and the p-position, the index of electron attraction in the invention is calculated on the supposition that substituent effect in the o-position is the same as that in the p-position. From the synthesis point of view, suitable substitution positions are the m- and p-positions, and the p-position is best.

The preferred in the invention are sulfonium salts each having three or more halogen atoms as substituents, and the sulfonium salts each having three chlorine atoms as substituents are best. More specifically, the photo-acid generators of triarylsulfonium salt structure in which a halogen atom, especially —Cl, is introduced onto each of three aryl skeletons are preferred over the others. And it is preferable by far that each —Cl is substituted at the p-position.

Examples of the sulfonic acid anion of a triarylsulfonium salt containable in the present composition include arylsulfonic acid anions and alkanesulfonic acid anions, and anions substituted by fluorine atoms or fluorine-containing organic groups are preferable.

Compounds of triarylsulfonium salt structure can be synthesized easily according to the methods described, e.g., in *J. Am. Chem. Soc.*, vol. 112(16), pp. 6004-6015 (1990), *J. Org. Chem.*, 1998, pp. 5571-5573, WO 02/081439A1 brochure, and European Patent No. 1113005.

Examples of such compounds are illustrated below, but they should not be construed as being limited to the following.

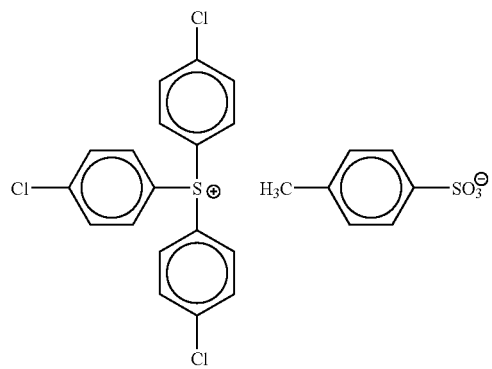

PAG-1

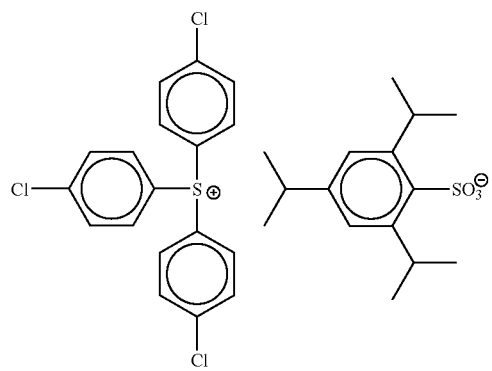

PAG-2

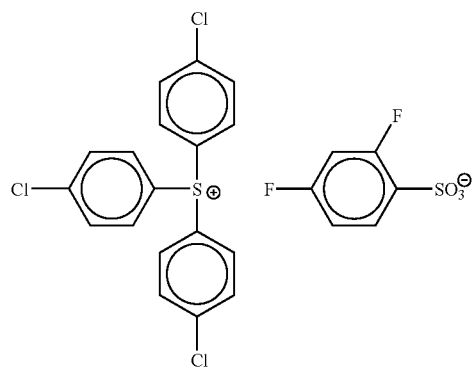

PAG-3

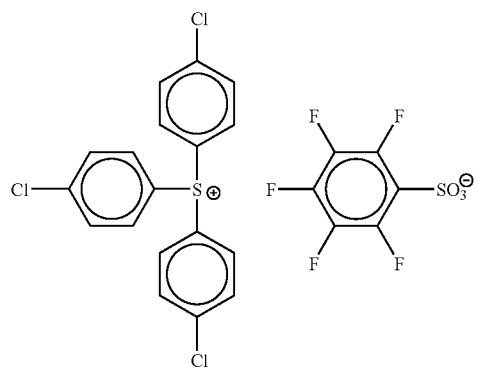

PAG-4

-continued
PAG-5
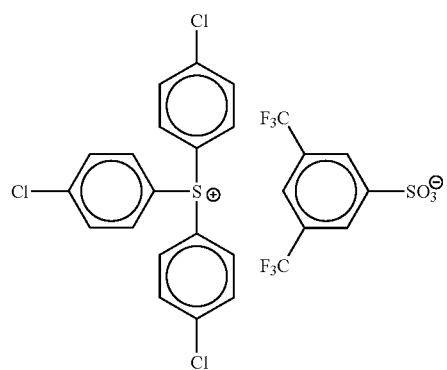
PAG-6
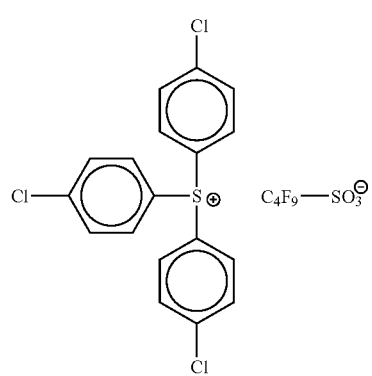
PAG-7
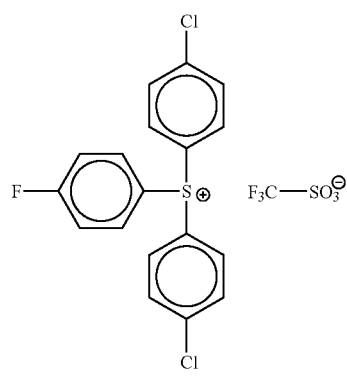
PAG-8
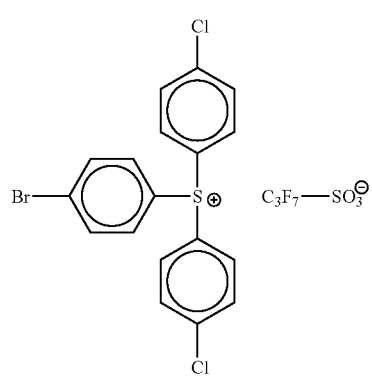
-continued
PAG-9
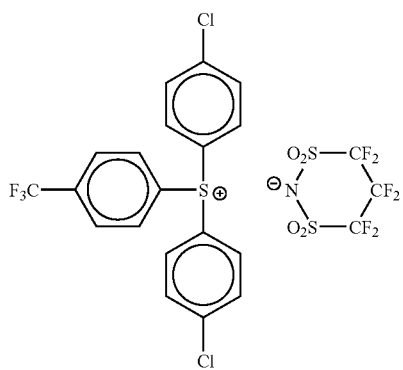
PAG-10
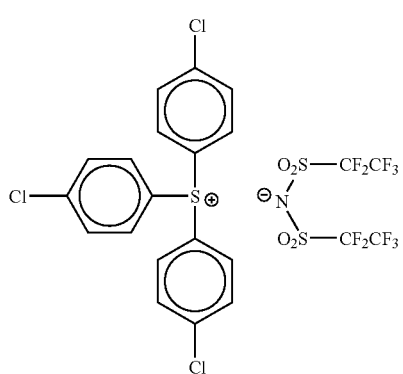
PAG-11
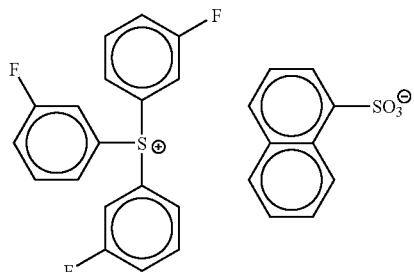
PAG-12
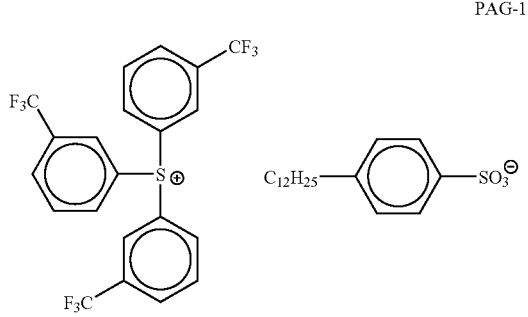

-continued

PAG-13

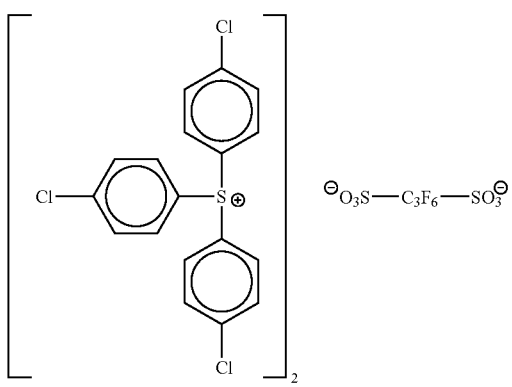

PAG-14

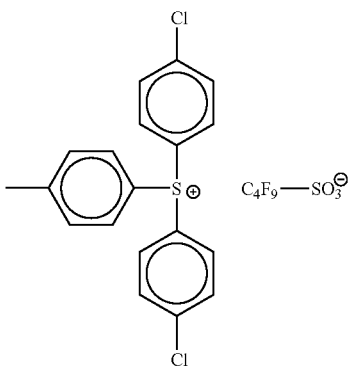

PAG-15

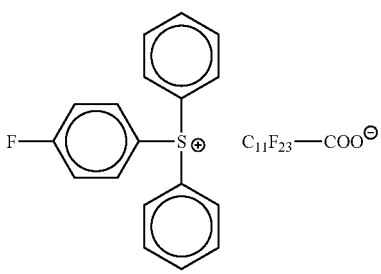

PAG-16

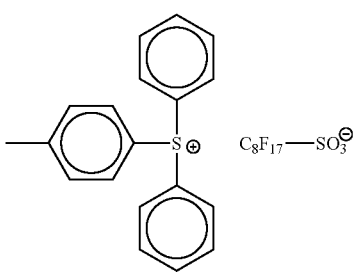

(b3) Sensitizer

To the present composition, a sensitizer may be added for the purpose of accelerating decomposition of the sulfonium salts by absorption of actinic rays or radiation. The sensitizer enters an electronically-excited state by absorption of actinic rays or radiation. When the sensitizer in an electronically-excited state comes into contact with sulfonium, there occurs an action, such as electron transfer, energy transfer or heat generation. This action causes a chemical change in a polymerization initiator, and thereby the polymerization initiator is decomposed and produces a radical, an acid or a base.

Suitable examples of such a sensitizer include compounds belonging to the kinds recited below, and that having absorption wavelengths in a range of 350 nm to 450 nm.

The compounds are polynuclear aromatic hydrocarbons (e.g., pyrene, perylene, triphenylene, anthracene), xanthenes (e.g., fluorescein, Eosine, Erythrocin, Rhodamine B, Rose Bengale), cyanines (e.g., thiacarbocyanine, oxacarbocyanine), mercocyanines (e.g., merocyanine, carbomerocyanine), thiazines (e.g., Thionine, Methylene Blue, Toluidine Blue), acridines (e.g., Acridine Orange, chloroflavin, acriflavine), anthraquinones (e.g., anthraquinone), squaryliums (e.g., squarylium), and coumarins (e.g., 7-diethylamino-4-methylcoumarin).

Examples of a sensitizer preferably used in the present composition include compounds represented by the following formulae (IX) to (XIV).

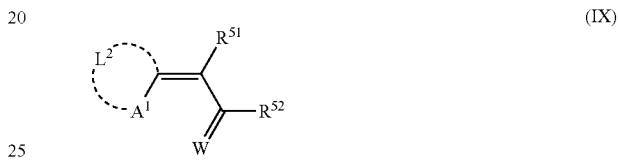

(IX)

In formula (IX), $A^1$ represents a sulfur atom or $NR^{50}$, and $R^{50}$ represents an alkyl group or an aryl group. $L^2$ represents nonmetal atoms forming a basic nucleus of dye in conjunction with the neighboring $A^1$ and carbon atom. $R^{51}$ and $R^{52}$ independently represent a hydrogen atom or a univalent nonmetal atoms. Alternatively, $R^{51}$ and $R^{52}$ may combine with each other to form an acidic nucleus of dye. W represents an oxygen atom or a sulfur atom.

(X)

In formula (X), $Ar^1$ and $Ar^2$ independently represent an aryl group, and they are combined via the linkage -$L^3$-. Herein, -$L^3$- represents —O— or —S—. And W has the same meaning as in formula (IX).

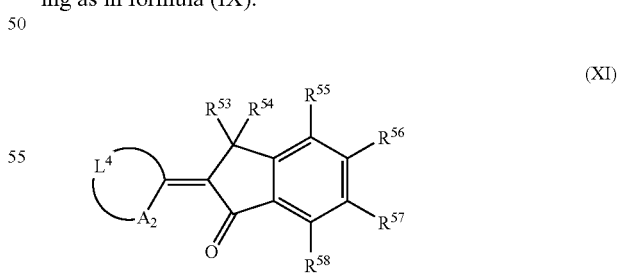

(XI)

In formula (XI), $A_2$ represents a sulfur atom or $NR^{59}$, and $L^4$ represents nonmetal atoms forming a basic nucleus of dye in conjunction with the neighboring $A_2$ and carbon atom. $R^{53}$, $R^{54}$, $R^{55}$, $R^{56}$, $R^{57}$ and $R^{58}$ independently represent a univalent nonmetal atoms, and $R^{59}$ represents an alkyl group or an aryl group.

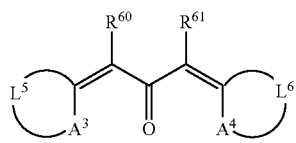
(XII)

In formula (XII), $A^3$ and $A^4$ independently represent —S—, —NR$^{62}$— or —NR$^{63}$, and R$^{62}$ and R$^{63}$ independently represent a substituted or unsubstituted alkyl group, or a substituted or unsubstituted aryl group, L$^5$ and L$^6$ independently represent nonmetal atoms forming a basic nucleus of dye in conjunction with the individually neighboring A$^3$ or A$^4$ and carbon atom. R$^{60}$ and R$^{61}$ independently represent a hydrogen atom or a univalent nonmetal atoms, or they may combine with each other to form an aliphatic or aromatic ring.

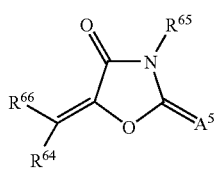
(XIII)

In formula (XIII), R$^{66}$ represents an aromatic ring or a hetero ring which may have a substituent, and A$^5$ represents an oxygen atom, a sulfur atom or —NR$^{67}$—. R$^{64}$, R$^{65}$ and R$^{67}$ independently represent a hydrogen atom or a univalent nonmetal atoms. R$^{67}$ can combine with R$^{64}$, and R$^{65}$ can combine with R$^{67}$ to form aliphatic or aromatic rings, respectively.

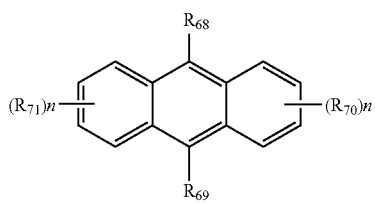
(XIV)

In formula (XIV), R$_{68}$ and R$_{69}$ independently represent a hydrogen atom or a univalent nonmetal atoms, R$_{70}$ and R$_{71}$ independently represent a hydrogen atom or a univalent nonmetal atoms. n represent an integer of 0 to 4. When n is 2 or above, R$_{70}$s can combine with each other and R$_{71}$s can also combine with each other to form aliphatic or aromatic rings, respectively.

As to the sensitizers, anthracene derivatives in particular are used to advantage.

Suitable examples of compounds represented by formulae (IX) to (XIV) include Compound (C-1) to Compound (C-26) illustrated below, but the compounds suitable for use in the invention should not be construed as being limited to these examples.

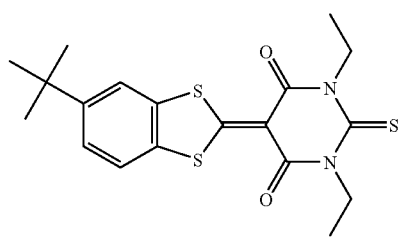
(C-1)

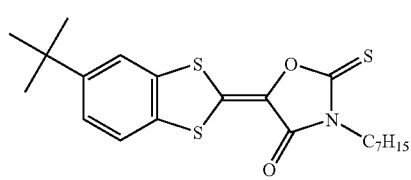
(C-2)

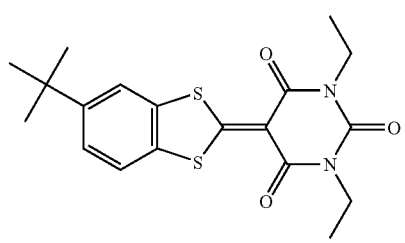
(C-3)

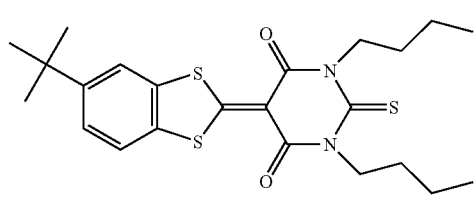
(C-4)

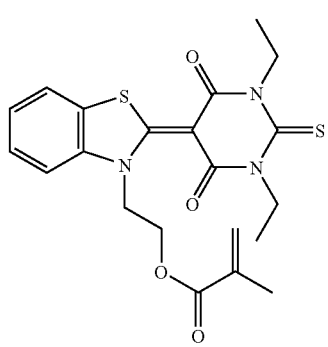
(C-5)

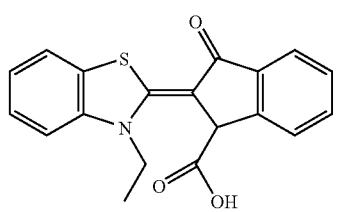
(C-6)

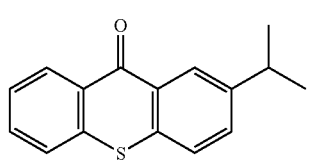
(C-7)

-continued
(C-8)
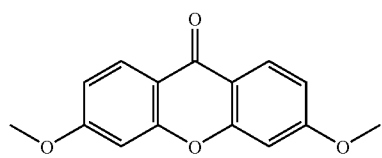
(C-9)
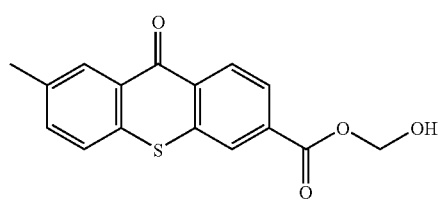
(C-10)
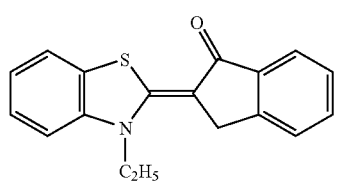
(C-11)
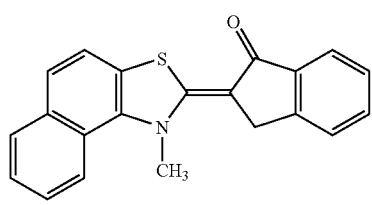
(C-12)
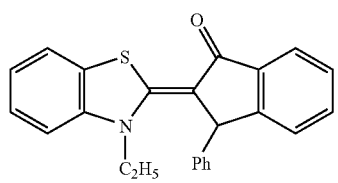
(C-13)
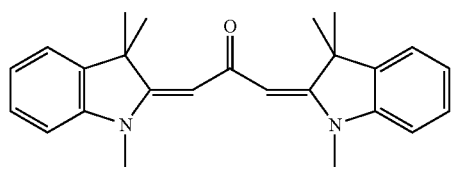
(C-14)
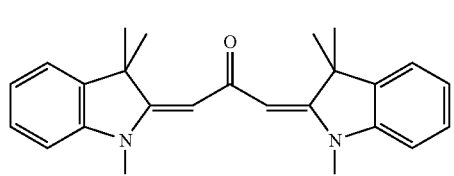
(C-15)
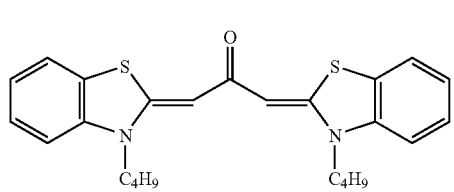
-continued
(C-16)
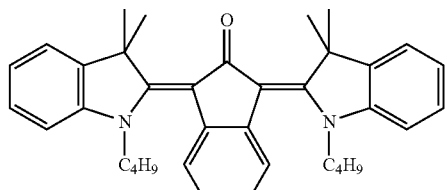
(C-17)
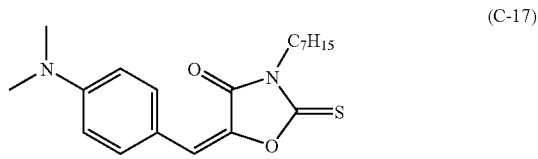
(C-18)
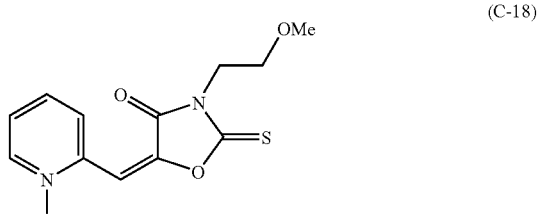
(C-19)
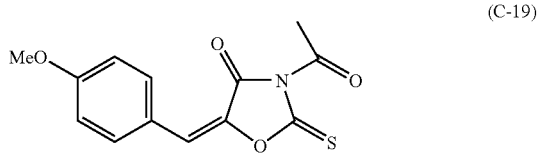
(C-20)
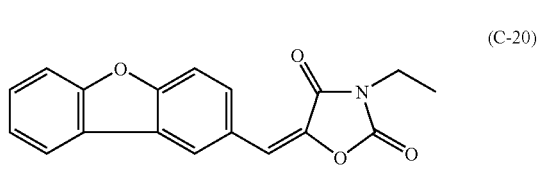
(C-21)
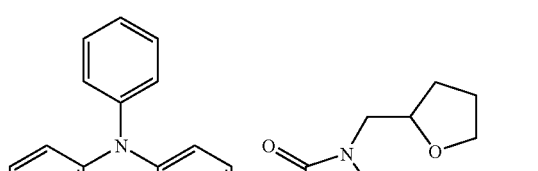
(C-22)
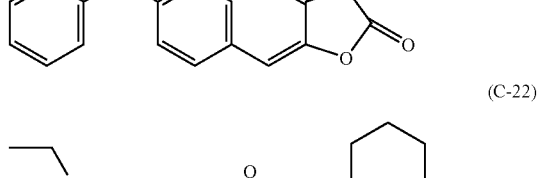

(C-23)
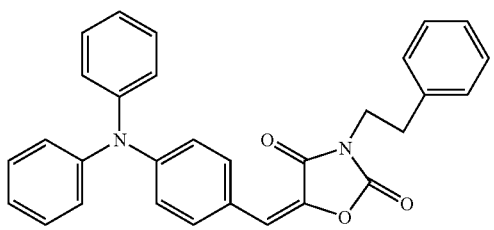

(C-24)
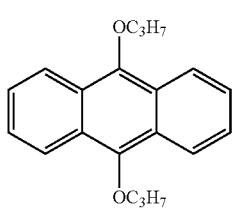

(C-25)
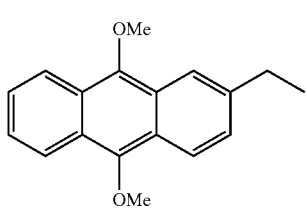

(C-26)
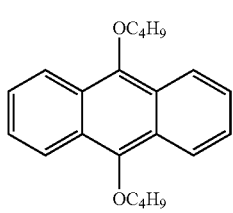

As to the sensitizers recited above, commercially available products corresponding thereto may be utilized, or the sensitizers to be used may be synthesized according to known methods.

The amount of sensitizers added is preferably from 20 to 200 parts by mass, far preferably from 30 to 150 parts by mass, per 100 parts by mass of the photosensitive agent.

Additionally, oxime sulfonates (ZVI) are also included in examples of the preferred among compounds capable of generating acids upon irradiation with actinic rays or radiation.

Suitable examples of the oxime sulfonates include the following.

(z66)
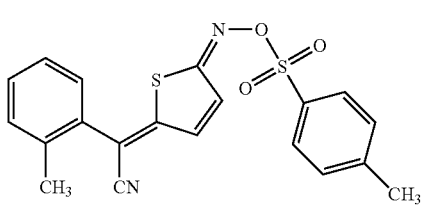

(z67)
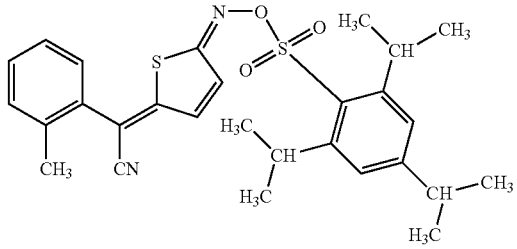

(z68)
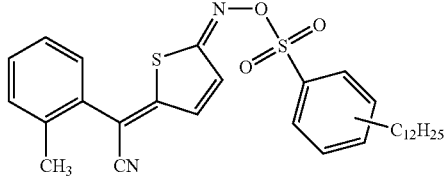

(z69)
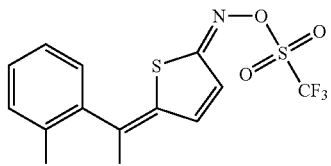

(z70)
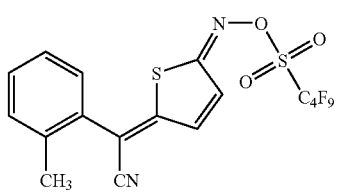

The acid generators may be used alone or as combinations of two or more thereof. When two or more acid generators are used in combination, it is advantageous to choose a combination of compounds capable of generating two kinds of organic acids which differ by two or more in the total number of all constituent atoms but hydrogen atoms.

(c) Thermo-Acid Generator

The term "thermo-acid generator" used in the invention refers to a compound capable of generating an acid by heat and generally having its thermal decomposition temperature in a range of 130° to 250° C., preferably 150° to 220° C. More specifically, the thermo-acid generator is a compound that can generate an acid having low nucleophilicity, such as sulfonic acid, carboxylic acid or disulfonylimide, by heating.

As the acid generated by heating, a strong acid having pKa of 2 or below, such as sulfonic acid, an alkyl- or arylcarboxylic acid having an electron-attracting group as a substituent, or a disulfonylimide having an electron-attracting group as a substituent, is preferred. Examples of such an electron-attracting group include halogen atoms such as a fluorine atom, a haloalkyl group such as a trifluoromethyl group, a nitro group and a cyano group.

The thermo-acid generator is required not to decompose during storage and in the pre-bake process subsequent to application of the composition, but to decompose quickly in the heat curing process subsequent to patterning. Accordingly, the thermal decomposition temperature is preferably from 100° C. to 300° C., far preferably from 120° C. to 250° C., further preferably from 150° C. to 200° C.

To the thermo-acid generator, compounds among the photo-acid generators recited above, which generate acids by exposure to light, are applicable. For example, onium salts, such as sulfonium salts and iodonium salts, N-hydroxyimide sulfonate compounds, oxime sulfonates and o-nitrobenzyl sulfonates are applicable.

Examples of sulfonium salts suitable as thermo-acid generators include compounds represented by the following formulae (TA-1) to (TA-3).

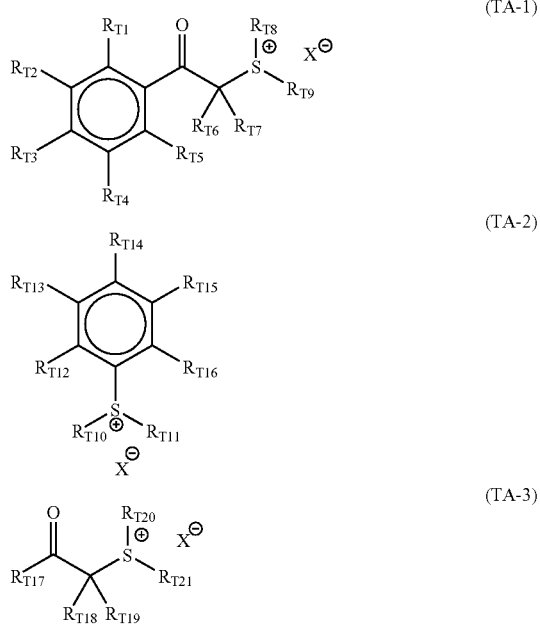

In formula (TA-1), $R_{T1}$ to $R_{T5}$ independently represent a hydrogen atom, an alkyl group, a cycloalkyl group, an alkoxy group or a halogen atom.

$R_{T6}$ and $R_{T7}$ independently represent a hydrogen atom, an alkyl group or a cycloalkyl group.

$R_{T8}$ and $R_{T9}$ independently represent an alkyl group, a cycloalkyl group, an allyl group or a vinyl group.

Any two or more of $R_{T1}$ to $R_{T5}$, $R_{T6}$ and $R_{T7}$, and $R_{T8}$ and $R_{T9}$ may respectively combine with each other to form ring structures. These ring structures each may contain an oxygen atom, a sulfur atom, a ketone linkage, an ester linkage or an amido linkage.

Examples of a group formed by combining any two or more of $R_{T1}$ to $R_{T5}$, $R_{T6}$ with $R_{T7}$, or $R_{T8}$ with $R_{T9}$ include a butylene group and a pentylene group.

$X^-$ represents a non-nucleophilic anion, preferably an anion of a strong acid having pKa of 2 or below as described hereinbefore, with examples including a sulfonate anion, an alkyl- or arylcarboxylate anion having an electron-attracting group as a substituent and a disulfonylinide anion having an electron-attracting group as a substituent. Examples of such an electron-attracting group include halogen atoms, such as a fluorine atom, haloalkyl groups, such as a trifluoromethyl group, a nitro group and a cyano group.

In formula (TA-2), $R_{T10}$ and $R_{T11}$ independently represent an alkyl group, a cycloalkyl group, an allyl group or a vinyl group. (They have the same meanings as $R_{T8}$ and $R_{T9}$ in formula (TA-1).) $R_{T10}$ and $R_{T11}$ may combine with each other to form a ring structure, and this ring structure may contain an oxygen atom, a sulfur atom, a ketone linkage, an ester linkage or an amide linkage.

Examples of a group formed by combining $R_{T10}$ with $R_{T11}$ include a butylene group and a pentylene group.

$R_{T12}$ to $R_{T16}$ independently represent a hydrogen atom, an alkyl group, a cycloalkyl group, an aryl group, an alkoxy group, a thioalkoxy group or a hydroxyl group, or any two or more of them may combine with each other to form a polycyclic aromatic ring, such as a naphthalene ring or an anthracene ring.

In formula (TA-3), $R_{T17}$ represents an alkyl group (straight-chain or branched) or a cycloalkyl group. Suitable examples of such an alkyl group include straight-chain or branched alkyl groups containing 1 to 20, preferably 1 to 12, carbon atoms (such as a methyl group, an ethyl group, a straight-chain or branched propyl group, a straight-chain or branched butyl group, and a straight-chain or branched pentyl group). Examples of such a cycloalkyl group include not only monocyclic cycloalkyl groups, such as a cyclopentyl group and a cyclohexyl group, but also bridged cycloalkyl groups, such as a norbornyl group, a tricyclodecanyl group and an adamantyl group.

$R_{T18}$ and $R_{T19}$ independently represent a hydrogen atom, an alkyl group or a cycloalkyl group.

$R_{T20}$ and $R_{T21}$ independently represent an alkyl group, a cycloalkyl group, an allyl group or a vinyl group.

$R_{T18}$ and $R_{T19}$ may combine with each other, $R_{T20}$ and $R_{T21}$ may also combine with each other, and thereby ring structures may be formed respectively. These ring structures each may contain an oxygen atom, a sulfur atom, a ketone linkage, an ester linkage or an amide linkage. Examples of a group formed by combining $R_{T18}$ with $R_{T19}$, or $R_{T20}$ with $R_{T21}$ include a butylene group and a pentylene group.

The alkyl group as each of $R_{T1}$ to $R_{T17}$ may be straight-chain or branched in structure, with examples including straight-chain or branched alkyl groups containing 1 to 20, preferably 1 to 12, carbon atoms (such as a methyl group, an ethyl group, a straight-chain or branched propyl group, a straight-chain or branched butyl group and a straight-chain or branched pentyl group).

The cycloalkyl group as each of $R_{T1}$ to $R_{T17}$ intends to include not only a monocyclic alkyl group but also a polycyclic cycloalkyl group having a bridged portion, and the cycloalkyl group as each of $R_{T12}$ to $R_{T16}$ is preferably a cycloalkyl group containing 3 to 8 carbon atoms (such as a cyclopentyl group or a cyclohexyl group).

The cycloalkyl group preferred as $R_{T17}$ is not only a cycloalkyl group containing 3 to 8 carbon atoms (e.g., a cyclopentyl group or a cyclohexyl group) but also a bridged cycloalkyl group such as a norbornyl group, a tricyclodecanyl group or an adamantyl group.

The alkoxy group as each of $R_{T1}$ to $R_{T5}$ and $R_{T12}$ to $R_{T16}$ may be straight-chain, branched or cyclic in structure, with examples including alkoxy groups containing 1 to 10 carbon atoms, preferably straight-chain and branched alkoxy groups containing 1 to 5 carbon atoms (such as a methoxy group, an ethoxy group, a straight-chain or branched propoxy group, a straight-chain or branched butoxy group and a straight-chain or branched pentoxy group) and cyclic alkoxy groups containing 3 to 8 carbon atoms (such as a cyclopentyloxy group and a cyclohexyloxy group).

The thioalkoxy group as each of $R_{T12}$ to $R_{T16}$ may be straight-chain, branched or cyclic in structure, with examples including thioalkoxy groups containing 1 to 10 carbon atoms, preferably straight-chain or branched thioalkoxy groups containing 1 to 5 carbon atoms (such as a thiomethoxy group, a thioethoxy group, a straight-chain or branched thiopropoxy group, a straight-chain or branched thiobutoxy group and a straight-chain or branched thiopentoxy group) and cyclic thioalkoxy groups containing 3 to 8 carbon atoms (such as a thiocyclopentyloxy group and a thiocyclohexyloxy group).

The non-nucleophilic anion as $X^-$ is preferably an organic anion, particularly preferably an organic anion represented by the following formula.

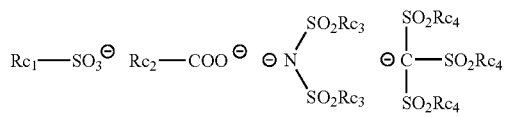

In the above formulae, $Rc_1$ represents an organic group.

Examples of the organic group of $Rc_1$ include groups containing 1 to 30 carbon atoms, preferably alkyl groups, cycloalkyl groups and aryl groups, which each may have a substituent, and groups formed by combining two or more of those groups via linkage, such as a single bond, —O—, —CO$_2$—, —S—, —SO$_3$— or —SO$_2$N(Rd$_1$)—.

$Rd_1$ represents a hydrogen atom or an alkyl group.

$Rc_2$ represents an alkyl group which is substituted by a fluorine atom or a fluoroalkyl group at the 1-position.

$Rc_3$ and $Rc_4$ independently represent an alkyl group which is substituted by a fluorine atom or a fluoroalkyl group at the I-position, preferably a perfluoroalkyl group containing 1 to 4 carbon atoms.

$Rc_3$ and $Rc_4$ may combine with each other to form a ring.

Examples of a group formed by combining $Rc_3$ with $Rc_4$ include alkylene groups, cycloalkylene groups and arylene groups, preferably perfluoroalkylene groups containing 2 to 4 carbon atoms.

Examples of an iodonium salt suitable as a thermo-acid generator include compounds represented by the following formula (TA-4).

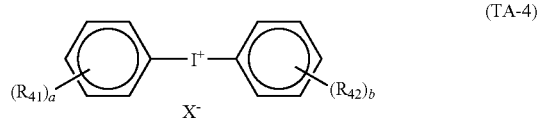

In formula (TA-4), $R_{41}$ and $R_{42}$ independently represent a hydrogen atom, an unsubstituted or substituted allyl group, an unsubstituted or substituted cycloalkyl group, an unsubstituted or substituted alkoxy group, an unsubstituted or substituted alkoxycarbonyl group, an unsubstituted or substituted acyl group, an unsubstituted or substituted acyloxy group, a nitro group, a halogen atom, a hydroxyl group or a carboxyl group.

a represents an integer of 1 to 5, and b represents an integer of 1 to 5.

However, at least either $R_{41}$ or $R_{42}$ is required to contain at least 5 carbon atoms and represent an alkyl, cycloalkyl, alkoxy, alkoxycarbonyl, acyl or acyloxy group which may have a substituent.

X represents R—SO$_3$, and R represents an aliphatic or aromatic hydrocarbon group which may have a substituent.

Examples of the alkyl group as each of $R_{41}$ and $R_{42}$ include alkyl groups containing 1 to 25 carbon atoms, such as a methyl group, an ethyl group, a propyl group, a n-butyl group, an isobutyl group, a sec-butyl group, a t-butyl group, a pentyl group, a hexyl group, a heptyl group, an octyl group, a t-amyl group, a decanyl group, a dodecanyl group and hexadecanyl group, which each may have a substituent. Examples of the cycloalkyl group as each of $R_{41}$ and $R_{42}$ include cycloalkyl groups containing 3 to 25 carbon atoms, such as a cyclopropyl group, a cyclopentyl group, a cyclohexyl group, a cyclooctyl group, a cyclododecanyl group and a cyclohexadecanyl group, which each may have a substituent. Examples of the alkoxy group as each of $R_{41}$, and $R_{42}$ include alkoxy groups containing 1 to 25 carbon atoms, such as a methoxy group, an ethoxy group, a propoxy group, an isopropyl group, an n-butoxy group, an isobutoxy group, a sec-butoxy group, a t-butoxy group, a pentyloxy group, a t-amyloxy group, an n-hexyloxy group, an n-octyloxy group and an n-dodecaneoxy group, which each may having a substituent.

Examples of the alkoxycarbonyl group as each of $R_{41}$ and $R_{42}$ include alkoxycarbonyl groups containing 2 to 25 carbon atoms, such as a methoxycarbonyl group, an ethoxycarbonyl group, a propoxycarbonyl group, an isopropoxycarbonyl group, an n-butoxycarbonyl group, an isobutoxycarbonyl group, a sec-butoxycabonyl group, a t-butoxycarbonyl group, a pentyloxycarbonyl group, a t-amyloxycarbonyl group, an n-hexyloxycarbonyl group, an n-octyloxycarbonyl group and n-dodecaneoxycarbonyl group, which each may have a substituent. Examples of the acyl group as each of $R_{41}$ and $R_{42}$ include acyl groups containing 1 to 25 carbon atoms, such as a formyl group, an acetyl group, a butyryl group, a valeryl group, a hexanoyl group, an octanoyl group, a t-butylcarbonyl group and a t-amylcarbonyl group, which each may have a substituent. Examples of the acyloxy group as each of $R_{41}$ and $R_{42}$ include acyloxy groups containing 2 to 25 carbon atoms, such as an acetoxy group, a propionyloxy group, a butyryloxy group, a t-butyryloxy group, a t-amyryloxy group, an n-hexanecarbonyloxy group, an n-octanecarbonyloxy group, an n-dodecanecarbonyloxy group and a n-hexadecanecarbonyloxy group, which each may have a substituent. Examples of the halogen atom as each of $R_{41}$, and $R_{42}$ include a fluorine atom, a chlorine atom, a bromine atom and an iodine atom.

Examples of substituents those groups have suitably include alkoxy groups containing 1 to 4 carbon atoms, halogen atoms (fluorine, chlorine, bromine and iodine atoms), acyl groups, acyloxy groups, a cyano group, a hydroxyl group, a carboxyl group, alkcoxycarbonyl groups, and a nitro group. However, as mentioned above, at least either of $R_{41}$ or $R_{42}$ is required to contain at least 5 carbon atoms and represent an alkyl, cycloalkyl, alkoxy, alkoxycarboxyl, acyl or acyloxy group which may have a substituent. Examples of these groups which each contain 5 or more carbon atoms include those containing 5 to 25 carbon atoms per group among the above-cited examples of the groups corresponding to them respectively.

Of the groups recited above, the preferred as alkyl groups, which may have substituents, of $R_{41}$, and $R_{42}$ include a methyl group, an ethyl group, a propyl group, an isopropyl group, a butyl group, a t-butyl group, an n-pentyl group, a t-amyl group, an n-hexyl group, an n-octyl group and decanyl group, the preferred as cycloalkyl groups, which may have substituents, include a cyclohexyl group, a cyclooctyl group and a cyclododecanyl group, the preferred as alkoxy groups, which may have substituents, include a methoxy group, an ethoxy group, an isopropoxy group, an n-butoxy group, a sec-butoxy group, a t-butoxy group, a pentyloxy group, a t-amyloxy group, an n-hexyloxy group, an n-octyloxy group and an n-dodecaneoxy group, the preferred as alkoxycarbonyl groups, which may have substituents, include a methoxycarbonyl group, an ethoxycarbonyl group, an isopropoxycarbonyl group, an n-butoxycarbonyl group, a sec-butoxycarbonyl group, a t-butoxycarbonyl group, a pentyloxycarbonyl group, a t-amyloxycarbonyl group, an n-hexyloxycarbonyl group, an n-octyloxycarbonyl group and an n-dodecaneoxycarbonyl group, the preferred as acyl groups, which may have substituents, include a formyl group, an acetyl group, a butyryl group, a valeryl group, a hexanoyl group, an octanoyl group, a t-butylcarbonyl group and a t-amylcarbonyl group, and the preferred as acyloxy groups, which may have substituents, include an acetoxy group, a propionyloxy group, a butyryloxy group, a t-butyryloxy group, a t-amyryloxy group, an n-hexanecarbonyloxy group and an n-octanecarbonyloxy group.

Suitable examples of the alkyl group which contains 5 or more carbon atoms and may have a substituent include an n-pentyl group, a t-amyl group, an n-hexyl group, an n-octyl group and a decanyl group. Suitable examples of the cycloalkyl group which contains 5 or more carbon atoms and may have a substituent include a cyclohexyl group, a cyclooctyl group and a cyclododecanyl group. Suitable examples of the alkoxy group which contains 5 or more carbon atoms and may have a substituent include a pentyloxy group, a t-amyloxy group, a hexyloxy group, an n-octyloxy group and a dodecaneoxy group. Suitable examples of the alkoxycarbonyl group which contains 5 or more carbon atoms and may have a substituent include a pentyloxycarbonyl group, a t-amyloxycarbonyl group, a hexyloxycarbonyl group, an n-octyloxycarbonyl group and a dodecaneoxycarbonyl group. Suitable examples of the acyl group which contains 5 or more carbon atoms and may have a substituent include a valeryl group, a hexanoyl group, an octanoyl group and a t-amylcarbonyl group. Suitable examples of the acyloxy group which contains 5 or more carbon atoms and may have a substituent include a t-amyryloxy group, an n-hexanecarbonyloxy group and an n-octanecarbonyloxy group. Suitable examples of substituents those groups may have include a methoxy group, an ethoxy group, a t-butoxy group, a chlorine atom, a bromine atom, a cyano group, a hydroxyl group, a methoxycarbonyl group, an ethoxycarbonyl group, a t-butoxycarbonyl group and a t-amyloxycarbonyl group.

The iodonium compound of formula (TA-4) usable in the invention contain as its counter anion X⁻ the sulfonate anion having a particular structure as mentioned above. Examples of an aliphatic hydrocarbon group, which may have a substituent, represented by R in the counter anion X⁻ include straight-chain, branched and cyclic alkyl groups containing 1 to 20 carbon atoms. In addition, R may be an aromatic group which may have a substituent. Examples of the alkyl group of R include alkyl groups containing 1 to 20 carbon atoms, such as a methyl group, an ethyl group, a propyl group, an n-butyl group, an n-pentyl group, an n-hexyl group, an n-octyl group, a 2-ethylhexyl group, a decyl group and a dodecyl group, which each may have a substituent. Examples of the cycloalkyl group of R include a cyclopentyl group, a cyclohexyl group, a cyclooctyl group, a cyclododecyl group, an adamantyl group, a norbornyl group, a camphor residue (2-oxobornyl group), a tricyclodecanyl group and a menthyl group, which each may have a substituent. Examples of the aromatic group of R include a phenyl group and a naphthyl group, which each may have a substituent.

Of the groups cited above, the preferred as the alkyl group of R, which may have a substituent, include a methyl group, a trifluoromethyl group, an ethyl group, a pentafluoroethyl group, a 2,2,2-trifluoroethyl group, an n-propyl group, an n-butyl group, a nonafluorobutyl group, an n-pentyl group, an n-hexyl group, an n-octyl group, a heptadecafluorooctyl group, a 2-ethylhexyl group, a decyl group and a dodecyl group, and the preferred as the cycloalkyl group of R include a cyclopentyl group, a cyclohexyl group and a camphor residue. The preferred as the aromatic group of R, which may have a substituent, include a phenyl group, a naphthyl group, a pentafluorophenyl group, a p-toluoyl group, a p-fluorophenyl group, a p-chlorophenyl group, a p-hydroxyphenyl group, a p-methoxyphenyl group, a dodecylphenyl group, a mesityl group, a triisopropylphenyl group, a 4-hydroxy-1-naphthyl group and a 6-hydroxy-2-naphthyl group.

Examples of substituents preferred by far among those represented by $R_{41}$ and $R_{42}$ include a methyl group, an ethyl group, a propyl group, an isopropyl group, an n-butyl group, a t-butyl group, an n-pentyl group, a t-amyl group, an n-hexyl group, an n-octyl group, a cyclohexyl group, a methoxy group, an ethoxy group, an isopropoxy group, an n-butoxy group, a t-butoxy group, a pentyloxy group, a t-amyloxy group, a hexyloxy group, an n-octyloxy group, a methoxycarbonyl group, an ethoxycarbonyl group, an n-butoxycarbonyl group, a t-butoxycarbonyl group, a t-amyloxycarbonyl group, a hexyloxycarbonyl group, an n-octyloxycarbonyl group, a formyl group, an acetyl group, a butyryl group, a hexanoyl group, an octanoyl group, a t-butylcarbonyl group, a t-amylcarbonyl group, an acetoxy group, a propionyloxy group, a butyryloxy group, a t-butyryloxy group, a t-amyryloxy group, an n-hexanecarbonyloxy group, an n-octanecarbonyloxy group, a hydroxyl group, a chlorine atom, a bromine atom and a nitro group. Examples of groups containing 5 or more carbon atoms which are preferred by far as $R_{41}$ and $R_{42}$ include an n-pentyl group, a t-amyl group, an n-hexyl group, an n-octyl group, a decanyl group, a cyclohexyl group, a pentyloxy group, a t-amyloxy group, a hexyloxy group, an n-octyloxy group, a dodecaneoxy group, a pentyloxycarbonyl group, a t-amyloxycarbonyl group, a hexyloxycarbonyl group, an n-octyloxycarbonyl group, a dodecaneoxycarbonyl group, a valeryl group, a hexanoyl t-amyryloxy group, an octanoyl group, a t-amylcarbonyl group, t-amyryloxy group, an n-hexanecarbonyloxy group and an n-octanecarboxyloxy group.

Examples of the group preferred by far as R moiety in the sulfonate include a methyl group, a trifluoromethyl group, an ethyl group, a pentafluoroethyl group, a 2,2,2-trifluoroethyl group, an n-butyl group, a nonafluorobutyl group, an n-hexyl group, an n-octyl group, a heptadecafluorooctyl group, a 2-ethylhexyl group, a camphor residue, a phenyl group, a naphthyl group, a pentafluorophenyl group, a p-toluoyl group, a p-fluorophenyl group, a p-chlorophenyl group, a p-methoxyphenyl group, a dodecylphenyl group, a mesityl group, a triisopropylphenyl group, a 4-hydroxy-1-naphthyl group and a 6-hydroxy-2-naphthyl group.

The total number of carbon atoms in an acid generated is preferably from 1 to 30, far preferably from 1 to 28, further preferably from 1 to 25. In pattern formation, the total carbon number smaller than 1 sometimes causes a hitch such that the pattern top takes on a shape of T, while the total carbon number greater than 30 is also undesirable because development residues develop in some cases.

Examples of compounds represented by formula (TA-4) are illustrated below, but they should not be construed as being limited to the following. These compounds may be used alone or as combinations of two or more thereof.

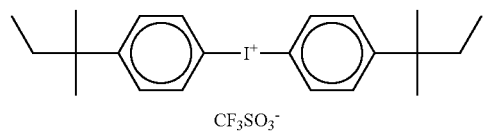

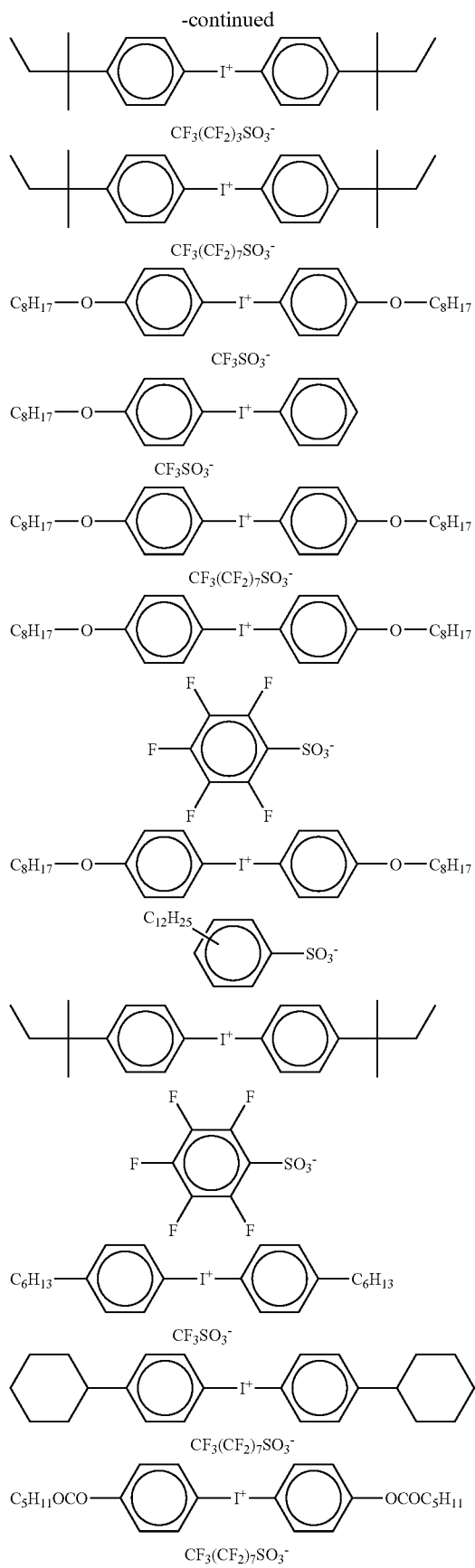

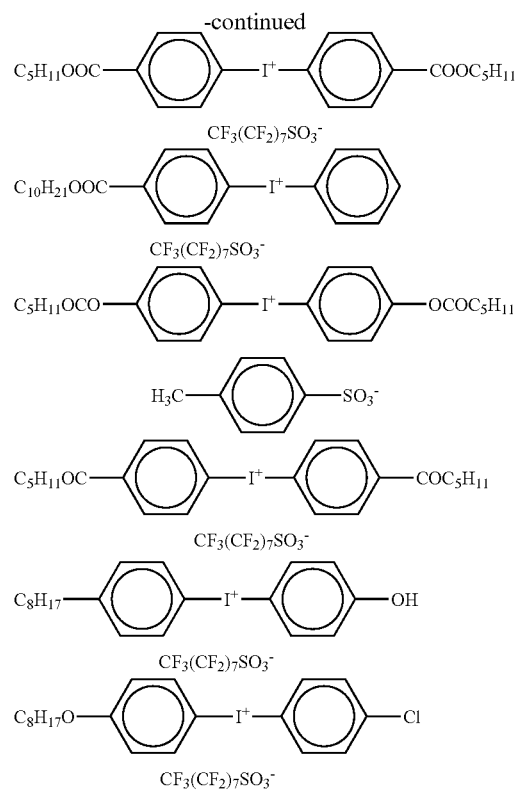

Examples of an imide sulfonate compound suitable as a thermo-acid generator include compounds represented by the following formula (TA-5).

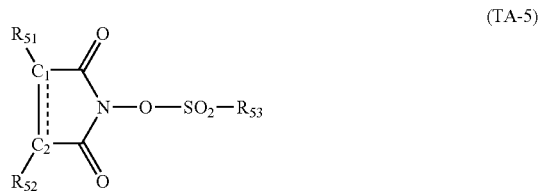

In formula (TA-5), $C_1$ (carbon atom) and $C_2$ (carbon atom) are combined by a single bond or a double bond, and $R_{51}$ and $R_{52}$, which may be the same or different, fit into any of the following cases (1) to (4);

(1) $R_{51}$ and $R_{52}$ independently represent a hydrogen atom, an alkyl group, a cycloalkyl group or an aryl group.

(2) $R_{51}$ and $R_{52}$ team up with $C_1$ and $C_2$ to form a monocyclic or polycyclic ring which may contain one or more than one hetero atom.

(3) $R_{51}$ and $R_{52}$ combine with each other to form a condensed aromatic ring containing $C_1$ and $C_2$.

(4) $R_{51}$ and $R_{52}$ represent N-sulfonyloxyimide-containing residues.

$R_{53}$ represents an alkyl group, a halogenated alkyl group, a cycloalkyl group, an alkenyl group, an aryl group which may have a substituent, an aralkyl group which may have a substituent, or a camphor residue.

When $R_{51}$ and $R_{52}$ in formula (TA-5) fit into the case (1), examples of the alkyl group include alkyl groups containing 1 to 4 carbon atoms, such as a methyl group, an ethyl group, a propyl group, an isopropyl group, an n-butyl group, a sec-butyl group and a tertbutyl group. Examples of the cycloalkyl group include cycloalkyl groups containing 3 to 8 carbon atoms, such as a cyclopropyl group, a cyclopentyl group, a cyclohexyl group and a cyclooctyl group. Examples of the aryl group include aryl groups containing 6 to 14 carbon atoms, such as a phenyl group, a tolyl group, a xylyl group, a mesityl group and a naphthyl group. When $R_{51}$ and $R_{52}$ fit into the case (2), they may form any of the following partial structures.

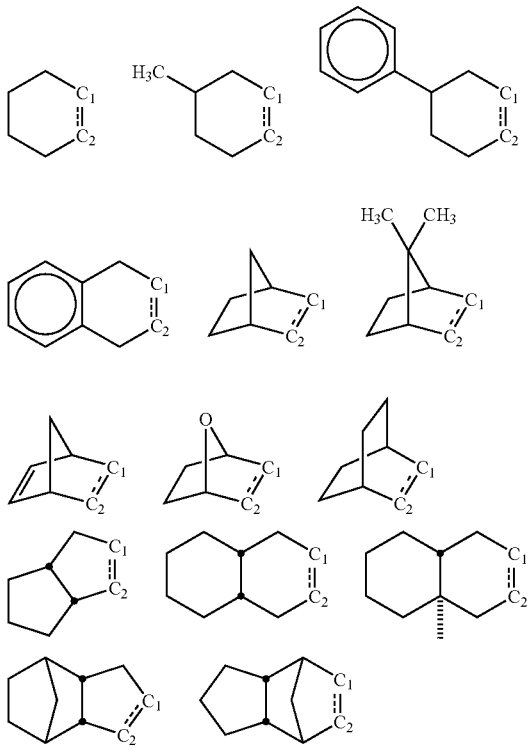

When $R_{51}$ and $R_{52}$ fit into the case (3), they may form any of the following partial structures.

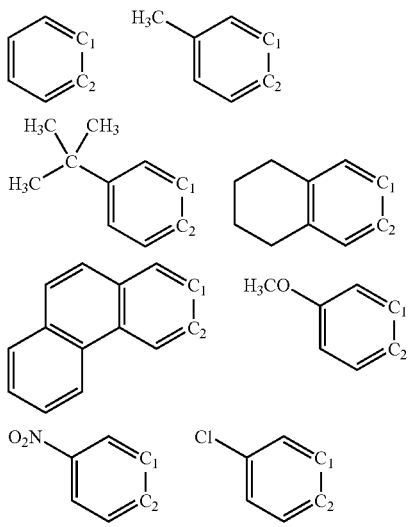

-continued

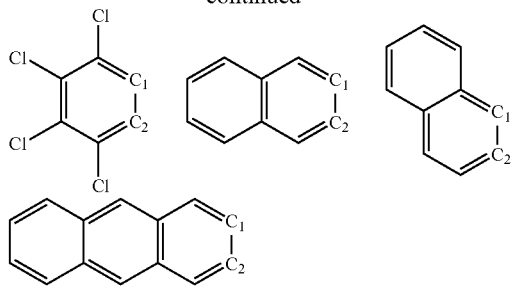

When $R_{51}$ and $R_{52}$ fit into the case (4) at least two N-sulfonyloxyimide residues may be combined in the $R_{51}$ and $R_{52}$ moieties via single bonds or the divalent organic groups as recited below. The linkage groups recited below are used alone or as combinations of two or more thereof.

[Divalent organic group]: —O—, —S—, —SO—, —SO$_2$—, —NH—, —CO—, —CO$_2$—, —NHSO$_2$—, —NHCO—, —NHCO$_2$— or

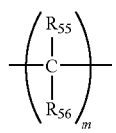

($R_{54}$ and $R_{55}$ independently represent a hydrogen atom or a methyl group.)

Examples of the alkyl group of $R_{53}$ include straight-chain or branched alkyl groups containing 1 to 20 carbon atoms, preferably straight-chain or branched alkyl groups containing 1 to 16 carbon atoms, far preferably alkyl groups containing 1 to 12 carbon atoms. When the alkyl group contains 21 or more carbon atoms, undesirable reduction in sensitivity and resolution occurs. Examples of the halogenated alkyl group of $R_{53}$ include the above-recited alkyl groups each having a halogen atom substituted for at least one hydrogen. Examples of the halogen atom substituted include a fluorine atom, a chlorine atom, a bromine atom and an iodine atom. Of the halogen atoms, fluorine, chlorine and bromine atoms are preferable, and a fluorine atom is especially preferred. In addition, hydrogen atoms in each alkyl group may be substituted by different kinds of halogen atoms. Examples of the cycloalkyl group of $R_{53}$ include cycloalkyl groups containing 3 to 12 carbon atoms, such as a cyclopropyl group, a cyclopentyl group, a cyclohexyl group and a cyclooctyl group, and a polycyclic substituent groups, such as a norbornyl group, an adamantyl group and a tricyclodecanyl group. Examples of the alkenyl group of $R_{53}$ include straight-chain or branched alkenyl groups containing 2 to 20 carbon atoms, preferably straight-chain or branched alkenyl group containing 2 to 16 carbon atoms, far preferably alkenyl groups containing 2 to 12 carbon atoms. Cases where the alkenyl group contains 21 or more carbon atoms are undesirable because sensitivity and resolution reductions occur.

The aryl group of $R_{53}$ may be a phenyl group or a naphthyl group, and the aralkyl group of $R_{53}$ may be a benzyl group. Examples of substituents the aryl group and the aralkyl group can have include lower alkyl groups, such as a methyl group, an ethyl group, a propyl group, an isopropyl group and a tert-butyl group; cycloalkyl groups, such as a cyclopentyl group and a cyclohexyl group; aryl groups, such as a phenyl group, a tolyl group, a xylyl group and a mesityl group; lower alkoxy groups, such as a methoxy group, an ethoxy group, a propoxy group, an isopropoxy group, a sec-butoxy group and a tert-butoxy group; alkenyl groups, such as a vinyl group, an allyl group, a propenyl group and a butenyl group; acyl groups, such as a formyl group and an acetyl group; a hydroxyl group, a carboxyl group, a cyano group, a nitro group, and halogen atoms such as fluorine, chlorine, bromine and iodine atoms. The preferred among those recited above include lower alkyl groups, such as a methyl group, an ethyl group, a propyl group, an isopropyl group and a tert-butyl group, a cyclohexyl group, a phenyl group, a toluoyl group, lower alkoxy groups, such as a methoxy group, an ethoxy group, a propoxy group, an isopropoxy group, a sec-butoxy group and a tert-butoxy group, a cyano group, a nitro group, and halogen atoms, such as a fluorine atom, a chlorine atom, a bromine atom and an iodine atom. Additionally, two or more kinds of substituents may be present on each of the aryl group and the aralkyl group.

Examples of the imide sulfonate compounds described above are illustrated below, but those compounds should not be construed as being limited to the following.

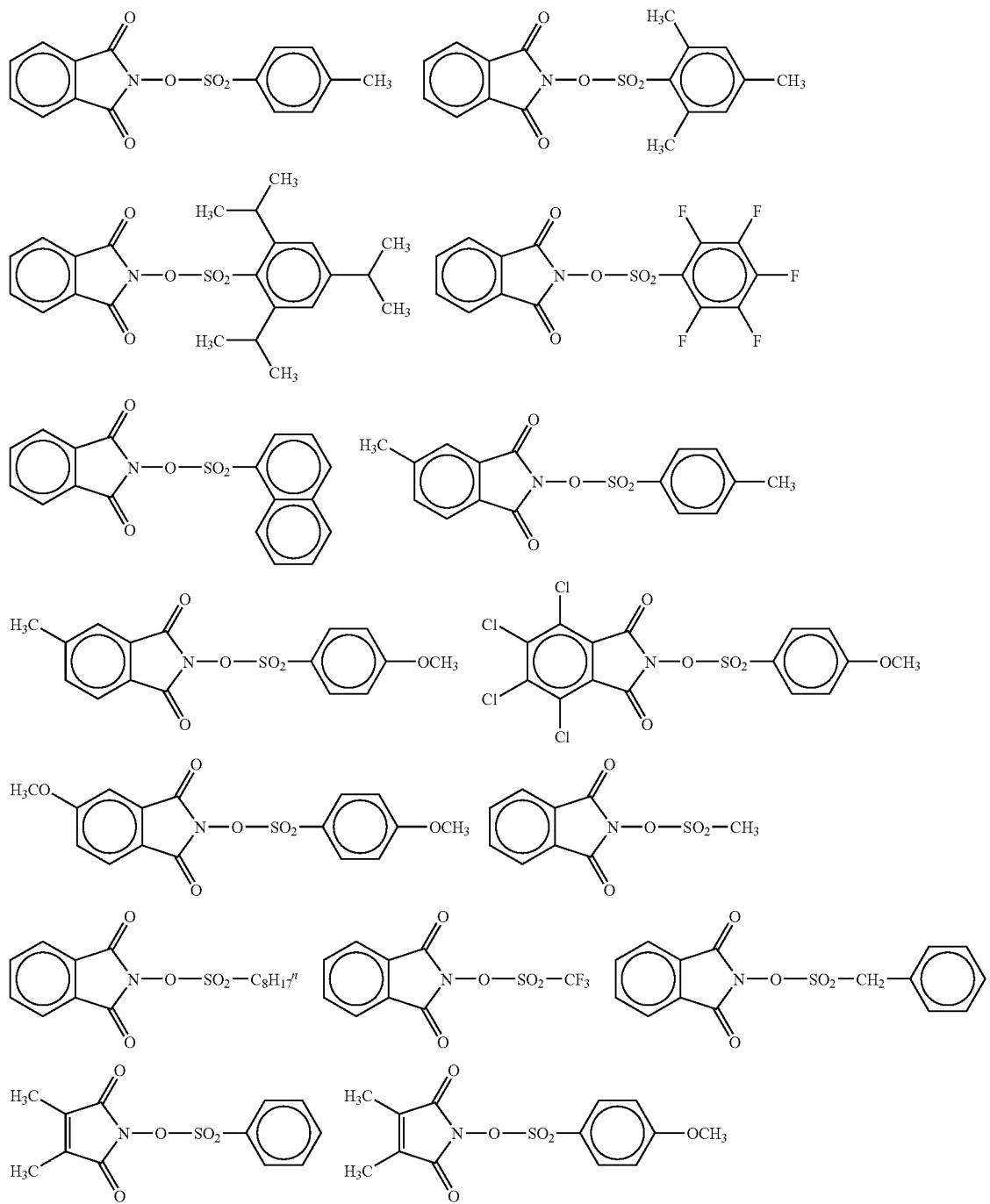

-continued
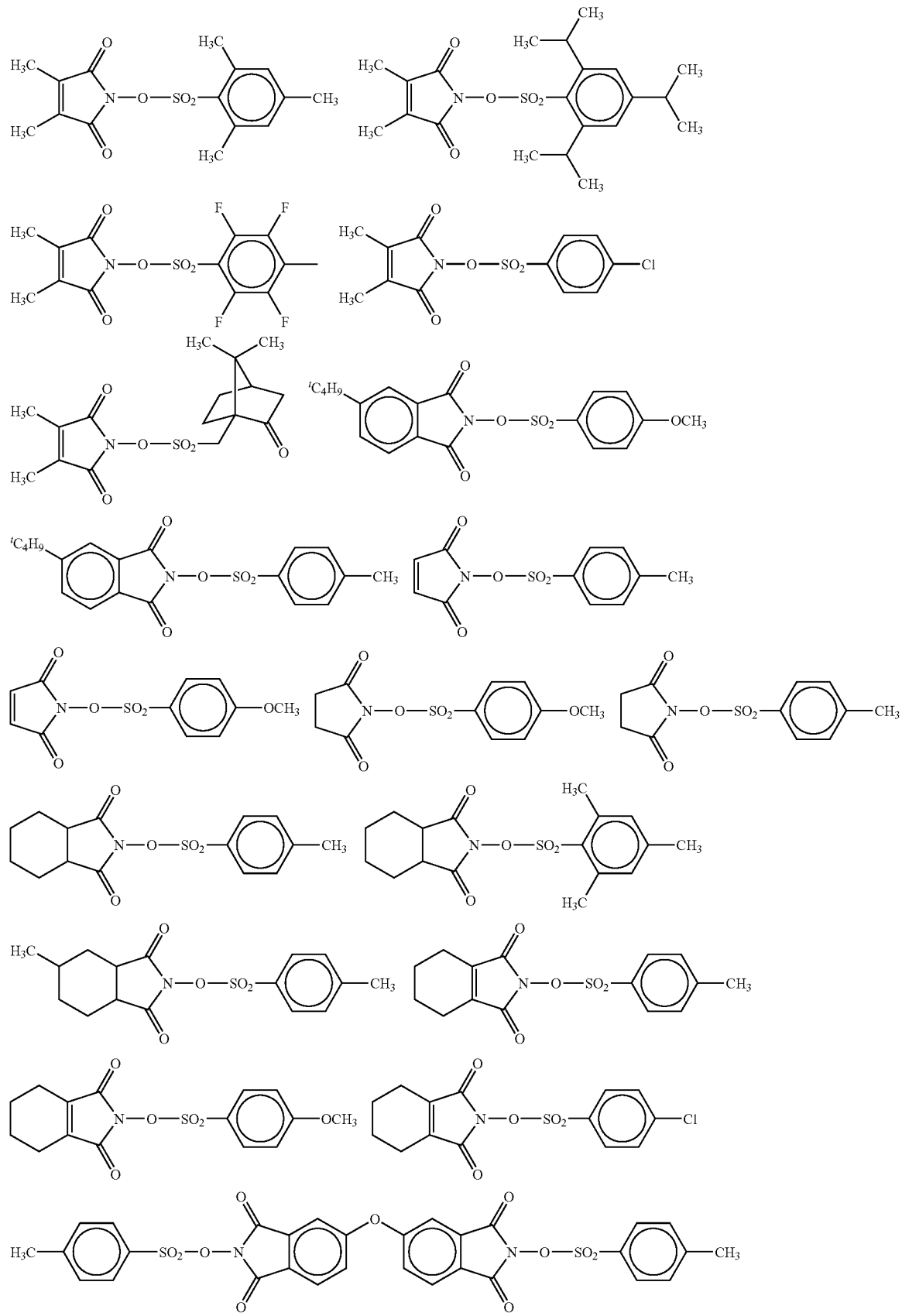

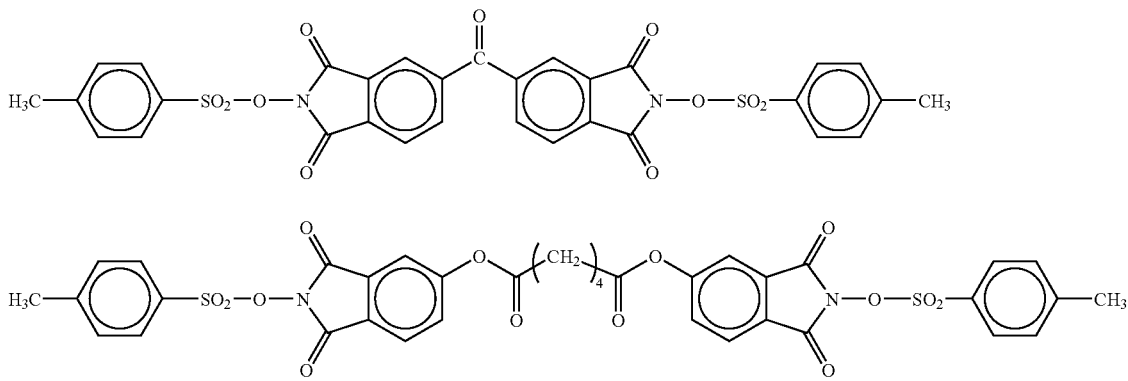

Examples of an oxime sulfonate compound suitable as a thermo-acid generator include compounds represented by the following formula (TA-6).

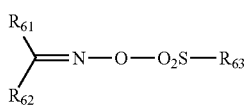

(TA-6)

In formula (TA-6), $R_{61}$ and $R_{62}$ independently represent an alkyl group which contains 1 to 16 carbon atoms and may have a substituent, an alkenyl group, an alkynyl groups a cycloalkyl group, a cycloalkenyl group, an aryl group which may have a substituent, a heteroaryl group, or a cyano group. Alternatively, $R_{61}$ and $R_{62}$ each may combine with $R_{61}$ or $R_{62}$ of another compound represented by formula (TA-6) via a linkage chain containing any of an alkylene chain which contains 2 to 8 carbon atoms and may have a substituent, an alkenylene chain, an alkynylene chain, phenylene which may have a substituent, furylene, thienylene, —O—, —S—, —N— and —CO—. In other words, the compounds represented by formula (TA-6) include compounds each having two or three oxime sulfonate structures via linkage chains.

$R_{63}$ represents an alkyl group which contains 1 to 16 carbon atoms and may have a substituent, a cycloalkyl group, or an aryl group which may have a substituent.

Examples of an alkyl group containing 1 to 16 carbon atoms which is represented by each of $R_{61}$, $R_{62}$ and $R_{63}$ include unsubstituted alkyl groups, such as a methyl group, an ethyl group, a propyl group, an i-propyl group, a butyl group, an i-butyl group, a t-butyl group, a t-amyl group, an n-hexyl group, an n-octyl group, an i-octyl group, an n-decyl group, an undecyl group and a dodecyl group, a hexadecyl group, and substituted alkyl groups, such as a trifluoromethyl group, a perfluoropropyl group, a perfluorobutyl group, a perfluoro-t-butyl group, a perfluorooctyl group, a perfluoroundecyl group and a 1,1-bistrifluoromethylethyl group.

Examples of an alkenyl group as each of $R_{61}$ and $R_{62}$ include an allyl group, a methallyl group, a vinyl group, a methylallyl group, a 1-butenyl group, a 3-butenyl group, a 2-butenyl group, a 1,3-pentadienyl group, a 5-hexenyl group, a 2-oxo-3-pentenyl group, a decapentenyl group and a 7-octenyl group.

Examples of an alkynyl group as each of $R_{61}$ and $R_{62}$ include ethynyl group, a propargyl group, a 2-butynyl group, a 4-hexynyl group, a 2-octynyl group, a phenylethynyl group and a cyclohexylethynyl group.

Examples of a cycloalkyl group as each of $R_{61}$, $R_{62}$ and $R_{63}$ include cycloalkyl groups containing 3 to 8 carbon atoms, such as a cyclopropyl group, a cyclopentyl group and a cyclohexyl group, which each may have a substituent.

Examples of a cycloalkenyl group as each of $R_{61}$ and $R_{62}$ include a cyclobutenyl group, a cyclohexenyl group, a cyclopentadienyl group and a bicyclo[4.2.4]dodeca-3,7-dien-5-yl group.

Examples of an aryl group as each of $R_{61}$, $R_{62}$ and $R_{63}$ include aryl groups which each contain 6 to 14 carbon atoms and may have a substituent, such as a phenyl group, a tolyl group, a methoxyphenyl group and a naphthyl group.

Examples of substituents the foregoing groups may have include an alkyl group, a cycloalkyl group, an alkoxy group, a halogen atom (fluorine, chlorine or iodine atom), a cyano group, a hydroxyl group, a carboxyl group, a nitro group, an aryloxy group, an alkylthio group, an aralkyl group and a group represented by the following formula (1A).

Herein, the alkyl group and the cycloalkyl group have the same meanings as those described above, respectively. Examples of the alkoxy group include alkoxy groups containing 1 to 4 carbon atoms, such as a methoxy group, an ethoxy group, a hydroxyethoxy group, a propoxy group, an n-butoxy group, an isobutoxy group, a sec-butoxy group and t-butoxy group. Examples of the aralkyl group include a benzyl group, a naphthylmethyl group, a furyl group and a thienyl group.

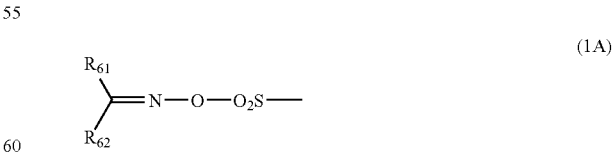

(1A)

In the above formula, $R_{61}$ and $R_{62}$ have the same meanings as $R_{61}$ and $R_{62}$ in formula (TA-6), respectively.

Examples of compounds represented by formula (TA-6) are illustrated below, but these examples should not be construed as limiting the scope of the invention.

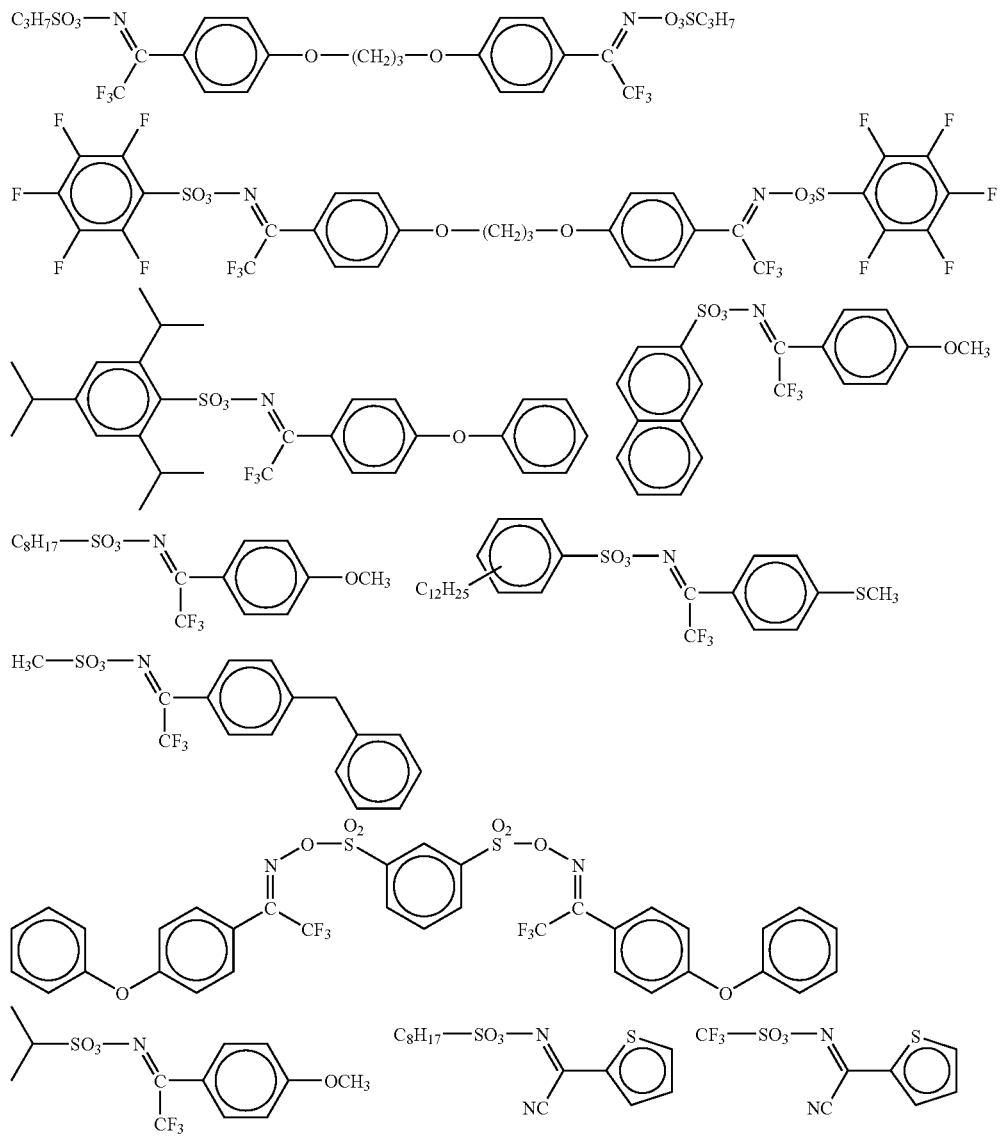

Examples of acid generators of oxime sulfonate type which are preferably usable as thermo-acid generators include compounds which each contain at least one group represented by the following formula (TA-7).

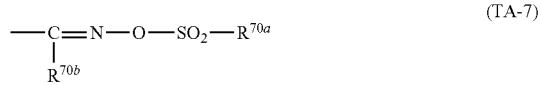

In formula (TA-7), $R^{70a}$ and $R^{70b}$ independently represent an organic group.

The organic group represented by $R^{70a}$ and $R^{70b}$ each is a group containing a carbon atom at least, in which other atoms (such as hydrogen, oxygen, nitrogen, sulfur or/and halogen (e.g., fluorine, chlorine) atoms) may further be contained.

As the organic group Of $R^{70a}$, a straight-chain or branched alkyl group or an aryl group is suitable. This alkyl or aryl group may have a substituent. The substituent has no particular restriction, so it may be, e.g., a fluorine atom, a straight-chain alkyl group containing 1 to 6 carbon atoms, or a branched or cyclic alkyl group. The expression "may have a substituent" used herein is intended to include cases where part or all of hydrogen atoms in the alkyl or aryl group are replaced by substituents.

The suitable number of carbon atoms in the alkyl group is from 1 to 20, preferably from 1 to 10 carbon atoms, far preferably from 1 to 8, further preferably from 1 to 6, especially preferably from 1 to 4. As the alkyl group, a partially or totally halogenated alkyl group (hereafter referred to as a halogenated alkyl group too) is especially suitable. Additionally, the term "a partially halogenated alkyl group" means an alkyl group whose hydrogen atoms are in part replaced by halogen atoms, and the term "a totally halogenated alkyl group" means an alkyl group whose hydrogen atoms are all replaced by halogen atoms. These halogen atoms may be any of fluorine, chlorine, bromine and iodine atoms, but fluorine atoms are especially preferable. In other words, the halogenated alkyl group is preferably a fluorinated alkyl group.

The suitable number of carbon atoms in the aryl group is from 4 to 20, preferably from 4 to 10, especially preferably from 6 to 10. As the aryl group, a partially or totally halogenated aryl group is especially suitable. Additionally, the term "a partially halogenated aryl group" means an aryl group whose hydrogen atoms are in part replaced by halogen atoms, and the term "a totally halogenated aryl group" means an aryl group whose hydrogen atoms are all replaced by halogen atoms.

The organic group especially suitable as $R^{70a}$ is an alkyl group which contains 1 to 4 carbon atoms and has no substituent, or a fluorinated alkyl group containing 1 to 4 carbon atoms.

The organic group of $R^{70b}$ is preferably a straight-chain, branched or cyclic alkyl group, an aryl group or a cyano group. Examples of the alkyl group as $R^{70b}$ and examples of the aryl group as $R^{70b}$ include those given above as examples of the alkyl group as $R^{70a}$ and examples of the aryl group of $R^{70a}$ respectively.

The organic group especially suitable as $R^{70b}$ is a cyano group, an alkyl group containing 1 to 8 carbon atoms and having no substituent, or a fluorinated alkyl group containing 1 to 8 carbon atoms.

As the acid generators of oxime sulfonate type, compounds represented by the following formula (TA-7a) or (TA-7b) can be used to advantage (because of their high efficiency of acid generation upon irradiation with electron beams).

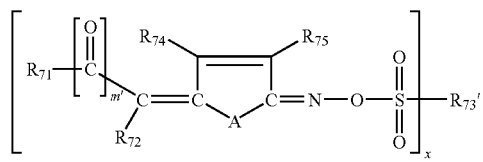

(TA-7a)

In formula (TA-7a), m' is 0 or 1; X is 1 or 2; $R_{71}$ represents a phenyl group which may substituted by one or more $C_1$-$C_{12}$ alkyl groups, or a heteroaryl group, or when m' is 0, it may further represents a $C_2$-$C_6$ alkoxycarbonyl group, a phenoxycarbonyl group or a cyano (CN) group; $R_{72}$ has the same meaning as $R_{71}$; $R_{73}$' represents a $C_1$-$C_{18}$ alkyl group when X is 1, and it represents a $C_2$-$C_{12}$ alkylene group or a phenylene group when X is 2; $R_{74}$ and $R_{75}$ independently represent a hydrogen atom, a halogen atom or a $C_1$-$C_6$ alkyl group; and A represents —S—, —O— or —N($R_{76}$)—. $R_{76}$ represents an alkyl group, an aryl group, or an aralkyl group.

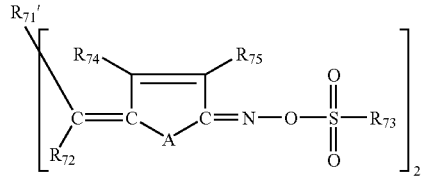

(TA-7b)

In formula (TA-7b), $R_{71}$' represents a $C_2$-$C_{12}$ alkylene group; $R_{72}$, $R_{74}$, $R_{75}$ and A have the same meanings as in formula (TA-7a), respectively; and $R_{73}$ represents a $C_1$-$C_{18}$ is alkyl group.

Of the above compounds, the thiolene-containing oxime sulfonate illustrated below is especially preferable.

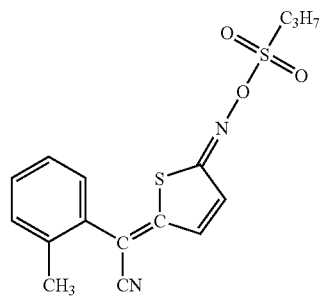

Nitrobenzyl sulfonates suitable as thermo-acid generators can include compounds represented by the following formula (TA-9).

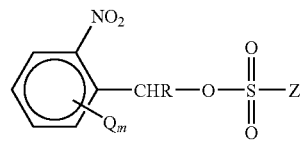

(TA-9)

In the above formula, Z represents a group selected from an alkyl group, an aryl group, an alkylaryl group, a halogenated alkyl group, a halogenated aryl group, a halogenated alkylaryl group, a nitrated aryl group, a nitrated alkylaryl group, an aryl group having nitro and halogen substituents, an alkylaryl group having nitro and halogen substituents, or a group having a moiety $C_6H_4SO_3CHR'C_6H_{4-m}Q_m(NO)_2$; R' is chosen from a hydrogen atom, a methyl group or a nitrated aryl group; each Q is chosen from a hydrocarbon group, a hydrocarbonoxy group, $NO_2$, a halogen atom or an organosilyl group, provided that Q is not an acidic group; and m is 0, 1 or 2.

Examples of compounds represented by formula (TA-9) are illustrated below.

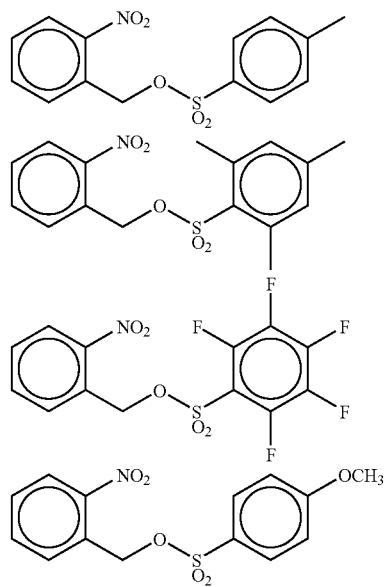

In addition, sulfonic acid esters represented by the following formula (TA-10), though they generate no acids upon exposure to light, can also be used suitably as thermo-acid generators.

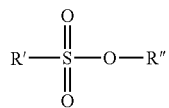
(TA-10)

In the above formula, R' and R" independently represent a straight-chain, branched or cyclic alkyl group which contains from 1 to 10 carbon atoms and may have a substituent, or an aryl group which contains from 6 to 20 carbon atoms and may have a substituent, Examples of such substituents include a hydroxyl group, a halogen atom, a cyano group, a vinyl group, an acetylene group, and a straight-chain or cyclic alkyl group containing from 1 to 10 carbon atoms.

Suitable examples of the sulfonic acid esters are illustrated below.

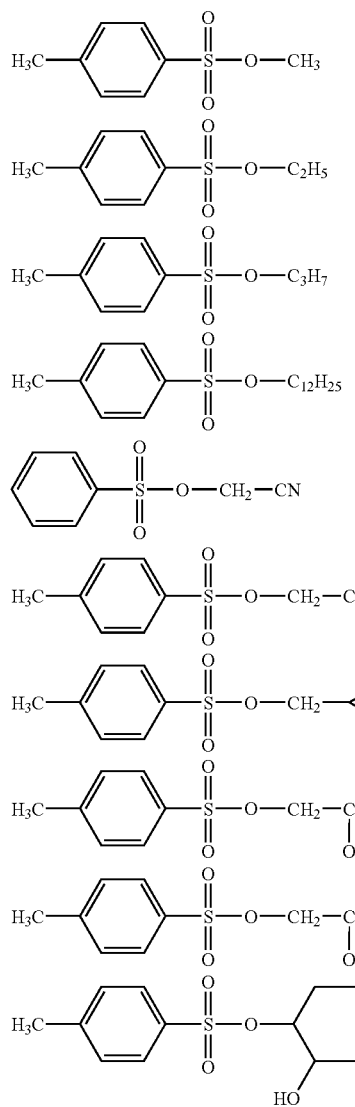

-continued

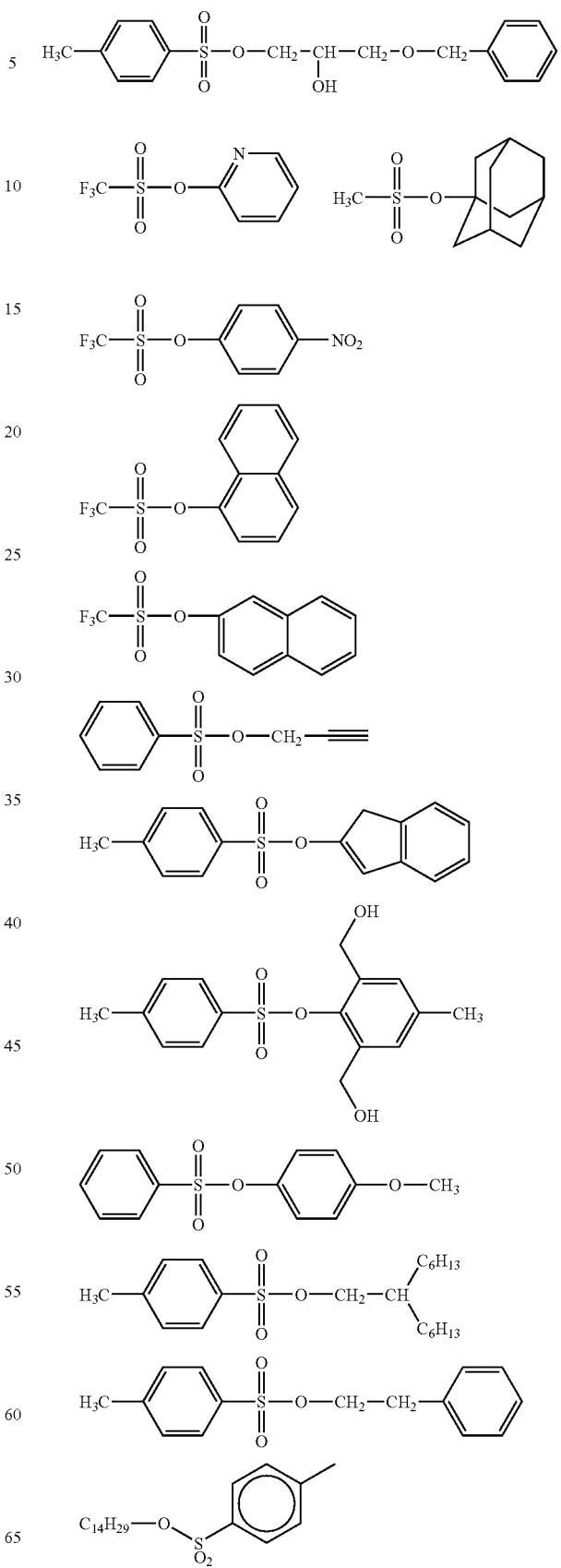

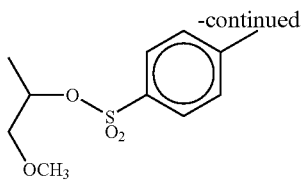

The amount of thermo-acid generators added is preferably from 2 to 20 parts by mass, particularly preferably from 3 to 15 parts by mass, per 100 parts by mass of the total resin.

(d) Compound Having at least One of Alkoxymethyl and Acyloxymethyl Groups

In the present composition, a compound having at least one of alkoxymethyl and acyloxymethyl groups is incorporated.

The present Inventors have found that, even in a low-temperature cure process, cured film having sufficient heat resistance can be produced by combining a thermo-acid generator with a compound having at least one of alkoxymethyl and acyloxymethyl groups. Additionally, the use of such a compound allows prevention of fusion and thermal shrinkage of patterns at the time of curing.

From a structural point of view, typical examples of the compound having at least one of alkoxymethyl and acyloxymethyl groups as a component of the present composition include aromatic compounds having alkoxymethyl or acyloxymethyl groups directly on their aromatic rings, urea compounds having alkoxymethyl or acyloxymethyl groups on nitrogen atoms of the urea structures as shown below, and triazine compounds having alkoxymethyl or acyloxymethyl groups substituted for hydrogen atoms on triazine rings.

The number of carbon atoms in an alkoxymethyl or acyloxymethyl group such compounds each has is preferably from 2 to 5, far preferably 2 or 3, particularly preferably 2.

The total number of alkoxymethyl and acyloxymethyl groups the compound concerned has is preferably from 1 to 10, far preferably from 2 to 8, particularly preferably from 3 to 6.

The molecular weight of the compound concerned is preferably 1,500 or below, far preferably from 180 to 1,200.

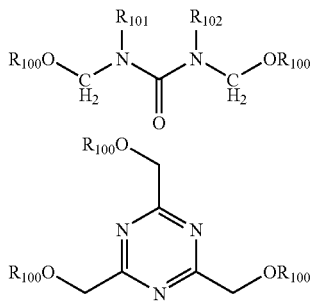

In the above formulae, $R_{100}$ represents an alkyl group or an acyl group. $R_{101}$ and $R_{102}$ independently represent a univalent organic group, and they may combine with each other to form a ring.

Examples of the aromatic compounds having alkoxymethyl or acyloxymethyl groups substituted for hydrogen atoms of their aromatic rings can include the following.

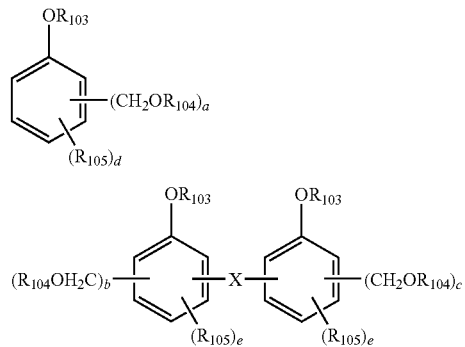

In the above formulae, X represents a single bond or a divalent organic group, each of $R_{104}$s represents an alkyl group or an acyl group independently, $R_{103}$ represents a hydrogen atom, an alkyl group, an alkenyl group, an aryl group, an aralkyl group, or a group capable of decomposing by the action of an acid to produce an alkali-soluble group (such as a group capable of leaving the compound under action of an acid, or a group represented by —C(R$^4$)$_2$COOR$^5$ (wherein R$^5$ represents a radical capable of leaving the group under action of an acid)).

Each of $R_{105}$s represents an alkyl group or an alkenyl group independently, and a, b and c independently represent 1, 2 or 3, d is from 0 to 4, and each e is from 0 to 3.

The group capable of decomposing by the action of an acid to produce an alkali-soluble group, the group capable of leaving the compound under action of an acid, and the group represented by —C(R$^4$)$_2$COOR$^5$ are the same as those which $R^0$ can represent in formula (1).

Examples of compounds having alkoxymethyl groups include the compounds of structural formulae illustrated below. And examples of compounds having acyloxymethyl groups include the compounds of structural formulae corresponding to replacement of alkoxymethyl groups by acyloxymethyl groups in the following structural formulae. However, the following compounds recited as examples of the compounds having alkoxymethyl groups or acyloxymethyl groups in their respective molecules should not be construed as limiting the scope of the invention,

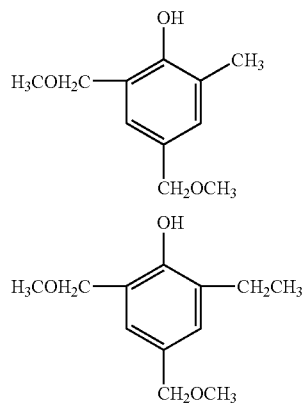

-continued
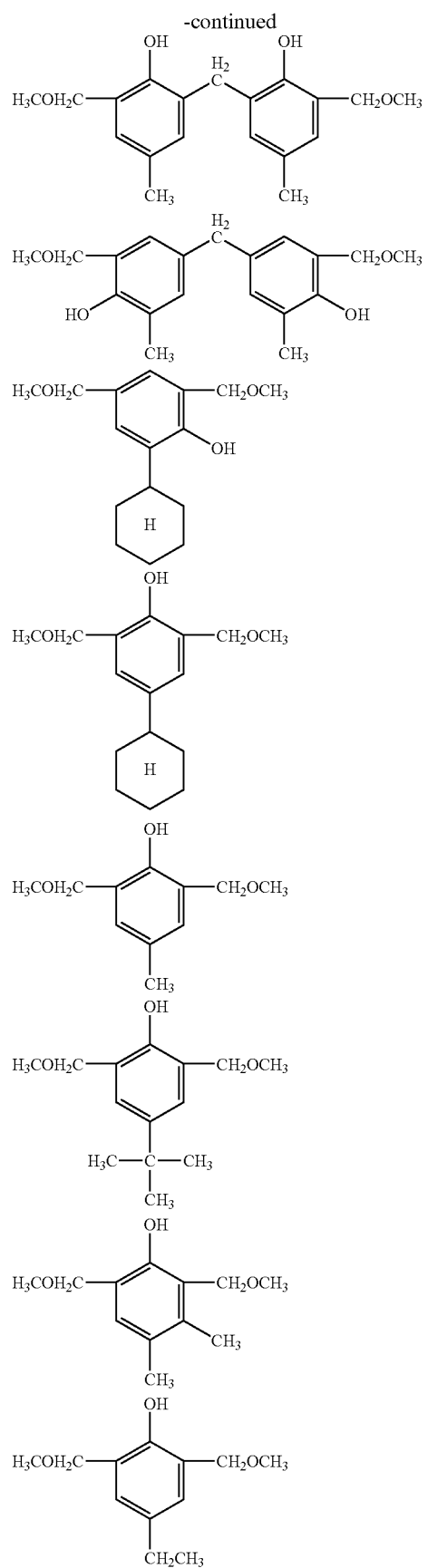
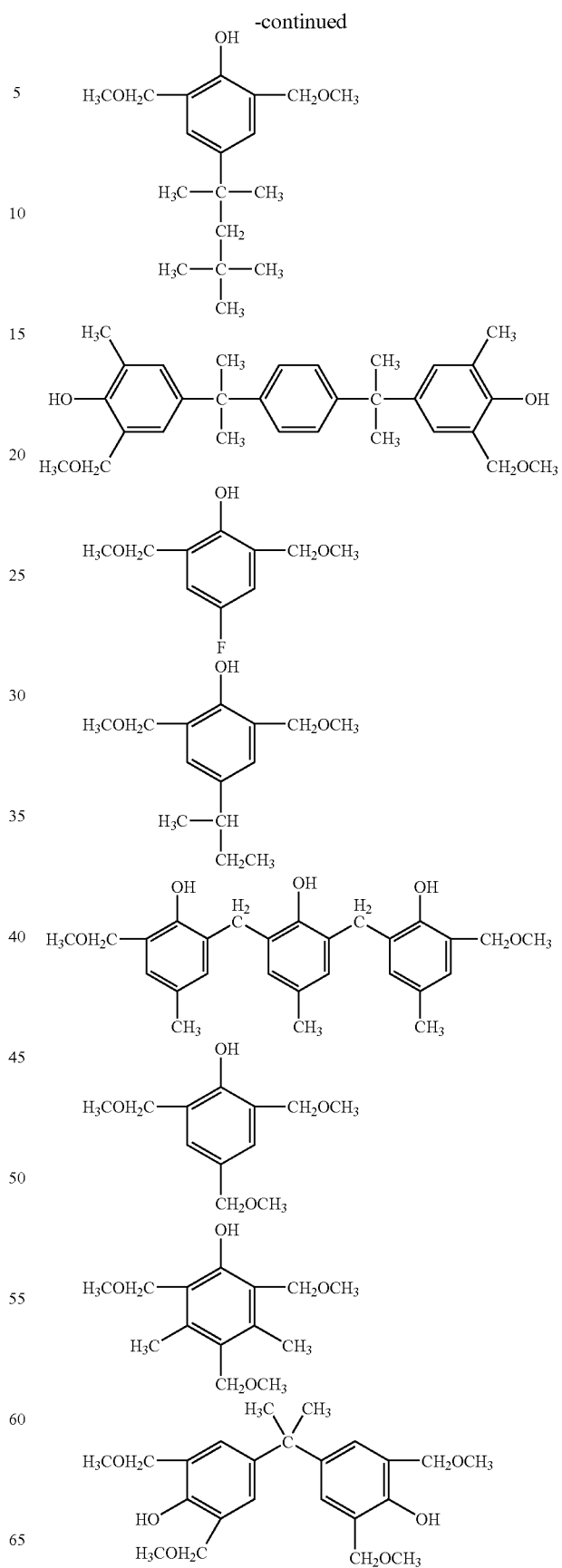

-continued
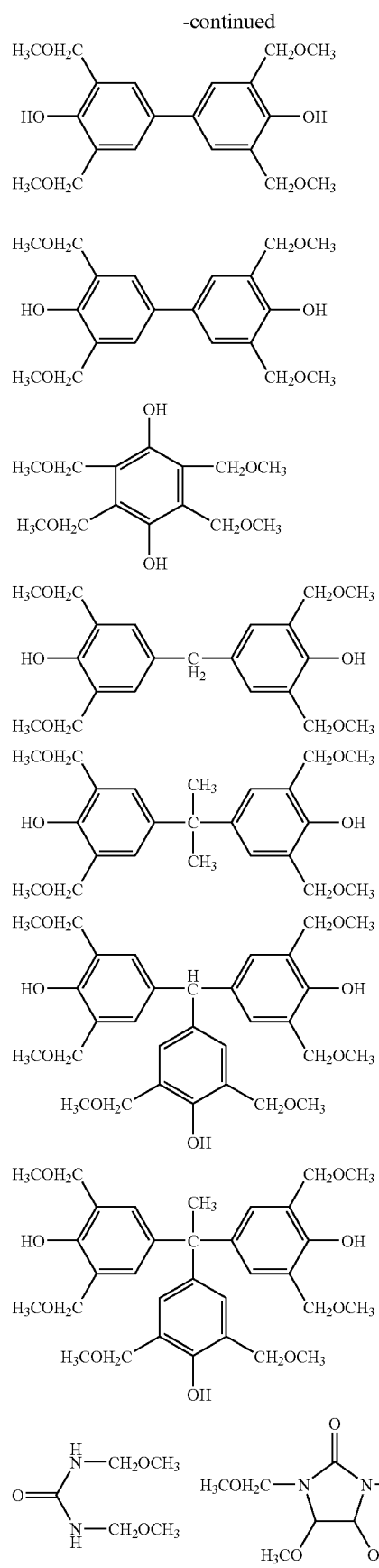
-continued
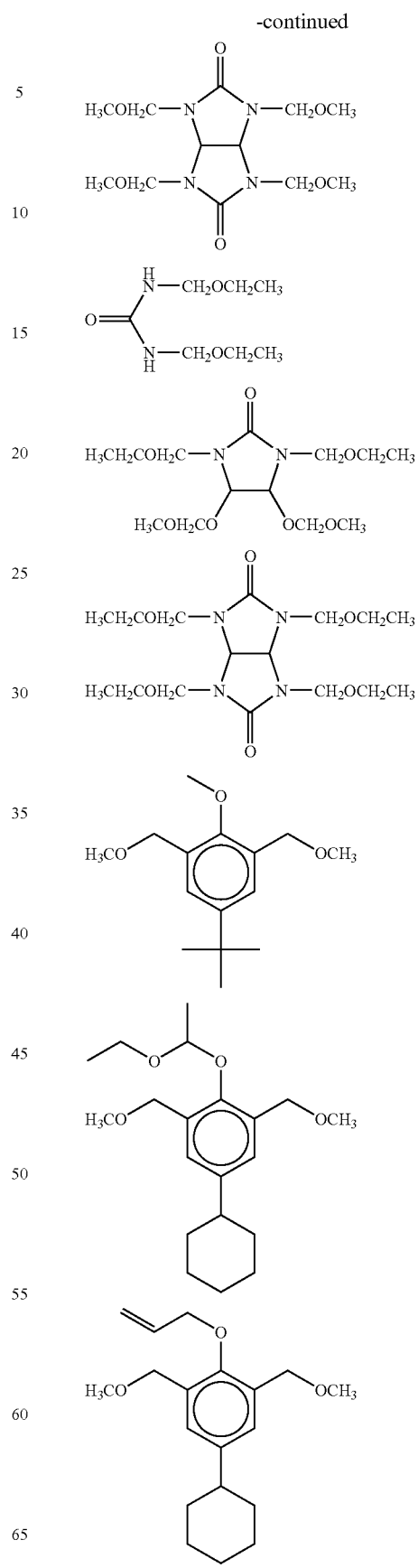

-continued

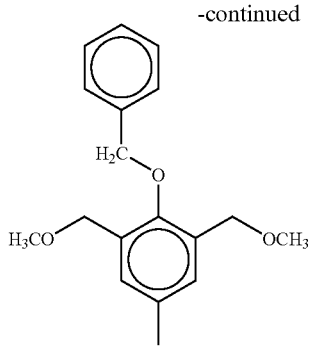

For incorporation of a compound having at least one of alkoxymethyl and acyloxymethyl groups into the present composition, commercially available products may be utilized, or the compound may be synthesized according to any of known methods.

In point of heat resistance, the compounds having alkoxymethyl groups or acyloxymethyl groups substituted directly for hydrogen atoms on aromatic rings or triazine rings can be used to advantage.

The amount of these compounds added is preferably from 1 to 20 parts by mass, far preferably from 3 to 15 parts by mass, per 100 parts by mass of the total resin.

(d') Compound Having Methacryloyl Group or Acryloyl Group

The present composition may further contain a compound having a methacryloyl group or an acryloyl group.

The compound having a methacryloyl group or an acryloyl group refers to the compound chosen from methacrylates or acrylates, respectively. Such a compound is insoluble in alkaline developers, and it has a function of controlling alkali solubility of the composition and inhibiting the thinning of film in unexposed portions. So, it aids in forming good-quality images. In addition, such a compound can improve film properties through partial increase in molecular weight of components of the composition. This increase is thought to be caused by reaction of the acryl or methacryl group with compounds in the composition at the curing stage, though a concrete mechanism of such reaction is not grasped yet. In terms of improvement in film properties, it is advantageous for the compound to have two or more acryloyl or methacryloyl groups, preferably to be made tetrafunctional or higher, and thereby to serve a function as a crosslinking compound.

In terms of transmittance of exposure light and stiffness of cured film, it is preferable that the acryloyl- or methacryloyl-containing skeleton of such a compound is a skeleton including a ring structure, such as an aromatic or alicyclic ring structure, preferably an alicyclic ring structure.

Moreover, the length (n) of an ethylene oxide (OE) or propylene oxide (PO) chain in the skeleton is preferably n=1 to 5, because the film stiffness is lost when the chain is long.

Suitable examples of such compounds include NK ester series from SHIN-NAKAMURA CHEMICAL CO., LTD., namely monofunctional acrylates and methacrylates, such as AMP-10G, AMP-20GY, AM30G; AM90G, AM230G, ACB-3, A-BH, A-IB, A-SA, A-OC-18E, 720A, S-1800A, ISA, AM-130G; LA, M-20G, M-90G, M230G, PHE-1G, SA, CB-1, CR-3, CR-23, TOPOLENE-M, S-1800M, IB, 0OC-18E and S; difunctional acrylates and methacrylates, such as A-200, A-400, A-600, A-1000, ABE-300, A-BPE-4, A-BPE-10, A-BPE-20, A-BPE-30, A-BPP-3, A-DOD, A-DCP, A-IBD-2E, A-NPG, 701-A, A-B1206PE, A-HD-N, A-NOD-N, APG-100, APG-200, APG-400, APG-700, IG, 2G, 3G, 4G, 9G, 14G, 23G, BG, BD, HD-N, NOD, IND, BPE-100, BPE-200, BPE-300, BPE-500, BPE-900, BPE-1300N, NPG, DCP, 1206PE, 701, 3PG and 9PG; trifunctional acrylates and methacrylates, such as A-9300, AT-30E, A-TMPT-3EO, A-TMPT-9EO, A-TMM-3, A-TMM-3L, A-TMM-3LM-N, TMPT and TMPT-9EO; and tetrafunctional acrylates and methacrylates, such as ATM-35E, ATM-4E, AD-TMP, AD-TMP-L, ATM-4P, A-TMMT and A-DPH.

Examples of the compounds used to particular advantage include the following polyfunctional monomers.

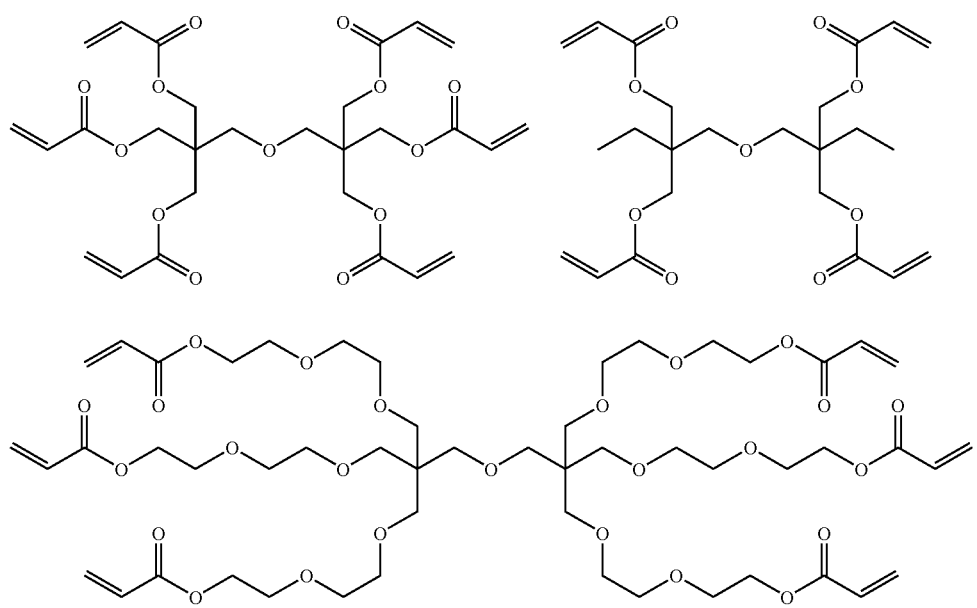

-continued

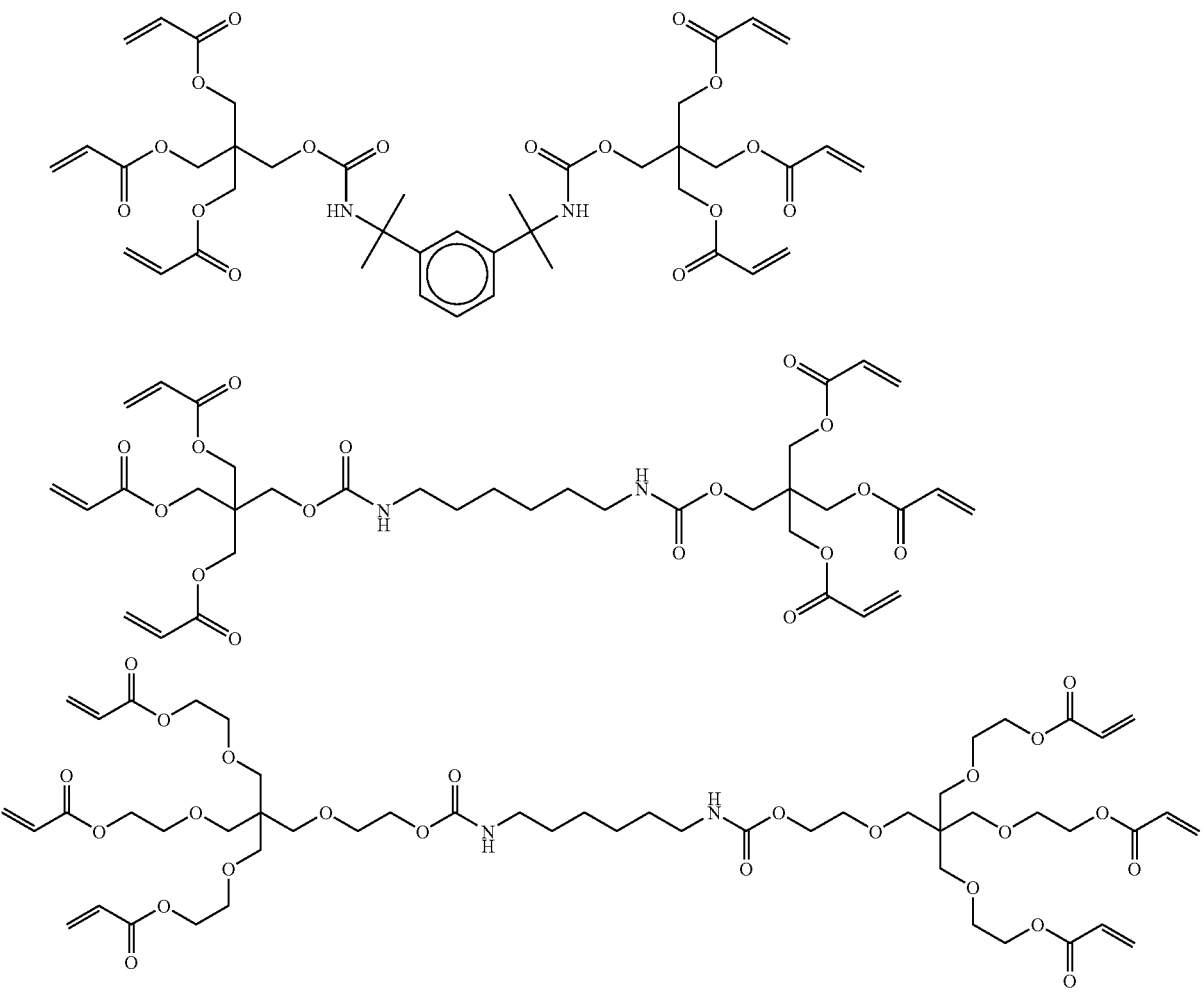

The addition amount of compounds having methacryloyl or acryloyl groups in their respective molecules is preferably from 0.5 to 30 parts by mass, far preferably from 1 to 20 parts by mass, particularly preferably from 2 to 15 parts by mass, per 100 parts by mass of the resin having repeating units represented by formula (1). By adjusting the addition amount to 0.5 parts by mass or above, effects of the invention can be enhanced; while a proper control of the addition amount allows prevention of degradation in heat resistance of cured film.

(e) Adhesion Promoter

To the present positive-working photosensitive resin composition, an adhesion promoter, such as an organosilicon compound, a silane coupling agent or a leveling agent, may further be added for promotion of adhesion, if such a need arises. Examples of such an adhesion promoter include γ-aminopropyltrimethoxysilane, γ-aminopropyltriethoxysilane, vinyltriethoxysilane, γ-glucidoxypropyltriethoxysilane, γ-methacryloxypropyltrimethoxysilane, ureidopropyltriethoxysilane, tris(acetylacetonato)aluminum and acetylacetatodiisopropylatoaluminum. When such an adhesion promoter is used, the amount thereof is preferably from 0.1 to 20 parts by mass, far preferably from 0.5 to 10 parts by mass, per 100 parts by mass of the total resin.

(f) Solvent

There is no particular restrictions on solvent for use in the invention so long as the present composition can be dissolved in the solvent, but solvents having boiling points of 100° C. or higher are preferred from the viewpoint of preventing separation of solids from the composition by evaporation of more solvent than is necessary during the coating operation.

Examples of solvents suitable for use in the invention include organic solvents, such as N-methylpyrrolidone NP), γ-butyrolactone (GBL), N,N-dimethylacetamide (DMAc), 1,3-dimethyl-2-imidazolidinone (DMI), N,N-dimethylformamide (DMF) and mixtures of two or more thereof, but these examples should not be construed as limiting suitable solvents in the invention. Of those solvents, preferred ones are γ-butyrolactone and N-methylpyrrolidone, especially γ-butyrolactone.

On the other hand, it is undesirable that solvents having boiling points not lower than the curing temperature constitute 60 mass % or more of the total solvent. This is because satisfactory film properties cannot be obtained when solvents remain in the film after curing. As mentioned above, low boiling points of solvents are also undesirable because there is a possibility that separation of solids from the composition occurs by evaporation during the coating. Therefore, it is advantageous to use a mixture of solvents having boiling points ranging from 100° C. to 160° C. with solvents having boiling points ranging from 160° C. to 300° C.

The mixing ratio (by mass) of solvents having boiling points in the 100° C.-to-160° C. range to solvents having boiling points in the 160° C.-to-300° C. range is preferably from 10:90 to 95:5, far preferably from 20:80 to 90:10.

Specifically, a mixed solvent including propylene glycol monoalkyl ether and γ-butyrolactone is preferable, and a mixed solvent in which the mixture of propylene glycol monoalkyl ether and γ-butyrolactone constitutes 70 mass % or more of the total solvent is preferable by far.

The propylene glycol monoalkyl ether/γ-butyrolactone ratio in a mixed solvent is preferably from 95/5 to 50/50 by mass.

Examples of the propylene glycol monoalkyl ether include propylene glycol monomethyl ether, propylene glycol monoethyl ether, propylene glycol monopropyl ether and propylene glycol monobutyl ether. Of these ethers, propylene glycol monomethyl ether is preferred over the others.

Further, the use of a mixed solvent including not only a mixture of propylene glycol monoalkyl ether and γ-butyrolactone but also a solvent having a dipole moment of 3.5 debye or above is preferred.

Examples of the solvent having a dipole moment of 3.5 debye or above include N-methyl-2-pyrrolidone, dimethyl sulfoxide, sulfolane, N,N-dimethylformamide, N,N-dimethylacetamide, ε-caprolactam, acetonitrile, acrylonitrile, benzonitrile, butanenitrile, crotonaldehyde, ethylene carbonate, formamide, isobutanenitrile, methacrylonitrile, N-methylacetamide, 4-methylbutanenitrile, N-methylformamide, pentanenitrile, pentylacetonitrile, propanenitrile, 2-pyrrolidinone and 1,3-dimethyl-2-imidazole. Of these solvents, N-methyl-2-pyrrolidone, dimethyl sulfoxide and sulfolane are preferred over the others. Additionally, the solvents having dipole moment of 3.5 debye or above may be used alone or as combinations of two or more thereof.

(7) Patterning Method

In a method of forming relief patterns by use of the present photosensitive resin composition, the present photosensitive resin composition is (a) coated on an appropriate substrate, and the thus coated substrate is subjected to (b) baking (pre-baking), (c) exposure to an actinic ray or radiation, (d) development with an aqueous developer, and then (e) curing. Thus, cured relief patterns can be formed.

In advance of development, the coated and exposed substrate can also be subjected to high-temperature baking. The developed substrate may also be rinsed before curing.

On a semiconductor element, as mentioned above, the present photosensitive composition is coated in such an amount that the coating thereof has a predetermined thickness (e.g., 0.1 to 30 μm) after heat curing, pre-baked, exposed, developed and then cured by heating, thereby producing a semiconductor device.

The method of forming relief patterns is described below in more detail.

The present photosensitive resin composition is coated on an appropriate substrate. The substrate is, e.g., a semiconducting material such as silicon wafer, a ceramic medium, glass, metal or plastic. Examples of a coating method usable herein include spray coating, spin coating, offset printing, roller coating, screen printing, extrusion coating, meniscus coating, curtain coating and dip coating, but the usable methods should not be construed as being limited to these examples.

In advance of exposure, the coating film is baked for a duration from several to thirty minutes at an elevated temperature of about 70° C. to about 120° C. according to a heating method adopted for the purpose of evaporating the solvent remaining. Subsequently thereto, the thus dried film is exposed to an actinic ray or radiation in desired patterns through a mask. As the actinic ray or radiation, X-rays, electron beams, ultraviolet rays or visible light can be used. Radiation having rays with wavelengths of 436 nm (g-ray) and 365 nm (i-ray) is most suitable.

Subsequently to exposure to an actinic ray or radiation, it is advantageous for the coated and exposed substrate to be heated up to a temperature of about 70° C. to about 120° C. The coated and exposed substrate is heated for a short time generally from several seconds to several minutes in the temperature range specified above. This stage in the present method is referred to as "post-exposure baking" in the art.

Then, the coating film is developed with an aqueous developer, and thereby relief patterns are formed. Examples of the aqueous developer include solutions of alkalis, such as inorganic alkalis (e.g., potassium hydroxide, sodium hydroxide, ammonia water), primary amines (e.g., ethylamine, n-propylamine), secondary amines (e.g., diethylamine, di-n-propylamine), tertiary amines (e.g., triethylamine), alcoholamines (e.g., triethanolamine), quaternary ammonium salts (e.g., tetramethylammonium hydroxide, tetraethylammonium hydroxide) and mixtures of the alkalis recited above. Of these aqueous developers, those containing tetramethylammonium hydroxide are most suitable. In addition, an appropriate amount of surfactant may be added to such developers. The development can be carried out according to dipping, spraying, puddling or other like methods.

Subsequently to the development, the relief patterns may be rinsed with deionized water in some cases. Then, in order to secure final patterns of highly heat-resistant polymer, the relief patterns undergo curing, and therein oxazole rings are formed. The curing is performed by baking the substrate at the glass transition temperature Tg of a polymer. In general the heat curing has so far been carried out at temperatures ranging from about 250° C. to about 400° C. On the other hand, by curing at temperatures ranging from 200° C. to 300° C., the present composition can deliver the film having physical properties equal to or better than the traditional compositions.

EXAMPLES

The invention will now be illustrated in the concrete by reference to the following examples, but these examples should not be construed as limiting the scope of the invention.

(Preparation of Resin for Use in the Invention)

Synthesis Example 1

Synthesis of Hydroxyl-Containing Acid Anhydride (a)

A hydroxyl-containing acid anhydride (a) having the structural formula illustrated below is synthesized in accordance with the method disclosed in JP-A-2006-178437.

(a)

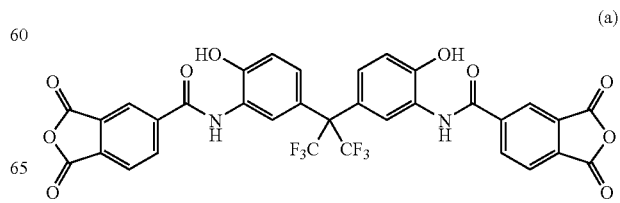

Synthesis Example 2

Synthesis of Hydroxyl-Containing Diamine Compound (b)

A hydroxyl-containing diamine compound (b) having the structural formula illustrated below is synthesized in accordance with the method disclosed in JP-A-2006-178437.

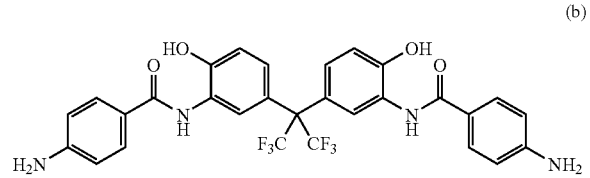

(b)

Synthesis Example 3

Synthesis of Hydroxyl-Containing Diamine Compound (c)

An intended hydroxyl-containing diamine (c) having the following structural formula is synthesized in accordance with the method disclosed in JP-A-2006-178437.

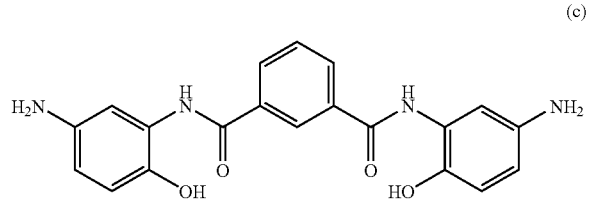

(c)

Synthesis Example 4

Synthesis of Hydroxyl-Containing Diamine Compound (d)

A hydroxyl-containing diamine (d) shown below is synthesized in accordance with the method disclosed in JP-A-2006-178437.

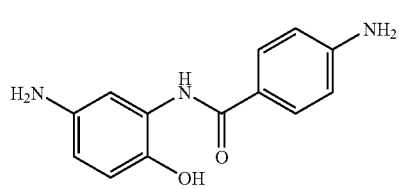

(d)

Synthesis Example 5

Synthesis of Polymer A

In a stream of dry nitrogen, 5.6 g (0.028 mole) of 4,4'-oxydianiline (a product of Aldrich Co.) and 1.24 g (0.005 mole) of 1,3-bis(3-aminopropyl)tetramethyldisiloxane are dissolved in 50 g of N-methyl-2-pyrrolidone (NMP). Thereto, 21.4 g (0.03 mole) of the hydroxyl-containing acid anhydride (a) is added, together with 14 g of NMP. In the resulting mixture, reaction is carried on for 1 hour at 20° C., and further for 4 hours at 50° C.

To the reaction solution thus obtained, 10.3 g (0.06 mole) of CKK-1 (a product of FUJIFILM Corporation) diluted with 5 g of NMP is added dropwise over 10 minutes. After the dropwise addition, the resulting solution is stirred for 3 hours at 50° C. The reaction solution obtained is introduced dropwise into 2 L of distilled water over a period of 1 hour. Fine solid particles thus deposited are filtered off, immersed again and washed in 2 L of a 1:1 mixture of distilled water and methanol, filtered off; and then dried. Thus, Polymer A is obtained.

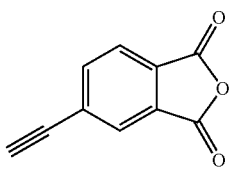

CKK-1

Synthesis Example 6

Synthesis of Polymer B

In a stream of dry nitrogen, 16.9 g (0.028 mole) of the hydroxyl-containing diamine compound (b) is dissolved in 50 g of N-methyl-2-pyrrolidone (NMP). Thereto, 17.5 g (0.025 mole) of the hydroxyl-containing acid anhydride (a) is added, together with 30 g of pyridine. In the resulting solution, reaction is carried on for 6 hours at 60° C. Further thereto, 1.2 g (0.01 mole) of allyl chloroformate (a product of Tokyo Chemical Industry Co., Ltd.) and 0.02 mole of pyridine are added, and stirred for 3 hours at room temperature.

At the conclusion of the reaction, the reaction solution is poured into 2 L of distilled water, and fine solid particles deposited are filtered off, immersed again and washed in 2 L of a 1:1 mixture of distilled water and methanol, and then filtered off. A polymeric solid thus obtained is dried to yield Polymer B.

Synthesis Example 7

Synthesis of Polymer C

In a stream of dry nitrogen, 18.1 g (0.048 mole) of the hydroxyl-containing diamine compound (c) and 1.24 g (0.005 mole) of 1,3-bis(3-aminopropyl)tetramethyldisiloxane are dissolved in 50 g of N-methyl-2-pyrrolidone (NMP). Thereto, 12.4 g (0.04 mole) of 3,3',4,4'-diphenylethertetracarboxylic acid anhydride (ODPA) is added, together with 21 g of NMP. In the resulting mixture, reaction is carried on for 1 hour at 20° C., and further for 2 hours at 50° C.

To the reaction solution, 16.4 g (0.1 mole) of norbornenedicarboxylic acid anhydride (a product of Aldrich Co.) and 0.2 mole of pyridine are added, and stirred for 24 hours at 50° C. Thereafter, the reaction solution is poured into 2 L of distilled water, and the polymeric solid deposit formed is collected by filtration. The powder thus obtained is immersed again and washed in 2 L of a 1:1 mixture of distilled water and methanol, and then filtered off. The thus obtained polymeric solid is dried to yield Polymer C.

Synthesis Example 8

Synthesis of Polymer D

In a stream of dry nitrogen, 6.8 g (0.028 mole) of the hydroxyl-containing diamine compound (d), 4.51 g (0.0225 mole) of 4,4'-diaminodiphenyl ether and 0.62 g (0.0025 mole) of 1,3-bis(3-aminopropyl)tetramethyldisiloxane are dissolved in 70 g of NMP. Thereto, 24.99 g (0.035 mole) of the hydroxyl-containing acid anhydride (a) and 4.41 g (0.015 mole) of 3,3',4,4'-biphenyltetracarboxylic acid anhydride, together with 25 g of NMP, are added at room temperature, and stirred for 1 hour as they are held at room temperature, and subsequently stirred for 2 hours at 50° C. Then, 1.6 g (0.02 mole) of acetyl chloride diluted with 10 g of NMP is further added, and stirred for 6 hours at 30° C. Thereafter, the reaction solution is poured into 2 L of distilled water, and the polymeric solid deposit formed is collected by filtration. The powder thus obtained is immersed again and washed in 2 L of a 1:1 mixture of distilled water and methanol, and then filtered off. The polymeric solid thus obtained is dried to yield Polymer D.

Synthesis Example 9

Synthesis of Polymer E

In a stream of dry nitrogen, 13.6 g (0.018 mole) of the hydroxyl-containing diamine compound (b) and 0.5 g (0.002 mole) of 1,3-bis(3-aminopropyl)tetramethyldisiloxane are dissolved in 50 g of NMR. Thereto, 17.86 g (0.025 mole) of the hydroxyl-containing acid anhydride (a) is added together with 30 g of Pyridine, In the resulting mixture, reaction is carried on for 2 hours at 60° C., and further thereto 0.59 g (0.005 mole) of 4-ethynylaniline is added as a terminal sealing agent and reaction is carried on therein for 2 hours at 60° C. At the conclusion of the reaction, the reaction solution is poured into 2 L of distilled water, and the polymeric solid deposit formed is collected by filtration. The powder thus obtained is immersed again and washed in 2 L of a 1:1 mixture of distilled water and methanol, and then filtered off. The thus obtained polymeric solid is dried to yield Polymer E.

Synthesis Example 10

Synthesis of Polymer F

The entire amount of Polymer A synthesized in Synthesis Example 5 is dissolved in NMP to form a 20 mass % solution. To this solution, 5.6 g (0.07 mole) of methoxymethyl chloride and 8 g of triethylamine are added, and stirred for 5 hours at room temperature. The reaction solution thus obtained is poured into 2 L of distilled water to yield a deposit again. The deposit of polymeric solid is collected by filtration. The powder thus obtained is immersed again and washed in 2 L of a 1:1 mixture of distilled water and methanol, and then filtered off. The polymeric solid obtained is dried to yield Polymer F. Partial protection of carboxyl and phenolic hydroxyl groups in the polymer is performed.

Synthesis Example 11

Synthesis of Polymer G

The entire amount of Polymer B synthesized in Synthesis Example 6 is dissolved in NMP to be formed into a 20 mass % solution. To this solution, 14.7 g (0.1 mole) of N,N-dimethylformamide diethyl acetal diluted with 5 g of NMP is added dropwise over a period of 10 minutes. After dropwise addition, the resulting mixture is stirred for 3 hours at 50° C. The reaction solution thus obtained is poured into 2 L of distilled water to yield a deposit again. The deposit of polymeric solid is collected by filtration. The powder thus obtained is immersed again and washed in 2 L of a 1:1 mixture of distilled water and methanol, and then filtered off. The polymeric solid obtained is dried to yield Polymer G having protected carboxyl groups.

Synthesis Example 12

Syntheses of Polymers H to J

Polymers H to J are synthesized by partially protecting carboxyl groups in Polymers C to E, respectively, in the same manner as in synthesis Example 11.

Synthesis Example 13

Synthesis of Polymer L

The entire amount of Polymer G synthesized in Example 11 is dissolved in γ-butyrolactone, and thereto 100 g of PGMEA is added. Then, the solvent added is distilled away at 50° C. for eliminating moisture from the reaction system by azeotropic dehydration. To the thus dehydrated solution, 1 g of ethyl vinyl ether and 10 mg of p-toluenesulfonic acid are added, and stirred for 3 hours at room temperature. Further thereto, 1 g of ethyl vinyl ether and 50 mg of p-toluenesulfonic acid are added, and stirred for 3 hours at room temperature. To the resulting solution, 20 g of triethylamine is added. The reaction solution is washed thrice with water, and diluted for a time by addition of 100 g of PGMEA, and then the solvent is distilled away at 50° C. for elimination of moisture from the reaction system by azeotropic dehydration. Thus, polymer L whose phenolic hydroxyl groups are partially protected (protection degree: 20%) is obtained in a state of solution having a solid concentration of 40%.

Synthesis Example 14

Syntheses of Polymers M to O

Polymers M to O are synthesized by changing the Polymer G in the synthesis Example 13 for the Polymers H, I and J respectively, in the same manner as in synthesis Example 13.

Synthesis Example 15

Synthesis of Polymer P

In a 3-liter three-necked flask, 293 g (0.8 mole) of hexafluoro-2,2-bis(3-amino-4-hydroxyphehyl)propane (a product of Nippon Kayaku Co., Ltd.), 126.6 g (1.6 mole) of pyridine and 1.2 kg of N-methyl-2-pyrrolidone (NMP) are placed, and stirred at room temperature. Then, the flask is cooled down to −25° C. in a dry ice/acetone bath. To the thus cooled solution, a mixed solution containing 73.9 g (0.364 mole) of isophthaloyl chloride (a product of Tokyo Chemical Industry Co., Ltd.), 107.4 g (0.364 mole) of 4,4-oxybisbenzoyl chloride (prepared by converting 4,4'-oxybisbenzoic acid (a product of Aldrich Co.) into its acid chloride by the usual method) and 700 g of NMP is added dropwise as the reaction temperature is kept between −20° C. and −30° C.

At the conclusion of dropwise addition, the mixture obtained is stirred for 16 hours at room temperature. The reaction solution is diluted with 2 L of acetone, and poured into 50 L of vigorously stirred deionized water. The white fine particles thus deposited are collected by filtration, washed successively with deionized water and a 50/50 by mass mixture of water and methanol, and further dried in vacuo at 40° C. for 24 hours. Thus, Polymer p-1 is obtained. The yield thereof almost follows stoichiometry. The number-average molecular weight of Polymer p-1 is $6.4 \times 10^3$ as calculated in terms of polystyrene, and the dispersion is found to be 2.1.

The Polymer p-1 (400 g) is dissolved in PGMEA to be formed into a 15% solution. To this solution, 21 g of allyl chloroformate (a product of Tokyo Chemical Industry Co., Ltd.) and 16 g of pyridine are added, and stirred for 3 hours at room temperature. The reaction solution obtained is washed with water, and then admixed with 200 g of toluene. The solvent is distilled away at 50° C. in order to eliminate moisture from the reaction system by azeotropic dehydration, thereby preparing a solution having a solid concentration of 15%. The water content in the solution is found to be 0.01%. To this solution, 15 g of ethyl vinyl ether and 0.1 g of p-toluenesulfonic acid are added, and stirred for 3 hours at room temperature. Further, 15 g of ethyl vinyl ether and 0.1 g of p-toluenesulfonic acid are added, and stirred for 3 hours at room temperature. To the resulting solution, 20 g of triethylamine is added. The reaction solution obtained is washed thrice with water, and diluted for a time by addition of 1 L of PGMEA, Thereafter, the solvent is distilled away at 50° C. for eliminating moisture from the reaction system by azeotropic dehydration, thereby preparing a PGME solution containing Polymer P in a solid concentration of 40%. By $^1$H NMR measurements, it is ascertained that the introduction rate of allyl chloroformate follows stoichiometry and the proportion of hydroxyl groups protected by ethyl acetal groups is 21 mole %.

(Synthesis of Photosensitive Agent)

(1) Synthesis of Photosensitive Agent (P-1)

In a three-necked flask, 21.6 g of a phenol compound (BP-1) illustrated below and 200 mL of 1,4-dioxane are placed, and mixed thoroughly until they become homogeneous. Thereto, 27 g of 1,2-naphthoquinonediazide-4-sulfonyl chloride is added and made to dissolve. The reaction vessel is cooled to 10° C. in ice-cold water, and then 11.1 g of triethylamine is added dropwise over a period of 1 hour. At the conclusion of dropwise addition, stirring is continued for 24 hours to complete the reaction. Thereafter, distilled water is added to the reaction solution to dissolve the salt deposited, and stirred for 30 minutes. After neutralization with a dilute hydrochloric acid, the reaction solution causes crystallization by addition of 1 L of distilled water. The thus precipitated dark yellow crystallites are filtered off, and dissolved again in 200 mL of dioxane. From this solution, crystallites are precipitated by addition of 1 L of distilled water, and they are filtered off. The thus filtered product is washed with 1 L of distilled water, and filtered. Thus, 39 g of a dark yellow powder as the intended agent (P-1) is recovered. As a result of analyzing the obtained photosensitive agent (P-1) by high-performance liquid chromatography (Model S1525 made by Waters Corporation), the purity of the esterification product of the phenol compound (BP-1) is ascertained to be 98% (at a detection wavelength of 254 nm).

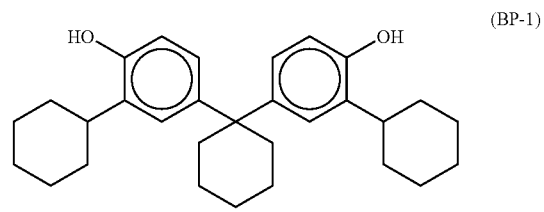

(BP-1)

(2) Synthesis of Photosensitive Agent (P-2)

A photosensitive agent (P-2) is synthesized in the same manner as described above, except that the phenol compound used is changed to the following compound (BP-2) and the amount of 1,2-naphthoquinonediazide-4-sulfonyl chloride is doubled. As a result of analyzing the obtained photosensitive agent (P-2) by high-performance liquid chromatography (Model S1525 made by Waters Corporation), the purity of the esterification product of the phenol compound (BP-2) is ascertained to be 97.5% (at a detection wavelength of 254 nm).

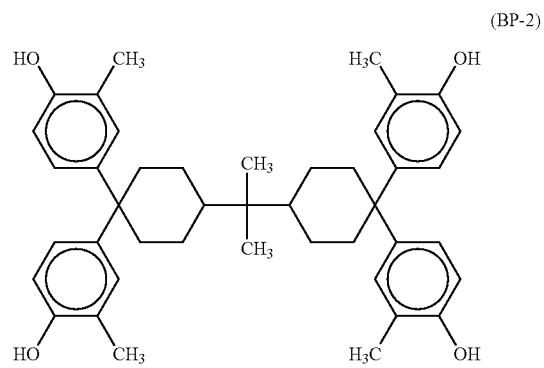

(BP-2)

(Preparation of Photosensitive Resin Composition)

To each of the combinations shown in Table 1, wherein a resin (or a resin solution), a photosensitive agent and other ingredients are included, an adhesion promoter C (which is not added at the time of adhesion evaluation) in an amount of 2 mass % based on the resin and γ-butyrolactone in such an amount to attain a solid concentration of 30 mass % are added and mixed with stirring. Then, each of the resulting mixtures is filtered with a cassette filter (0.1 μm) made from PTFE, thereby preparing each of the photosensitive resin compositions.

TABLE 1

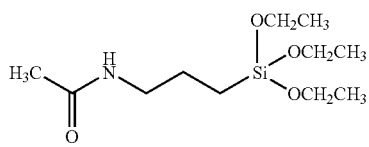

Adhesion Promoter C

| | Resin | Photosensitive Agent | Sensitizer | Methylol Compound | Additive | Thermo-Acid Generator |
|---|---|---|---|---|---|---|
| Example 1 | F (50 g) | P-1 (6.5 g) | not added | M-1 (3 g) | not added | T-1 (2.5 g) |
| Example 2 | G (50 g) | P-1 (6.5 g) | not added | M-2 (3 g) | not added | T-1 (2.5 g) |
| Example 3 | H (50 g) | P-2 (6.5 g) | not added | M-3 (2.5 g) | not added | T-2 (3 g) |
| Example 4 | I (50 g) | P-2 (6.5 g) | not added | M-4 (3 g) | not added | T-3 (2 g) |
| Example 5 | J (50 g) | P-1 (6.5 g) | not added | M-5 (3 g) | not added | T-4 (2 g) |
| Example 6 | L (solution 110 g) | P-3 (2.5 g) | not added | M-3 (3 g) | not added | T-3 (2 g) |
| Example 7 | M (solution 110 g) | P-3 (3.5 g) | not added | M-1 (4 g) | not added | T-4 (2 g) |
| Example 8 | N (solution 110 g) | PAG-1 (3 g) | C-26 (1.5 g) | M-2 (3 g) | not added | T-1 (2.5 g) |
| Example 9 | O (solution 110 g) | PAG-6 (3 g) | C-26 (1.5 g) | M-5 (3 g) | not added | T-2 (2.5 g) |
| Example 10 | P (solution 110 g) | PAG-7 (3 g) | C-26 (1.5 g) | M-4 (3 g) | not added | T-2 (2.5 g) |
| Example 11 | P (solution 110 g) | P-3 (3.5 g) | not added | M-4 (1.5 g) | Monomer-1 (2 g) | T-2 (2.5 g) |
| Example 12 | L (solution 110 g) | P-3 (2.5 g) | not added | M-1 (2 g) | Monomer-1 (2 g) | T-3 (2 g) |
| Example 13 | P (solution 110 g) | P-3 (3.5 g) | not added | M-6 (3 g) | not added | T-1 (2.5 g) |
| Example 14 | P (solution 110 g) | P-3 (3.5 g) | not added | M-7 (3 g) | not added | T-2 (2.5 g) |
| Comparative Example 1 | G (50 g) | P-1 (6.5 g) | not added | M-2 (3 g) | not added | not added |
| Comparative Example 2 | G (50 g) | P-1 (6.5 g) | not added | not added | not added | T-1 (2.5 g) |
| Comparative Example 3 | P (solution 110 g) | PAG-7 (3 g) | C-26 (1.5 g) | M-4 (3 g) | not added | not added |
| Comparative Example 4 | P (solution 110 g) | PAG-7 (3 g) | C-26 (1.5 g) | not added | not added | T-2 (2.5 g) |

P-3

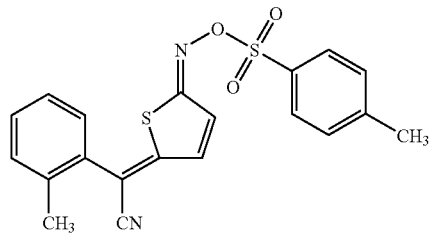

C-26

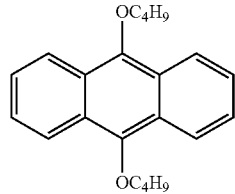

PAG-1

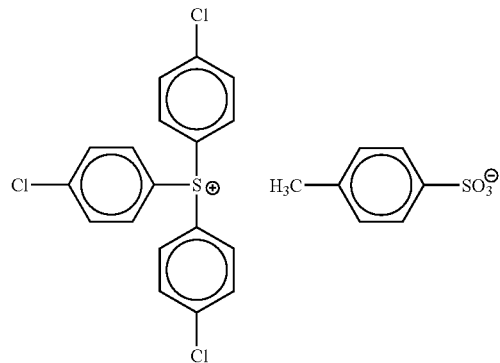

TABLE 1-continued
PAG-6
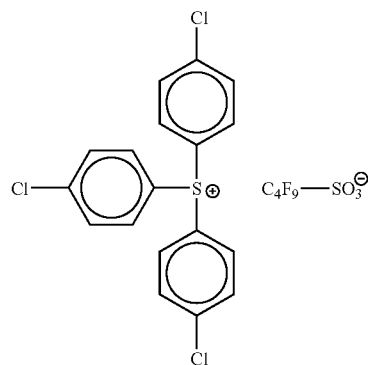
PAG-7
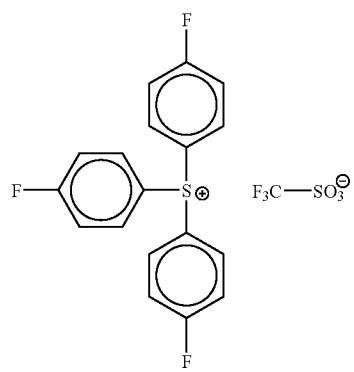
M-1
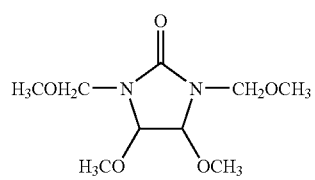
M-2
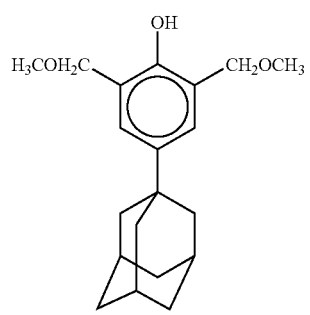
M-3
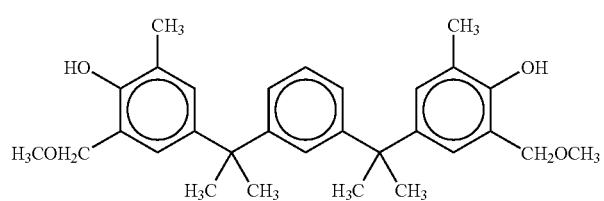

TABLE 1-continued
M-4
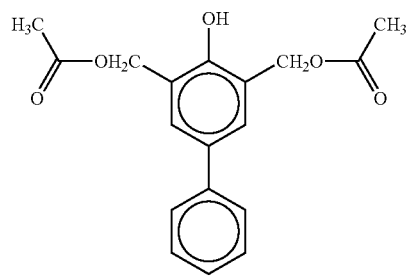
M-5
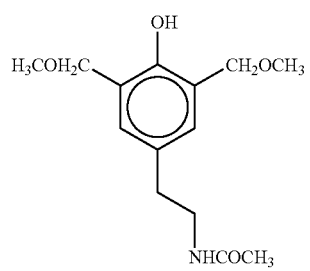
M-6
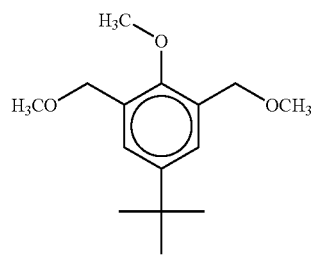
M-7
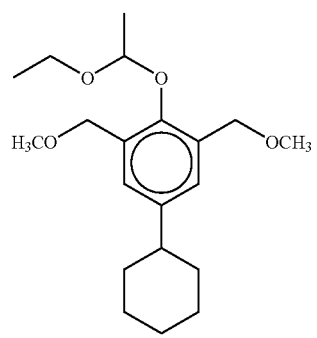
(T-1)
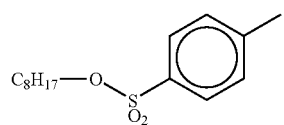
(T-2)
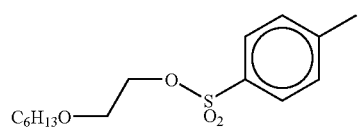

TABLE 1-continued (T-3)
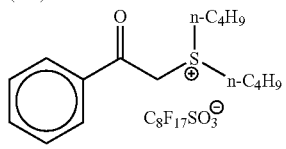

(T-4)
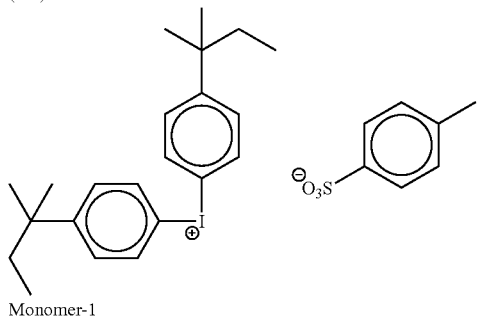

Monomer-1
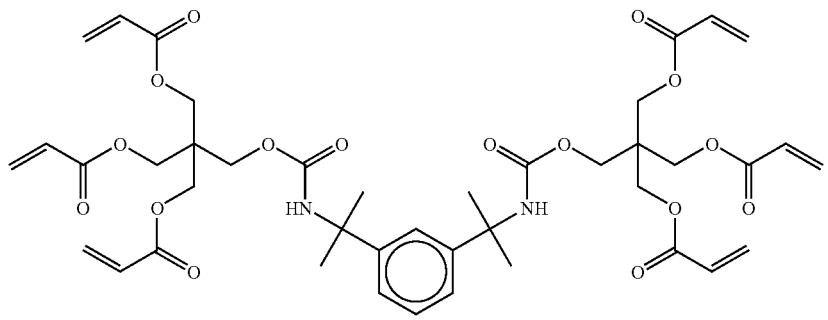

<Image Properties (Limiting Resolution, Film Remaining Rate and Size Change by Heating)>

Each of the prepared compositions is spin-coated on a silicon wafer, and subjected to 4 minutes' baking on a 120° C. hot plate, thereby forming 4-μm-thick film. Each film formed is exposed to light in such an exposure amount as to reproduce a 5-μm pattern size by means of an i-line stepper through a mask with 5-μm via-hole repetition patterns. In the cases of using the present compositions 1 and 6 to 12 and the comparative compositions 3 and 4, the exposed films each undergo post-baking at 120° C. for 3 minutes. Then, a 2.38 mass % aqueous solution of TMAH is put on the substrate and rest development is carried out for 40 seconds, and in succession thereto a 2.38 mass % aqueous solution of TMAH is put once more and additional rest development is performed for 40 seconds. Then, rinsing with deionized water is carried out. Thereafter, baking is carried out for 2 minutes on a 100° C. hot plate. The film thickness after development is measured, and the film remaining rate is evaluated.

Film remaining rate (%)=(Film thickness before development−film thickness after development)× 100/film thickness before development In addition, the patterns formed are observed under SEM, and the limiting resolution is evaluated.

Then, the patterns formed are heated at 250° C. for 60 minutes under an atmosphere of nitrogen, and the thus heat-cured patterns are observed. Judging from the observation, films whose 5-μm via-hole patterns remain (or undergo a change less than 5% in pattern size between before and after being heated) are rated as A, films whose 5-μm via-hole patterns more or less become deformed (or undergo a change of the order of 5% to 10% in pattern size between before and after being heated) are rated as B, and films whose 5-μm via-hole patterns become deformed considerably (or undergo a change greater than 10% in pattern size between before and after being heated) are rated as C.

<Rupture Elongation>

Each of the prepared resin solutions is spin-coated on a silicon wafer, subjected to 4 minutes' baking on a 120° C. hot plate, and further subjected to 60 minutes' heating at 250° C. under an atmosphere of nitrogen. The resin film is peeled away from the wafer, and cut into strips measuring 5 mm in width and 7 cm in length.

Each sample strip thus obtained is stretched (at 23° C., 5 mm/min) under a condition that each end part thereof is fasten by a length of 1 cm with a Tensilon meter, and a percentage of elongation at the time when rupture takes place (Rupture elongation) is determined.

<Heat Resistance>

Each of the prepared resin solutions is spin-coated on a silicon wafer, subjected to 4 minutes' baking on a 120° C. hot plate, and further subjected to 60 minutes' heating at 250° C. under an atmosphere of nitrogen. Thermal reduction in weight of the thus obtained film is determined by thermogravimetric analysis (TGA) (wherein the temperature is raised at a rate of 10° C./min over a range of 30° C. to 400° C.).

Results obtained are shown in Table 2.

TABLE 2

|  |  | Resolution (μm) | Film Remaining Rate (%) | Change in Size by Heating | Rupture Elongation (%) | Heat Resistance (%) |
|---|---|---|---|---|---|---|
| Example | 1 | 3 | 90 | B | 40 | 6 |
|  | 2 | 4 | 80 | B | 35 | 5 |
|  | 3 | 4 | 82 | B | 35 | 5 |
|  | 4 | 4 | 83 | A | 35 | 5 |
|  | 5 | 4 | 80 | A | 35 | 5 |
|  | 6 | 3 | 90 | A | 40 | 4 |
|  | 7 | 3 | 90 | A | 40 | 6 |
|  | 8 | 3 | 90 | B | 40 | 4 |
|  | 9 | 3 | 90 | B | 40 | 4 |
|  | 10 | 3 | 90 | B | 40 | 4 |
|  | 11 | 3 | 90 | A | 45 | 3 |
|  | 12 | 3 | 90 | A | 45 | 5 |
|  | 13 | 3 | 90 | B | 40 | 4 |
|  | 14 | 3 | 90 | B | 40 | 4 |
| Comparative Example | 1 | 4 | 79 | C | 30 | 9 |
|  | 2 | 4 | 80 | C | 0 | 7 |
|  | 3 | 3 | 90 | C | 20 | 9 |
|  | 4 | 3 | 90 | C | 0 | 7 |

As can be seen from the data shown above, the compositions according to the invention have properties rated "outstanding (or A)" or "good (or B)" on all the criteria.

The invention can provide a photosensitive resin composition which can deliver excellent performance in lithography and form cured relief patterns having excellent mechanical characteristics and heat resistance under low-temperature curing conditions.

The entire disclosure of each and every foreign patent application from which the benefit of foreign priority has been claimed in the present application is incorporated herein by reference, as if fully set forth.

What is claimed is:

1. A photosensitive resin composition comprising:
   (a) a resin comprising a repeating unit represented by a following formula (1);
   (b) a photosensitive agent;
   (c) a thermo-acid generator; and
   (d) a compound having at least one of an alkoxymethyl group and an acyloxymethyl group,

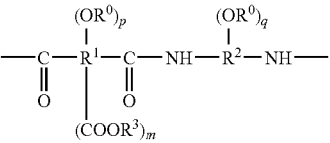

wherein
   $R^1$ represents a divalent to octavalent organic group containing 2 or more carbon atoms,
   $R^2$ represents a divalent to hexavalent organic group containing 2 or more carbon atoms,
   $R^0$ represents an organic group containing 1 to 20 carbon atoms,
   $R^3$ represents a hydrogen atom or an organic group containing 1 to 20 carbon atoms,
   m represents an integer of 0 to 2, and
   each of p and q represents an integer of 0 to 4, provided that p+q>0.

2. The photosensitive resin composition according to claim 1, wherein
   at least one of $R^0$ and $R^3$ in the formula (1) is a group capable of decomposing under action of acid and generating an alkali-soluble group.

3. The photosensitive resin composition according to claim 1, further comprising:
   (e) an adhesion promoter.

4. A method of producing a cured relief pattern, comprising:
   forming, on a semiconductor substrate, a layer comprising the photosensitive resin composition according to claim 1;
   exposing the layer, through a mask, to a light ray, an electron beam or an ion beam;
   removing the exposed portion of the layer with an aqueous alkaline developer to create a relief pattern, and
   subjecting the relief pattern to heat treatment.

5. A semiconductor device comprising a cured relief pattern produced by the method according claim 4.

* * * * *